United States Patent [19]
Haruki et al.

[11] Patent Number: 5,415,952
[45] Date of Patent: May 16, 1995

[54] FINE PATTERN LITHOGRAPHY WITH POSITIVE USE OF INTERFERENCE

[75] Inventors: Tamae Haruki; Kenji Nakagawa, both of Kawasaki, Japan

[73] Assignee: Fujitsu Limited, Kawasaki, Japan

[21] Appl. No.: 132,165

[22] Filed: Oct. 5, 1993

[30] Foreign Application Priority Data

| Oct. 5, 1992 | [JP] | Japan | 4-266031 |
| Oct. 15, 1992 | [JP] | Japan | 4-277569 |
| Oct. 27, 1992 | [JP] | Japan | 4-288845 |
| Nov. 16, 1992 | [JP] | Japan | 4-305687 |

[51] Int. Cl.$^6$ ............................................. G03F 9/00
[52] U.S. Cl. ........................................ 430/5; 430/322; 430/396; 430/30
[58] Field of Search .................. 430/5, 322, 396, 30

[56] References Cited

U.S. PATENT DOCUMENTS 5,316,896 5/1994 Fukuda et al. ............................. 430/5

*Primary Examiner*—S. Rosasco
*Attorney, Agent, or Firm*—Nikaido, Marmelstein, Murray & Oram

[57] ABSTRACT

A mask for forming a desired pattern on the image plane is divided into a number of dell areas. Each cell is assigned a uniform characteristic. Each cell area is assigned a particular light transmission characteristic to form a starting pattern which may be the desired target pattern itself. The light transmission characteristic of each cell area is changed randomly. The light intensity distribution is simulated to select only the patterns having a good performance. Such characteristic change is continued until the inheritance operation is converged and a final, pattern is obtained. This final pattern is used as the mask pattern. The above process may also be applied to determining the shape of an aperture stop and a light source.

13 Claims, 71 Drawing Sheets

PHASE 0

PHASE π

PHASE 0

PHASE π

FIG.6
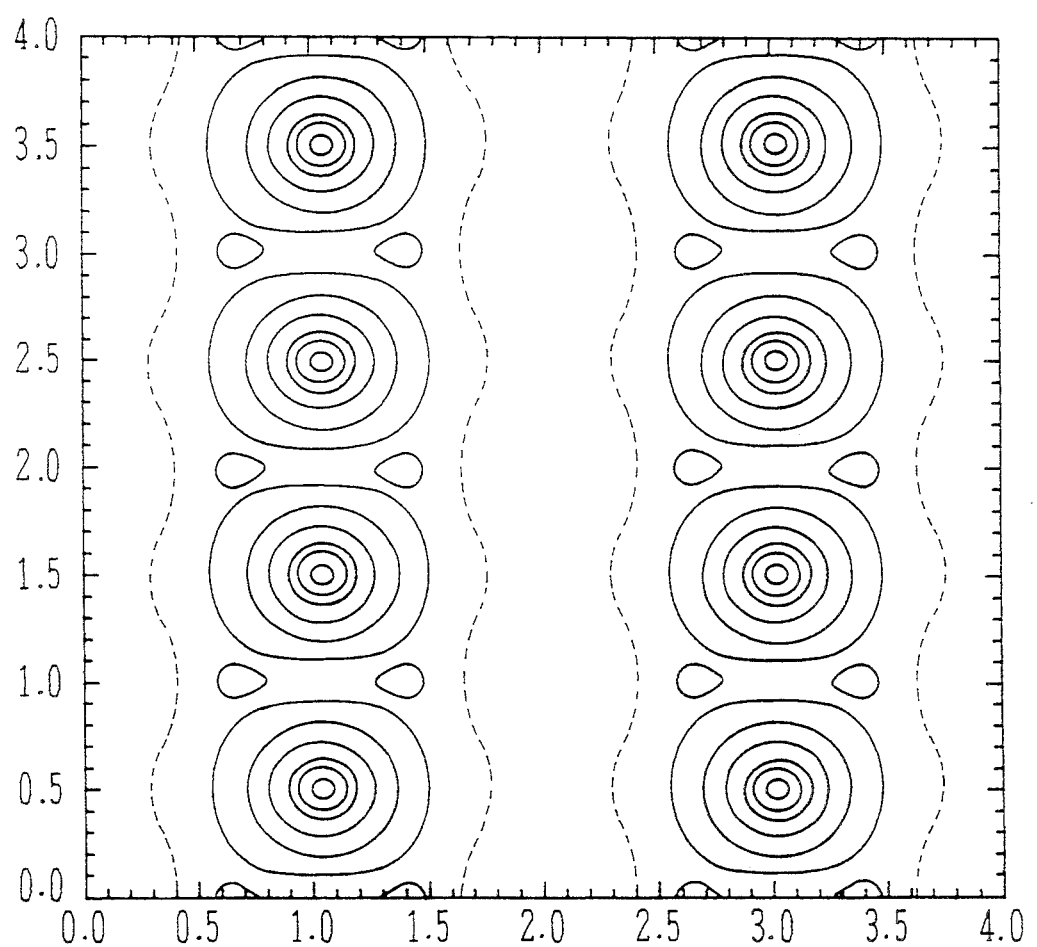
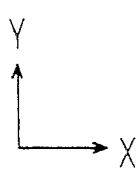

X

Y

FIG.10
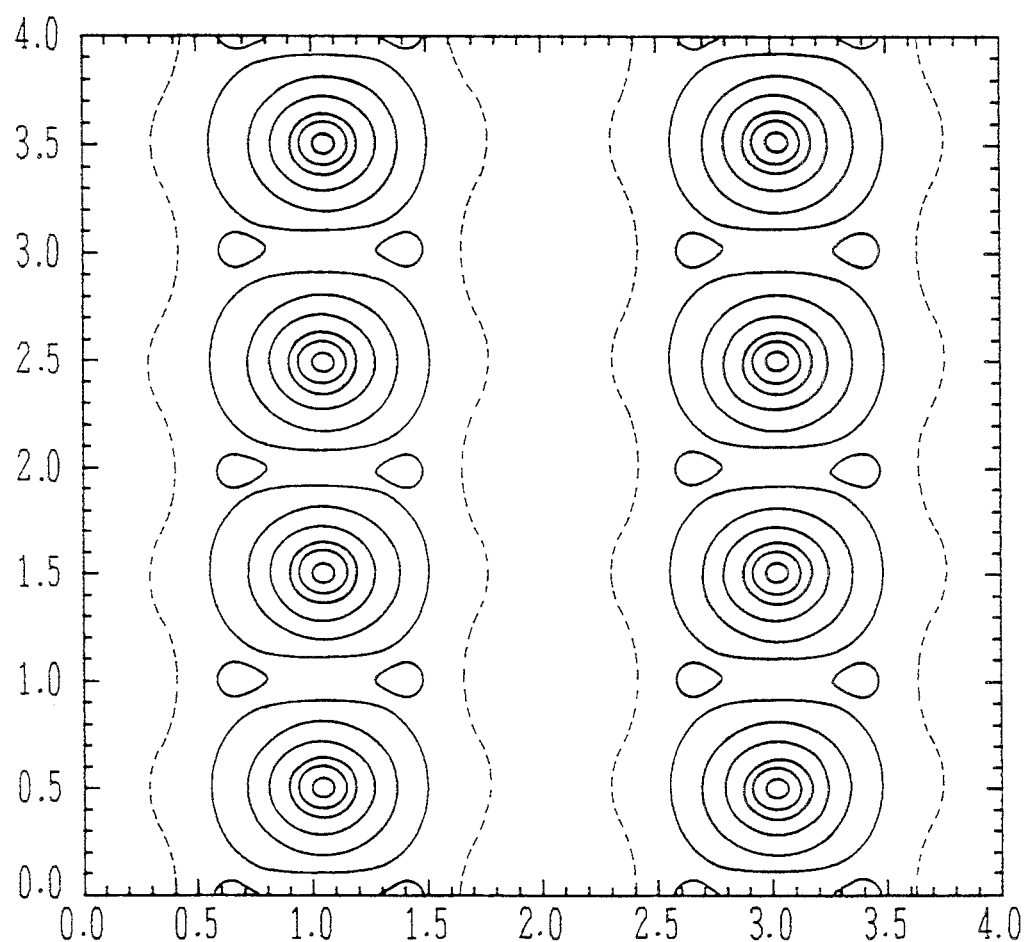
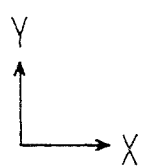

X

Y

FIG.14
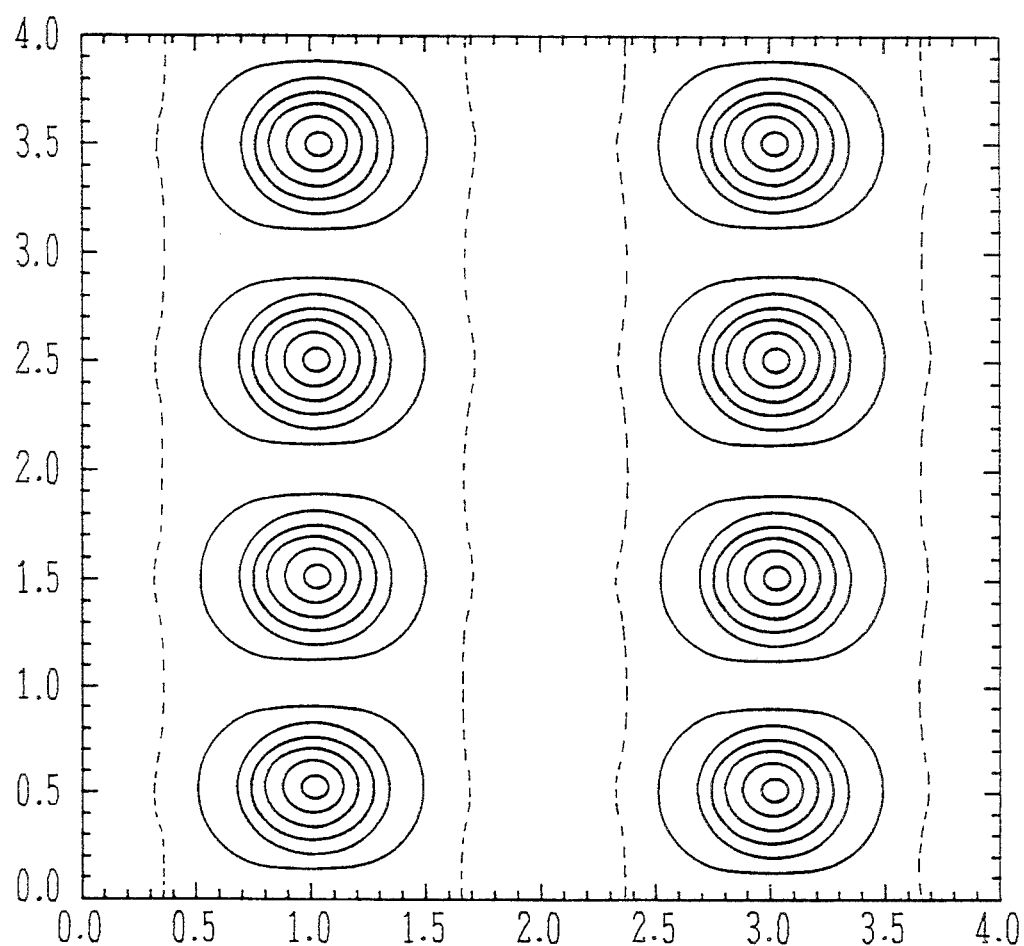
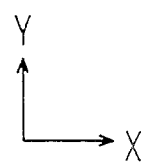

1a   2

3

1a

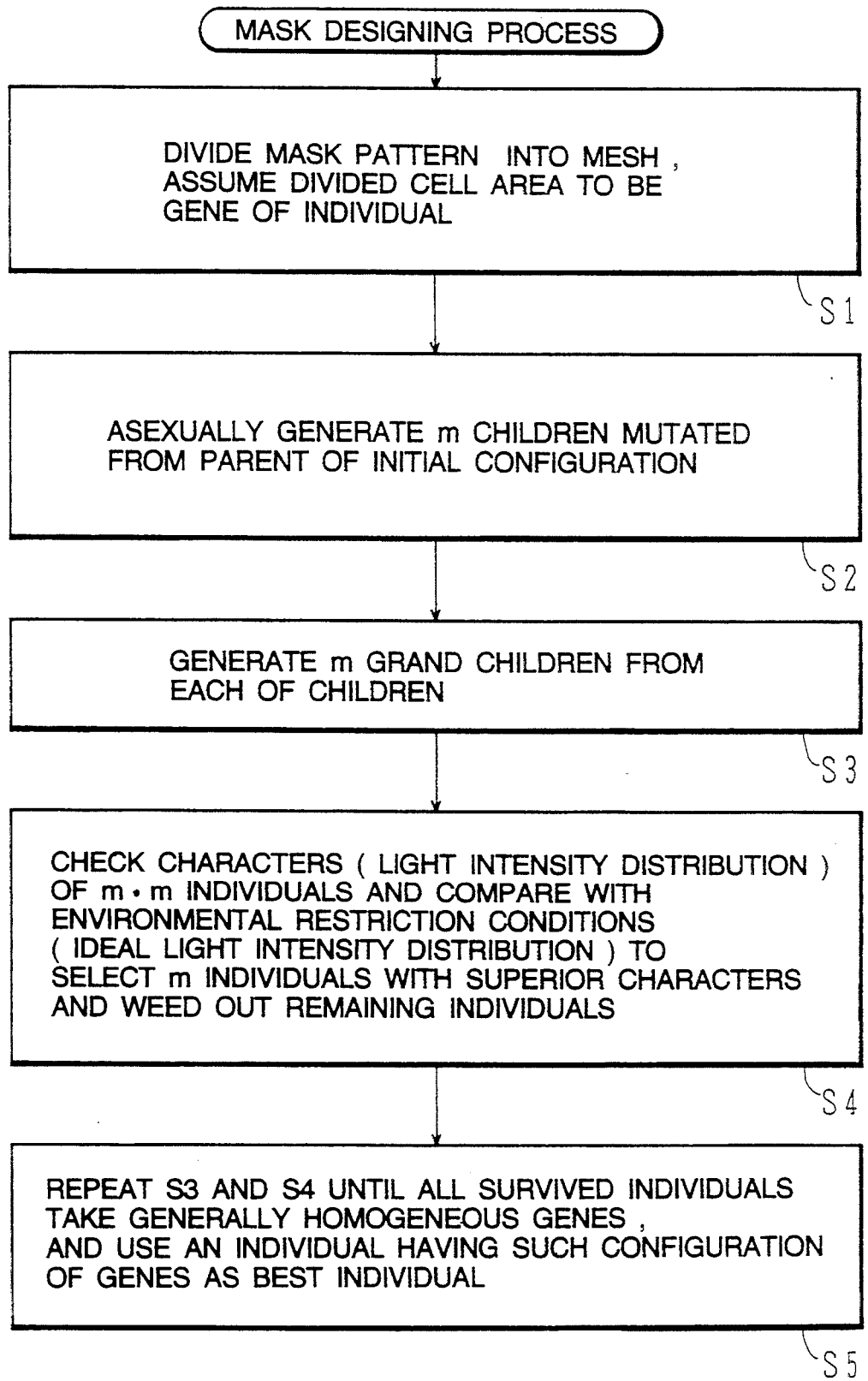

( REFERENCE )

( REFERENCE )

( REFERENCE )

( REFERENCE )

( REFERENCE )

( REFERENCE )

(REFERENCE)

(REFERENCE)

(REFERENCE)

(REFERENCE)

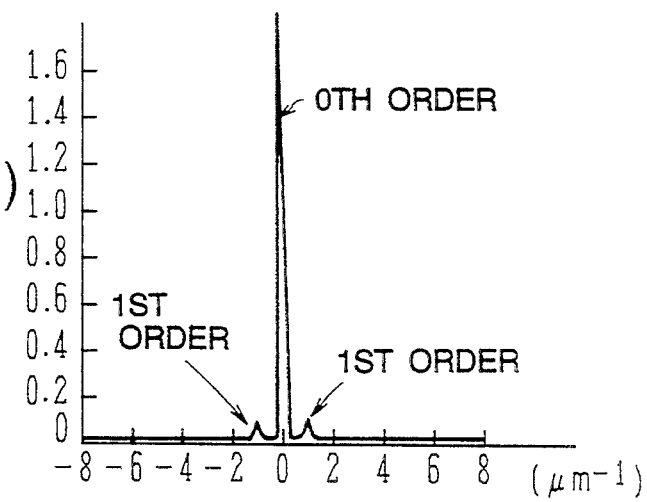
FIG.57A (REFERENCE)
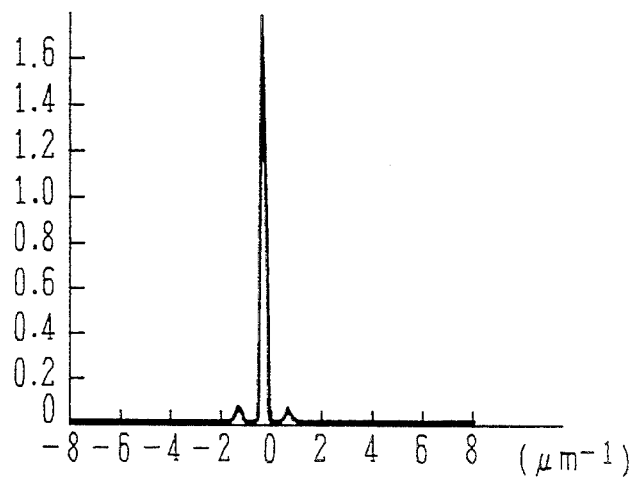
FIG.57B (REFERENCE)
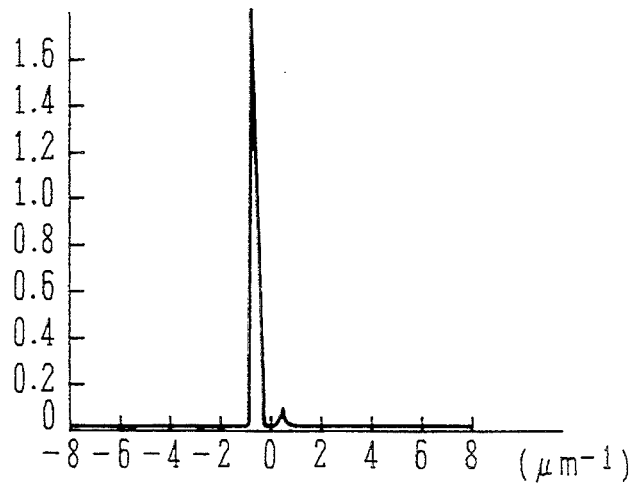
FIG.57C (REFERENCE)

$$\theta = \sin^{-1}(\lambda - 2p)$$

( REFERENCE )

( REFERENCE )

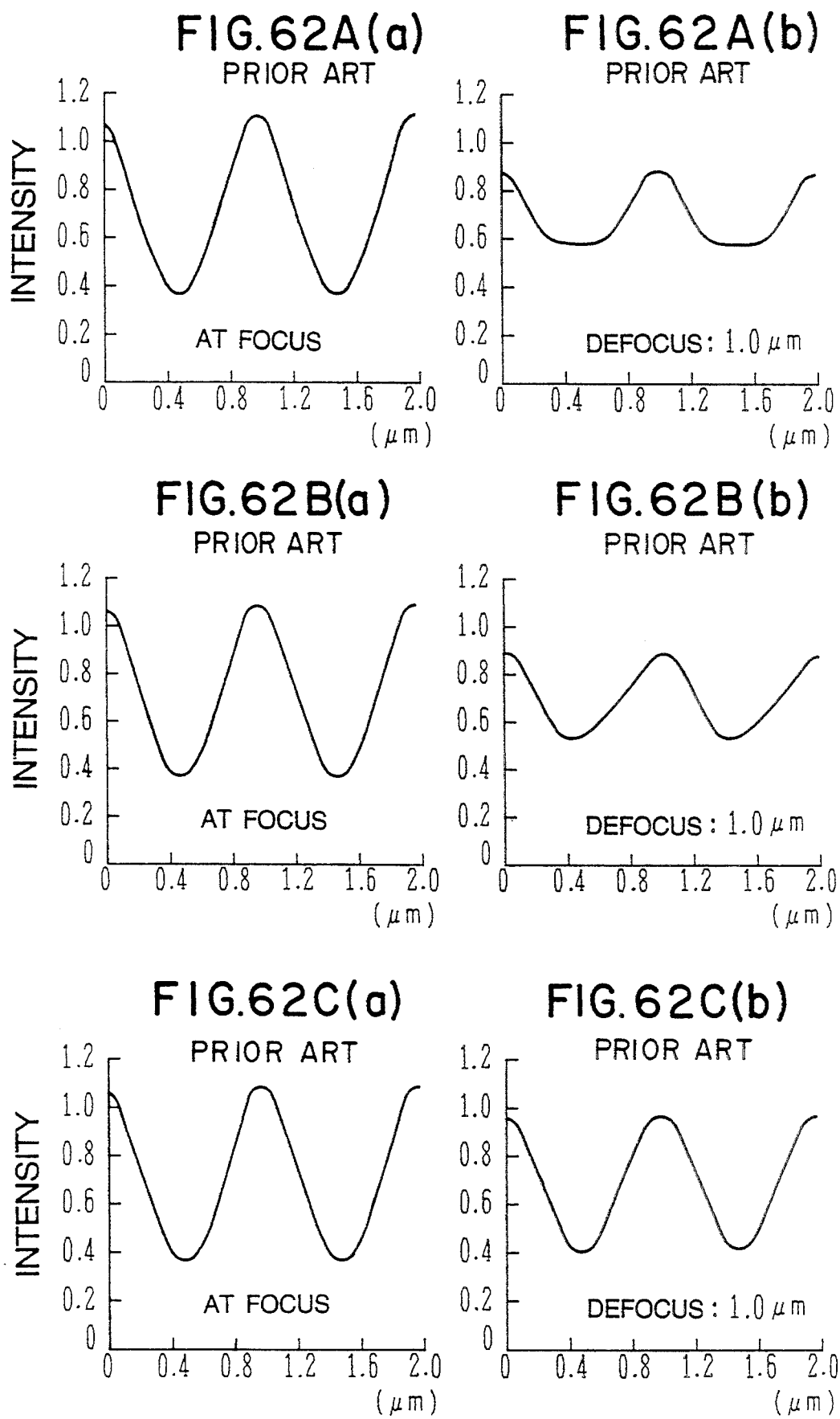

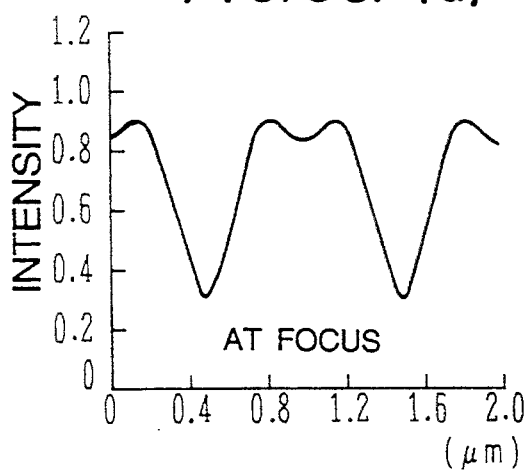
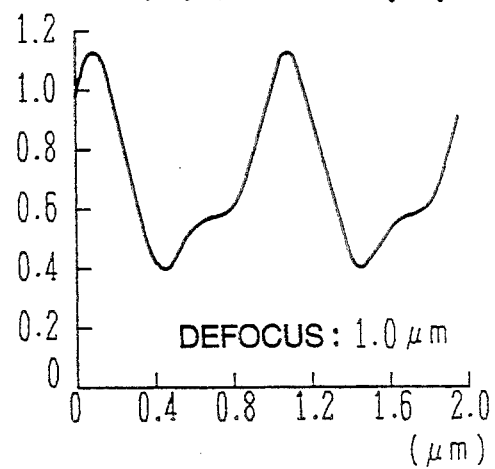
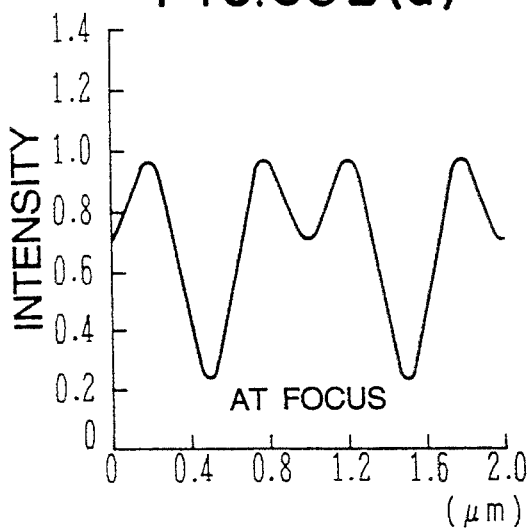
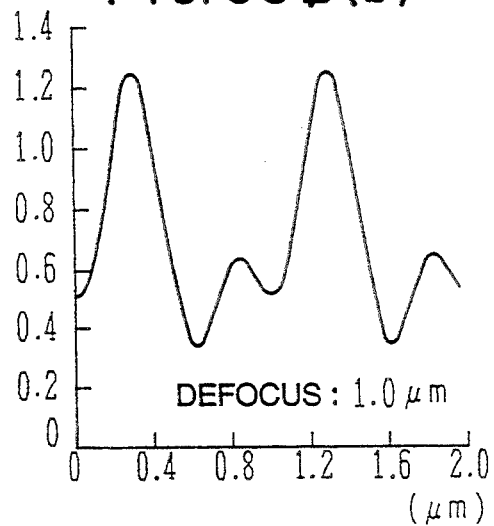
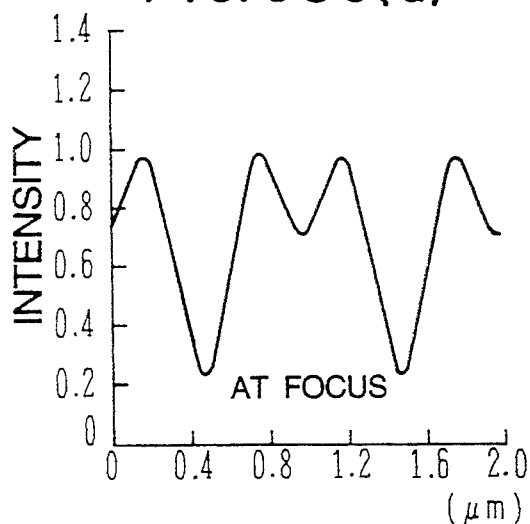
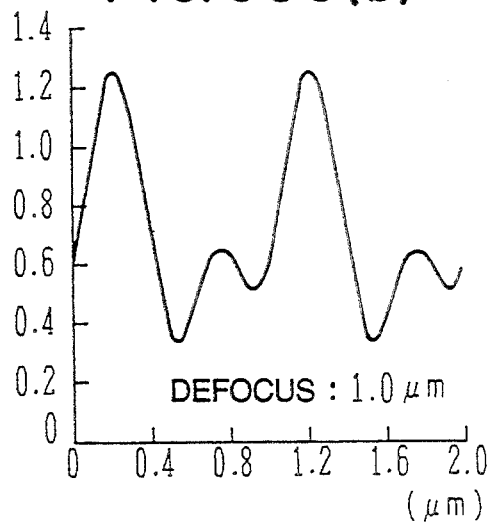

402  401       401  402
  403            403

AT FOCUS

DEFOCUS : 0.4 μm

DEFOCUS : 0.8 μm

( REFERENCE )

AT FOCUS

( REFERENCE )

DEFOCUS : 0.5 μm

( REFERENCE )

DEFOCUS: $1.0 \mu m$

FINE PATTERN LITHOGRAPHY WITH POSITIVE USE OF INTERFERENCE

BACKGROUND OF THE INVENTION a) Field of the Invention

The present invention relates to an exposure technique, and more particularly to an exposure technique for focussing a fine pattern of an LSI or the like.

b) Description of the Related Art

As the wavelength of an exposure beam becomes comparable to the degree of the resolution of a pattern to be focussed, the diffraction and interference of the exposure beam become an important issue. Under such a condition, if a mask pattern having the same shape of a desired device pattern is used, the desired device pattern will not be transferred.

The device pattern of a semiconductor integrated circuit device or the like is becoming fine more and more. In light exposure using a light beam, the diffraction and interference of light become a main issue as the device pattern becomes fine.

In the exposure using an optical system, the resolution is a function of a numerical aperture NA and a wavelength. In order to improve the resolution, it is desired to make the numerical aperture large and the wavelength short. There is a limit in increasing the numerical aperture because of the depth of focus and the design of the optical system. For shortening the wavelength, the bright line of a mercury lamp is partly replaced by an excimer laser beam, and such a short wavelength is now considered ultimate because of the restriction of optical material to be used.

As the pattern size becomes in the order of a light wavelength, the size of a fine pattern to be transferred is limited by the light beams diffracted to the outside of the pattern.

A phase shift mask has drawn attention, which positively uses the light interference in order to improve the resolution of photolithography.

A phase shifter relies upon the technique of improving the resolution by using light beams of different phases. For example, a phase shifter is formed around the main hole corresponding to a hole pattern to be transferred. The phase shifter compensates for light beams passed through and diffracted by the main hole. The phases of light beams from the main hole and phase shifter are different, e.g., opposite phases, reducing the light intensity at the projection plane. A high resolution which was conventionally impossible can now be attained by using the phase shifter.

With the phase shifter, however, various problems occur when a pattern to be exposed becomes very fine.

Specifically, if a phase shifter is formed around each unit pattern of a repetitive pattern such as a pattern used for an ULSI or the like, sub peaks may be generated between transferred unit patterns. Generation of a sub peak may result from the added intensities of light beams from the main hole and phase shifter. In such a case, the width of the phase shifter is reduced to prevent the generation of sub peaks.

If the width of a phase shifter best designed is reduced to prevent the generation of sub peaks, the intrinsic effects of the phase shifter are suppressed and degraded, making it difficult to obtain a sufficient contrast.

A depth of focus or field is desired more or less in order to transfer a pattern to the surface of a structural subject such as a semiconductor device. In some cases, a sufficient depth of focus may not be obtained even if the resolution on the focal plane is improved by the phase shifter.

If a phase shifter is used for a mask, a light source is disposed along the optical axis of a condenser lens. By using a point light source on the optical axis, the occupation factor or coherence factor $\sigma$ of the light source by the condenser lens can be made small. Under this condition, the pattern of the mask is transferred to a photoresist. A phase shifter includes a Levenson type, Cr-less type, edge emphasized type, and other type shifters.

Illuminance lowers when such a point light source is used with a small coherence factor $\sigma$. It is difficult to obtain a sharp pattern because of a lower radiation energy. If the coherence factor $\sigma$ is raised to solve this problem, the interference ability lowers, the intrinsic effects of the phase shifter cannot be obtained, and the depth of focus becomes poor.

In addition to the phase shifter, there is known a mask design method capable of obtaining an optimum light intensity distribution on the focus plane, by designing the pattern of the mask independently from the pattern to be focussed. This method may be used singularly or in combination with the phase shifter.

This method relies mainly on empirical knowledge or a rule of thumb. Even if a device pattern is designed with long time and much labor, the result may often be trapped at a local solution.

The light intensity distribution on the image plane depends on the performance of all optical components throughout the optical path from a light source to the image plane. The distribution of light rays illuminating a mask greatly influences the focussing performance.

SUMMARY OF THE INVENTION

It is an object of the present invention to provide an exposure technique capable of providing an excellent focussing performance.

It is another object of tile present invention to provide an exposure technique capable of providing a high resolution.

It is another object of the present invention to provide an exposure technique capable of providing a large depth of focus.

It is a further object of the present invention to provide a method of forming a pattern by using a phase shift mask, capable of improving the contrast of the pattern while suppressing sub peaks.

It is a still further object of the present invention to provide an exposure unit and a pattern forming method, capable of improving the resolution and the depth of focus by using a phase shift mask.

It is another object of the present invention to provide an exposure mask having a shape different from a desired device pattern, capable of providing a light intensity distribution on the image plane which can form the desired device pattern at a high precision.

It is another object of the present invention to provide a method of designing an exposure mask, light source, or aperture stop, which method does not rely on a rule of thumb and is free from a local solution.

It is another object of the present invention to provide a modified illumination system and an exposure method most suitable for a device pattern (photomask pattern), particularly for a line-and-space pattern having the same width of a line and a space.

According to one aspect of the present invention, there is provided a pattern forming method of transferring a pattern having unit patterns disposed at least in one direction by using a phase shift mask, comprising the steps of: exposing the pattern by using the phase shift mask having main holes corresponding to the unit patterns, the size of each main hole being reduced in the one direction more than in the other direction perpendicular to the one direction, relative to a desired pattern; and developing the transferred pattern at a level not developing interference light beams generated by phase shifters.

In transferring the pattern having unit patterns disposed at least in one direction, the size of the main hole is reduced in the one direction. It is possible to make sub peaks on the image plane small and to obtain a light intensity distribution with an improved contrast.

According to another aspect of the present invention, there is provided an exposure unit for a phase shift mask comprising a light source for exposing a photoresist by using & phase shift mask, the light emanating shape of the light source being one of a stripe, a plurality of dispersed points, and a shape elongated in one direction such as an ellipsoid.

By expanding the light emanating shape of a light source in the direction of reducing light interference of the pattern on a phase shift mask or in the direction of capable of reducing light interference without any problem, the light interference effects are suppressed in that direction, and the light illuminance in the other direction is made large, providing the advantages of the phase shift. Accordingly, the resolution and the depth of focus can be improved as compared to a conventional point light source.

According to another aspect of the present invention, there is provided an exposure mask comprising a number of cell areas formed on the mask at the area where a pattern is formed, a uniform exposure beam transmission characteristic being set to the whole area of each cell area, the pattern is so arranged that when the pattern is focussed by an optical system on an image plane, a pattern different from the pattern of the mask is imaged.

A number of cell areas are formed on the mask at the area where a pattern is formed, and each cell area is assigned an optimum exposure beam transmission characteristic. Accordingly, it is easy, due to the limited number of cell areas, to obtain an exposure mask which provides an optimum exposure beam intensity distribution.

According to another aspect of the present invention, there is provided a method of designing an exposure optical system, comprising the steps of: preparing a starting pattern for an optical member formed of a multiplicity of cell areas, analogous to a desired disign pattern, by setting a uniform optical characteristic to each of a number of cell areas of the optical member; generating a plurality of child patterns from the starting pattern by mutating the optical characteristic of a cell area, in accordance with a random number; generating a plurality of grandchild patterns from the plurality of child patterns through inheritance mating or mutating, and evaluating the focussing characteristic of the generated grandchild patterns to select a predetermined number of grandchild patterns, in accordance with an inheritance algorithm; repeating the inheritance algorithm process by using the grandchild patterns as the child patterns; and selecting an optimum design pattern from the finally selected grandchild patterns.

Modified patterns are generated from a starting pattern by using an inheritance algorithm including mutation. The focussing characteristic is evaluated to converge the modified patterns. It is possible to obtain an optimum pattern at a high probability.

It is easy to obtain an exposure mask capable of forming an optimum pattern on the image plane, the exposure mask having a pattern different from a final device pattern.

According to another aspect of the present invention, there is provided an exposure technique wherein three diffraction light beams of 0th, +1st, and +2nd orders or 0th, −1st, and −2nd orders are selected and focussed.

Use of these three diffraction light beams reduces the restrictions to be caused by the system components, and facilitates to obtain a high resolution and a large depth of focus.

The above and other objects, features, and advantages of the present invention will become apparent from the following detailed description of the preferred embodiment when read in connection with the accompanying drawings.

BRIEF DESCRIPTION OF THE DRAWINGS

FIGS. 3A and 3B illustrate the exposure system for the pattern transfer, wherein FIG. 3A is a schematic diagram showing the optical system, and FIG. 3B is a schematic plan view showing a device pattern.

FIGS. 4A and 4B illustrate an embodiment of the unit mask according to the present invention, wherein FIG. 4A is a plan view showing the structure of the unit mask, and FIG. 4B is a contour line diagram showing the light intensity distribution on the projection plane.

FIGS. 5A and 5B illustrate an example of the unit mask according to a conventional technique, wherein FIG. 5A is a plan view showing the structure of the unit mask, and FIG. 5B is a contour line diagram showing the light intensity distribution on the projection plane.

FIG. 6 is a contour line diagram showing the light intensity distribution on the projection plane using the embodiment unit mask.

FIG. 10 is a contour line diagram showing the light intensity distribution on a 0.5 μm defocussed plane using an embodiment unit mask.

FIG. 14 is a contour line diagram showing the light intensity distribution on a 1.0 μm defocussed plane using an embodiment unit mask.

FIGS. 18A to 18D illustrate other embodiments of the unit pattern according to the present invention, wherein FIGS. 18A and 18B are plan views showing the structure of embodiment unit masks, and FIGS. 18C and 18D are graphs showing the light intensity distributions in the X and Y directions on the projection plane, using the unit mask shown in FIG. 18A.

FIG. 37 is a flow chart explaining the mask designing process.

FIGS. 51A to 51D are graphs showing the light intensity distributions in the vertical direction of lines and spaces shown in FIG. 49 on the focus and defocus planes, obtained by using the aperture stop shown in FIG. 50B, wherein FIG. 51A is a graph showing the light intensity distribution on the focus plane, FIG. 51B is a graph showing the light intensity distribution on the defocus plane defocussed by 0.5 μm, FIG. 51C is a graph showing the light intensity distribution on the defocus plane defocussed by 1.0 μm, and FIG. 51D is a graph showing the light intensity distribution on the defocus plane defocussed by 1.5 μm.

FIGS. 53A to 53D are graphs showing the light intensity distributions in the vertical direction of lines and spaces shown in FIG. 49 on the focus and defocus planes, obtained by using the aperture stop shown in FIG. 52, wherein FIG. 53A is a graph showing the light intensity distribution on the focus plane, FIG. 53B is a graph showing the light intensity distribution on the defocus plane defocussed by 0.5 μm, FIG. 53C is a graph showing the light intensity distribution on the defocus plane defocussed by 1.0 μm, and FIG. 53D is a graph showing the light intensity distribution on the defocus plane defocussed by 1.5 μm.

FIGS. 55A to 53D are graphs showing the light intensity distributions in the vertical direction of lines and spaces shown in FIG. 49 on the focus and defocus planes, obtained by using the aperture stop shown in FIG. 54, wherein FIG. 55A is a graph showing the light intensity distribution on the focus plane.

FIGS. 57A to 57C are graphs showing the light intensity of spectra at the iris, of lines and spaces shown in FIG. 49, obtained by using the aperture stops shown in FIGS. 56A to 56C as the comparison example, wherein FIG. 57A is a graph showing the light intensity for the aperture stop shown in FIG. 56A, FIG. 57B is a graph showing the light intensity for the aperture stop shown in FIG. 56B, and FIG. 57C is a graph showing the light intensity for the aperture stop shown in FIG. 56C.

FIGS. 58A to 58C are graphs showing the intensity of spectra at the iris, of lines and spaces shown in FIG. 49, obtained by using the aperture stops shown in FIGS. 56D to 56F according to the embodiment, wherein FIG. 58A is a graph showing the light intensity for the aperture stop shown in FIG. 56D, FIG. 58B is a graph showing the light intensity for the aperture stop shown in FIG. 56E, and FIG. 58C is a graph showing the light intensity for the aperture stop shown in FIG. 56F.

FIGS. 60A and 60B are graphs showing the light intensity of spectra at the iris, of lines and spaces shown in FIG. 49, obtained by using the aperture stops shown in FIGS. 59A and 59B as the comparison example, wherein FIG. 60A is a graph showing the light intensity for the aperture stop shown in FIG. 59A, and FIG. 60B is a graph showing the light intensity for the aperture stop shown in FIG. 59B.

FIGS. 61A to 61C are graphs showing the intensity of spectra at the iris, of lines and spaces shown in FIG. 49, obtained by using the aperture stops shown in FIGS. 59C to 59E according to the embodiment, wherein FIG. 61A is a graph showing the light intensity for the aperture stop shown in FIG. 59C, FIG. 61B is a graph showing the light intensity for the aperture stop shown in FIG. 59D), and FIG. 61C is a graph showing the light intensity for the aperture stop shown in FIG. 59E.

FIGS. 62A to 62C are graphs showing the light intensity distribution of lines and spaces shown in FIG. 49 on the focus and defocus (by 1.0 μm) planes in the direction of lines and spaces, obtained by using the conventional aperture stops shown in FIGS. 56A to 56C, wherein FIG. 62A is a graph showing the light intensity distribution for the aperture stop shown in FIG. 56A, FIG. 62B is a graph showing the light intensity distribution for the aperture stop shown in FIG. 56B, and FIG. 62C is a graph showing the light intensity distribution for the aperture stop shown in FIG. 56C.

FIGS. 63A to 63C are graphs showing the light intensity distribution of lines and spaces shown in FIG. 49 on the focus and defocus (by 1.0 μm) planes in the direction of lines and spaces, obtained by using the embodiment aperture stops shown in FIGS. 56D to 56F, wherein FIG. 63A is a graph showing the light intensity distribution for the aperture stop shown in FIG. 56D, FIG. 63B is a graph showing the light intensity distribution for the aperture stop shown in FIG. 56E, and FIG. 63C is a graph showing the light intensity distribution for the aperture stop shown in FIG. 56F.

FIGS. 64A and 64B are graphs showing the light intensity distribution of lines and spaces shown in FIG. 49 on the focus and defocus (by 1.0 μm) planes in the direction of lines and spaces, obtained by using the conventional aperture stops shown in FIGS. 59A and 59B, wherein FIG. 64A is a graph showing the light intensity distribution for the aperture stop shown in FIG. 59A, and FIG. 64B is a graph showing the light intensity distribution for the aperture stop shown in FIG. 59B.

FIGS. 65A to 65C are graphs showing the light intensity distribution of lines and spaces shown in FIG. 49 on the focus and defocus (by 1.0 μm) planes in the direction of lines and spaces, obtained by using the embodiment aperture stops shown in FIGS. 59C to 59E, wherein FIG. 65A is a graph showing the light intensity distribution for the aperture stop shown in FIG. 59C, FIG. 65B is a graph showing the light intensity distribution for the aperture stop shown in FIG. 59D, and FIG. 65C is a graph showing the light intensity distribution for the aperture stop shown in FIG. 59E.

DETAILED DESCRIPTION OF THE PREFERRED EMBODIMENTS

Preferred embodiments will be described with reference to conventional techniques in order to help understanding the present invention.

Figure 2A:
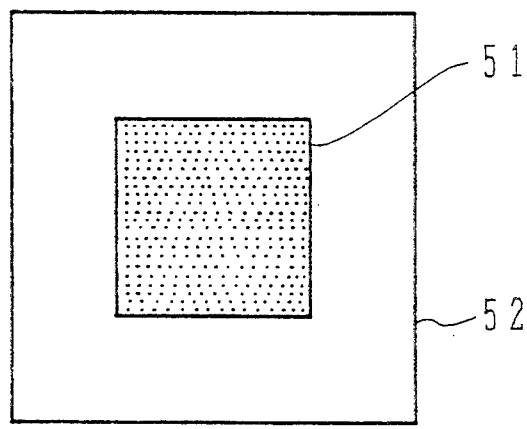
FIGS. 2A and 2B are plan views showing the structure of unit masks according to a conventional technique.
Figure 2B:
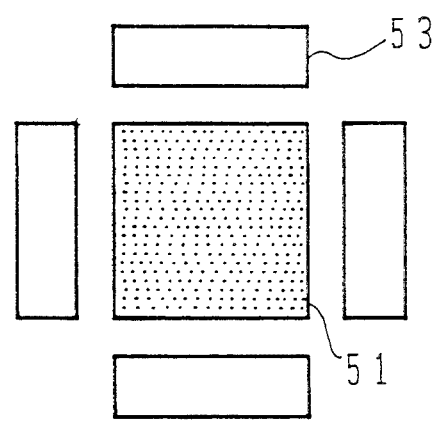

FIGS. 2A and 2B are schematic diagrams showing examples of phase shift masks to be used by a conventional exposure technique. FIG. 2A shows a phase shift mask having a square main hole 51 of a phase "$\pi$" formed at the central area and a phase shifter 52 of a phase "0" formed at the peripheral area of the main hole 51. The outer periphery of the phase shift mask is covered with a light shielding Cr film. This phase shifter is simple in structure and easy to manufacture.

The phase shifter is required to compensate for the diffraction light from the main hole, and it is not always required to be in contact with the main hole.

In the phase shift mask of FIG. 2B, four phase shifters 53 are juxtaposed with or disposed in the neighborhood of the four sides of a square main hole 51 of a phase "$\pi$", and spaced apart by a predetermined distance from the main hole 51. The length of each phase shifter 53 is the same as that of the side of the main hole 51. The outer areas of the main hole 51 and phase shifters 53 are covered with a light shielding film made of Cr for example. The four sides of the main hole 51 face substantially the longer sides of the four phase shifters. In this case, the resolution at the corners is also high.

Figure 1A:
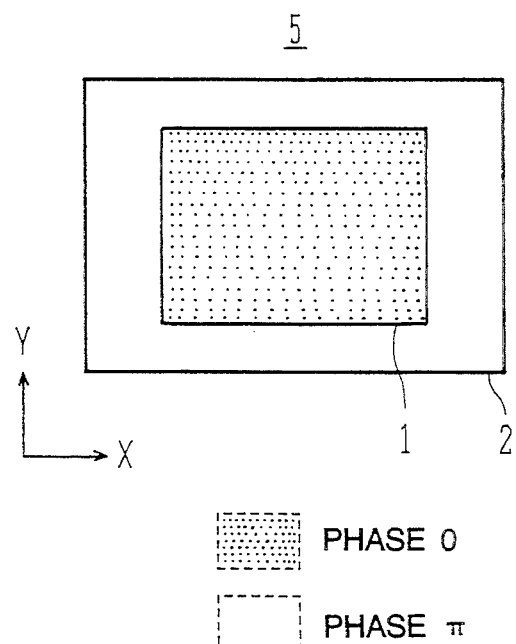
FIGS. 1A and 1B are plan views showing the structure of unit masks according to embodiments of the present invention.
Figure 1B:
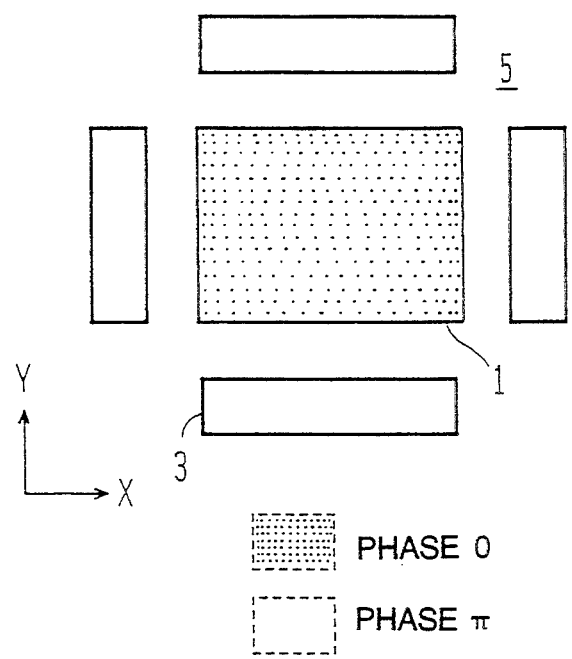

FIGS. 1A and 1B are schematic diagrams showing a unit mask according to embodiments of the present invention. FIG. 1A shows a mask for transferring a rectangular pattern such as a contact hole whose vertical and horizontal sides are generally the same length.

A rectangular main hole 1 of a phase "$\pi$" having a horizontal side longer than a vertical side is surrounded by a phase shifter 2 of a phase "0" having a horizontal side longer than a vertical side. The contour of the phase shifter 2 is rectangular. The width of the phase shifter is narrower at the longer side than at the shorter side. The outer area of the phase shifter 2 is covered with a light shielding film 5. It is assumed that such unit masks are disposed one upon another in the vertical direction. They may also be disposed two-dimensionally in the vertical and horizontal directions provied that the vertical pitch is shorter than the horizontal pitch.

In the unit mask shown in FIG. 1B, four phase shifters 3 are juxtaposed with the four sides of a square main hole 1 like that shown in FIG. 1A, and spaced apart by a predetermined distance from the main hole 1. The width of the phase shifter extending in the horizontal direction is narrower than that of the phase shifter extending in the vertical direction. The outer areas of the main hole 1 and phase shifters 3 are covered with a light shielding film 5.

Also in the case of the unit mask shown in FIG. 2B, similar to the unit mask shown in FIG. 2A, it is assumed that such unit masks are disposed one upon another in the vertical direction. They may also be disposed two-dimensionally in the vertical and horizontal directions. In the latter case, the pitch of unit masks disposed in the vertical direction is shorter than that in the horizontal direction.

If the same pattern is used repetitively, the size of the main hole is reduced in the direction along the area where patterns are densely formed. It is more effective to reduce both the size of the main hole and the width of the phase shifter.

Figure 3A:
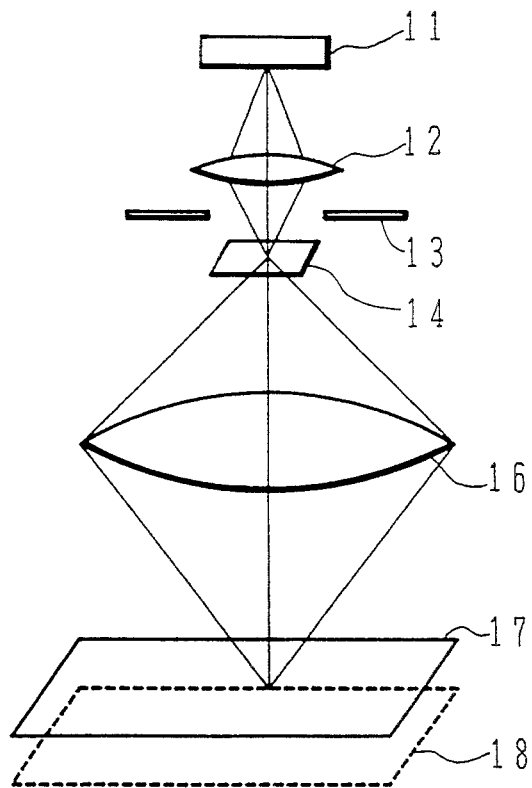

FIG. 3A shows an optical system for transferring a mask pattern.

Light radiated from a light source 11 is condensed by a condenser lens 12, and applied via an aperture stop 13 to a mask (reticle) 14. Light passed through the mask 14 is focussed by a projecting lens 16 onto a projection plane 17. If a pattern is to be transferred to a photoresist film or the like having some thickness or uneven surface, the light intensity distribution not only on the projection plane 17 but also on a defocussed plane 18 becomes an important issue.

Figure 3B:
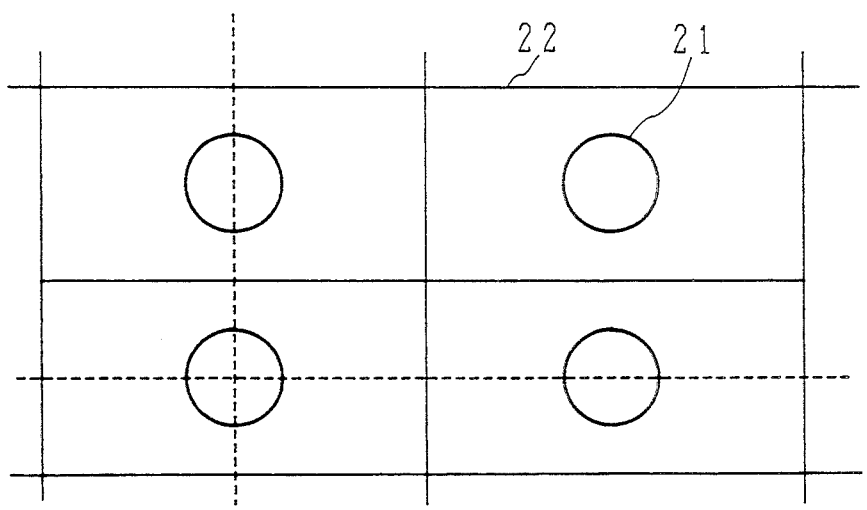

FIG. 3B shows an example of a device pattern to be formed on a resist layer or the like of a semiconductor substrate. In the device pattern shown in FIG. 3B, unit patterns 22 with contact holes 21 are disposed in the vertical and horizontal directions. The unit pattern 22 is a rectangle having the longer horizontal side than the vertical side. The distance between adjacent contact holes 21 formed at central areas of the unit patterns is longer in the horizontal direction than in the vertical direction. In such a case, the resolution particularly in the vertical direction becomes an issue.

In the following, unit masks of the embodiment will be further discussed while comparing them with unit masks of the conventional technique.

Figure 4A:
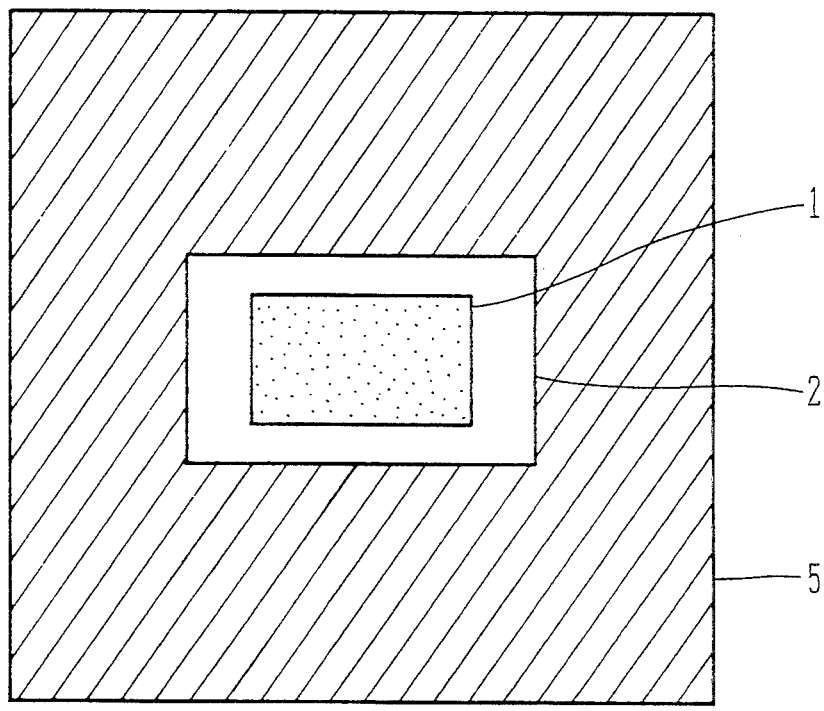
Figure 4B:
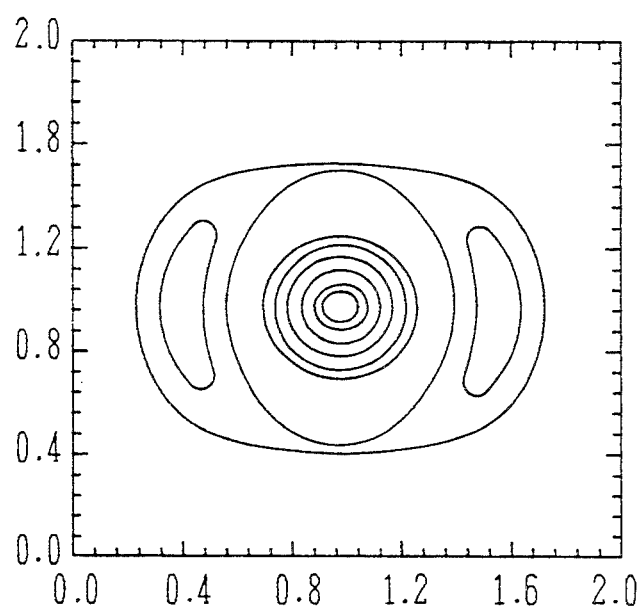

FIGS. 4A and 4B illustrate an example of a unit mask according to an embodiment of the present invention. FIG. 4A is a plan view of a unit mask, and FIG. 4B shows a light intensity distribution on the projection plane.

In FIG. 4A, a main hole 1 is rectangular, 0.8 $\mu$m long in the horizontal direction and 0.46 $\mu$m long in the vertical direction as measured on the image plane. A phase shifter 2 surrounds the outer area of the main hole 1. The widths of the phase shifter 2 are 0.14 $\mu$m at the longer sides, and 0.22 $\mu$m at the shorter sides. The contour of the phase shifter 2 is rectangular, 1.24 $\mu$m in the horizontal direction and 0.74 $\mu$m in the vertical direction. A light shielding film 5 made of a metal such as Cr covers the outer area of the phase shifter 2.

FIG. 4B shows the light intensity distribution when the single unit mask shown in FIG. 4A is projected on the projection plane. The optical system used had an numerical aperture NA=0.5, a light wavelength WL=0.365 $\mu$m, and a coherence factor S=0.3.

The size of the pattern of the unit mask projected on the projection plane is a square having a side length of 2.0 $\mu$m. The light intensity distribution shows a pattern long in the horizontal direction corresponding to the unit mask long in the horizontal direction. However, the light intensity distribution at the central area changes from a laterally long pattern to an isometric or isotropic pattern.

Figure 5A:
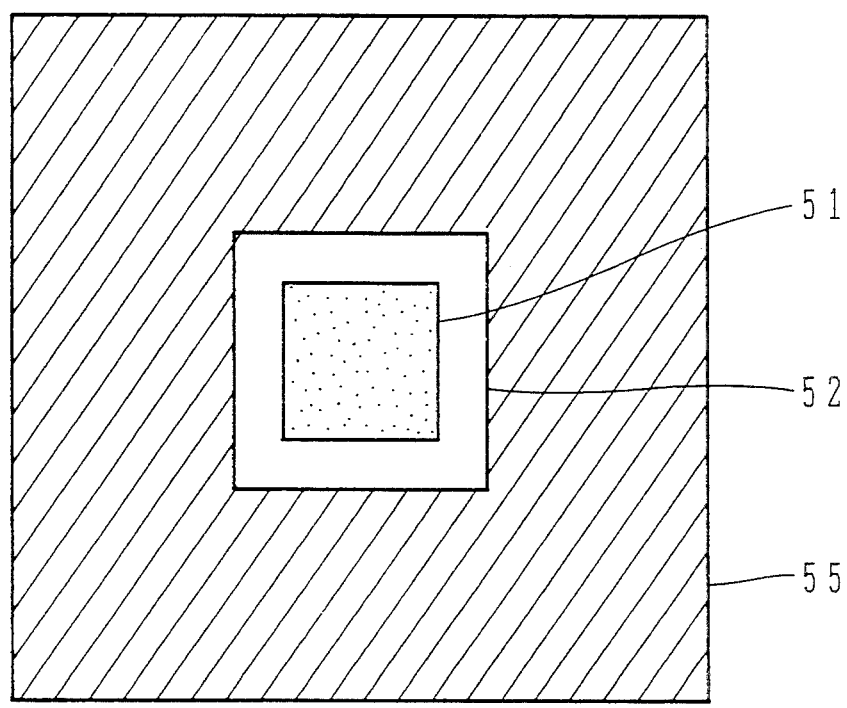
Figure 5B:
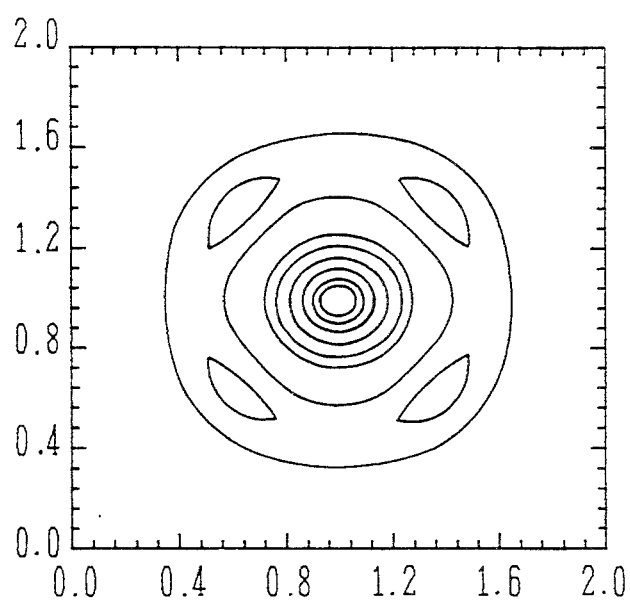

FIGS. 5A and 5B illustrate an example of a unit mask according to a conventional technique. FIG. 5A is a plan view of a unit mask, and FIG. 5B shows a light intensity distribution produced thereby.

In FIG. 5A, a square main hole 51 is formed at the central area of the unit mask, and a phase shifter 52 surrounds the main hole 51. The outer shape of the phase shifter 52 is also a square.

A light shielding film 55 made of Cr for example covers the outer area of the phase shifter 52. The size of the unit mask is 2.0 $\mu$m, 2.0 $\mu$m on the image plane.

FIG. 5B shows the light intensity distribution on the projection plane. The light intensity distribution shows a 4-fold axially symmetric pattern on the projection plane corresponding to the 4-fold axially symmetric pattern of the unit mask. The light intensity distribution at the central area indicates generally a circular pattern.

From the comparison between the light intensity distributions shown in FIGS. 4B and 5B, it is understood that the conventional unit mask is superior to the embodiment unit mask so long as only a single contact hole is formed. However, if units masks are consecutively disposed in the horizontal and vertical directions, different light distributions are obtained.

In the following, the device pattern shown in FIG. 3B will be described wherein unit masks are disposed at a pitch of 2.0 $\mu$m in the horizontal direction and a pitch of 1.0 $\mu$m in the vertical direction.

FIG. 6 shows a light intensity distribution on the projection plane of the pattern having unit masks of FIG. 4A disposed at a pitch of 2.0 $\mu$m in the horizontal direction and a pitch of 1.0 $\mu$m in the vertical direction. The size of each unit mask and the parameters of the optical system are the same as those described above. It can be seen from FIG. 6 that each contact hole is formed separately and the light intensity between contact holes becomes weak.

Figure 7A:
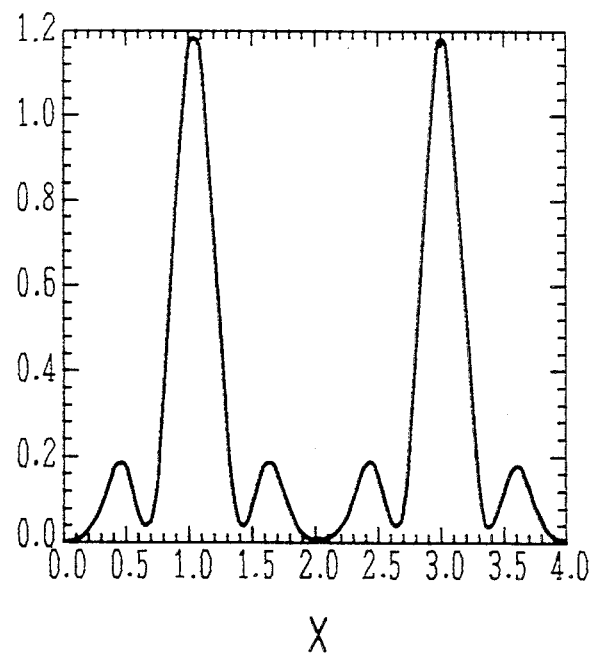
FIGS. 7A and 7B are graphs showing the light intensity distributions obtained by plotting the distribution shown in FIG. 6 in the X and Y directions.
Figure 7B:
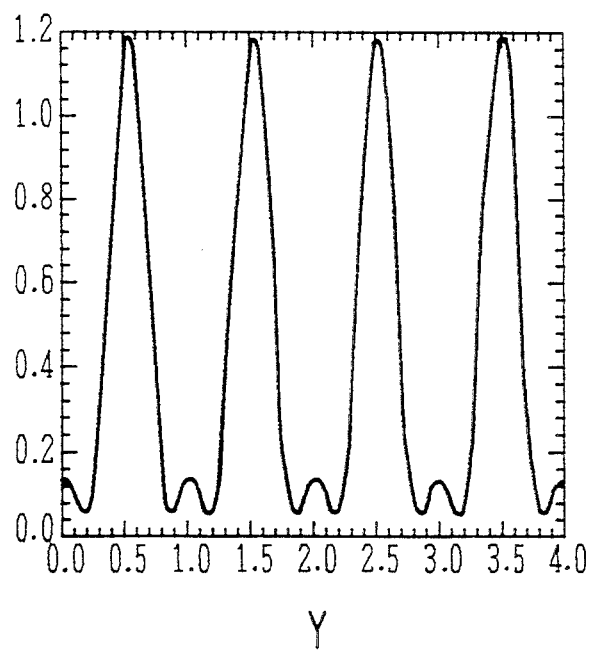

FIGS. 7A and 7B are graphs showing the light intensity distribution shown in FIG. 6 plotted in the horizontal direction X and in the vertical direction Y. The X direction light intensity distribution shown in FIG. 7A provides a high light intensity at the contact hole and low peaks on both sides thereof corresponding to the phase shifter. By normalizing the intensity of the main peak as about 1.2, the sub peak was about 0.2. With this order of intensities, it is easy to develop only main peaks without developing sub peaks.

The Y direction light intensity distribution shown in FIG. 7B provides high light intensity peaks at a pitch of 1.0 $\mu$m and one sub peak between two main peaks. Namely, two phase shifters form one sub peak. By normalizing the main peak as about 1.2, the sub peak was about 0.15 being suppressed sufficiently.

Figure 8:
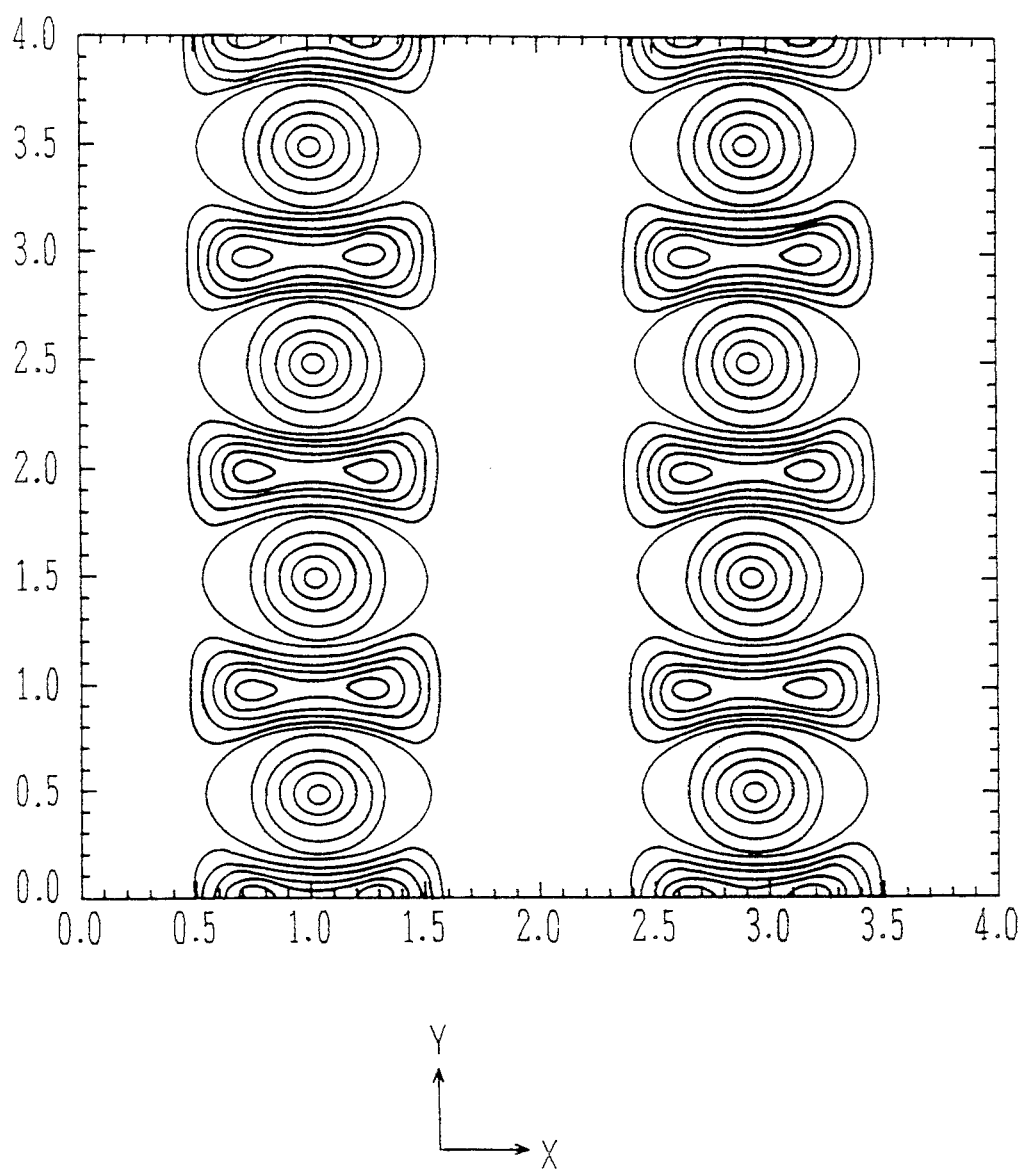
FIG. 8 is a contour line diagram showing the light intensity distribution on the projection plane using a conventional unit mask.

FIG. 8 shows the light intensity distribution on the projection plane of a pattern having unit masks according to the conventional technique shown in FIGS. 5A and 5B. As compared to the case where a single unit mask is used, it can be seen from FIG. 8 that the light intensity distribution at each contact hole is flattened in the horizontal direction and a relatively high intensity sub peak is present between contact holes.

Figure 9A:
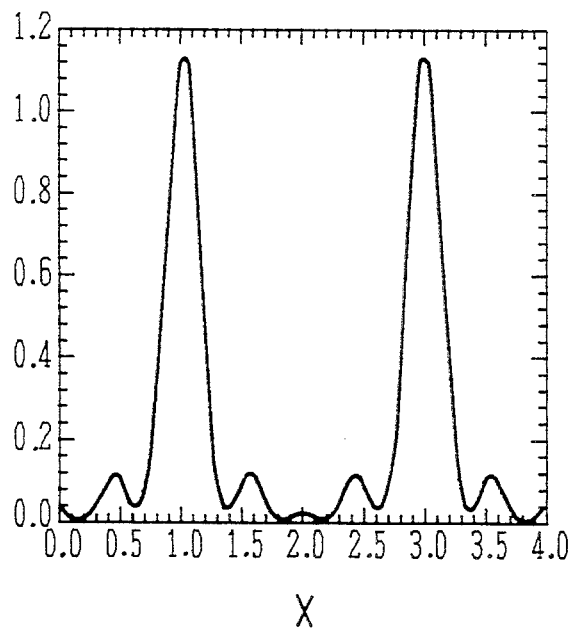
FIGS. 9A and 9B are graphs showing the light intensity distributions obtained by plotting the distribution shown in FIG. 8 in the X and Y directions.
Figure 9B:
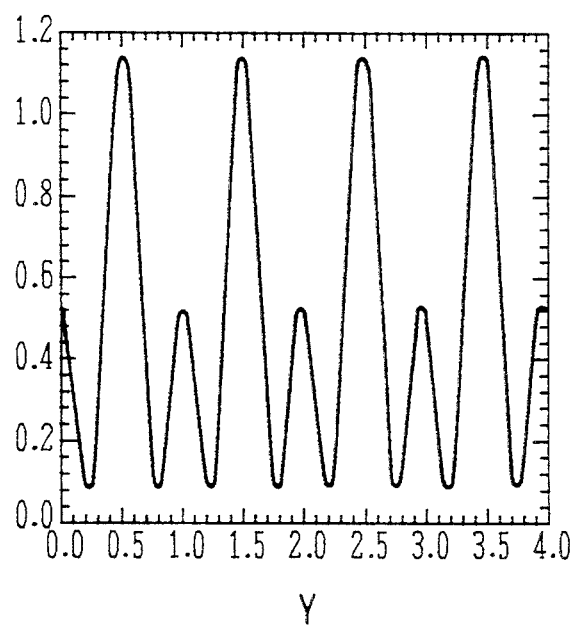

FIGS. 9A and 9B are graphs showing the light intensity distribution shown in FIG. 8 plotted at the center of each contact hole in the horizontal direction X and in the vertical direction Y.

The X direction light intensity distribution shown in FIG. 9A is superior to the embodiment shown in FIG. 7A in that the sub peak has a lower intensity. However, a new sub peak is generated between sub peaks corresponding to the phase shifters.

The Y direction light intensity distribution shown in FIG. 9B shows a relatively high intensity single sub peak between main peaks. By normalizing the main peak as about 1.15. the intensity of the sub peak was as high as about 0.5 or more. It is practically difficult to develop only main peaks without developing sub peaks, and therefore this unit mask is not suitable for practical use.

In semiconductor devices, the light intensity distribution not only on the projection plane but also on the defocussed plane is important.

Figure 11A:
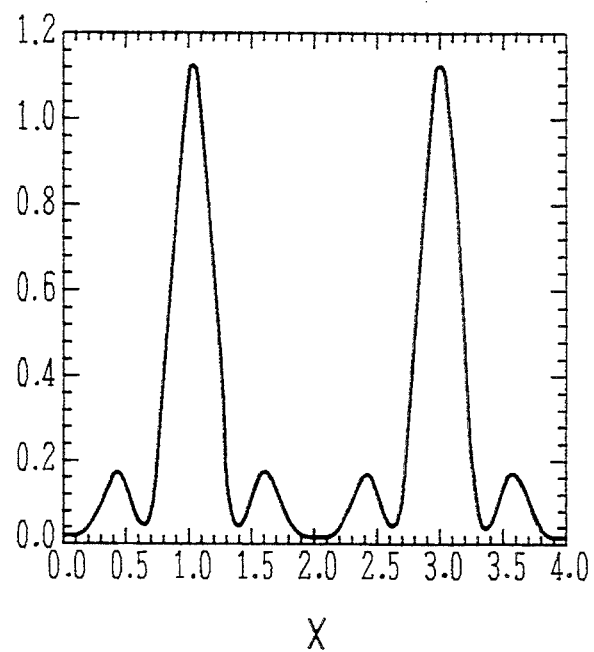
FIGS. 11A and 11B are graphs showing the light intensity distributions obtained by plotting the distribution shown in FIG. 10 in the X and Y directions.
Figure 11B:
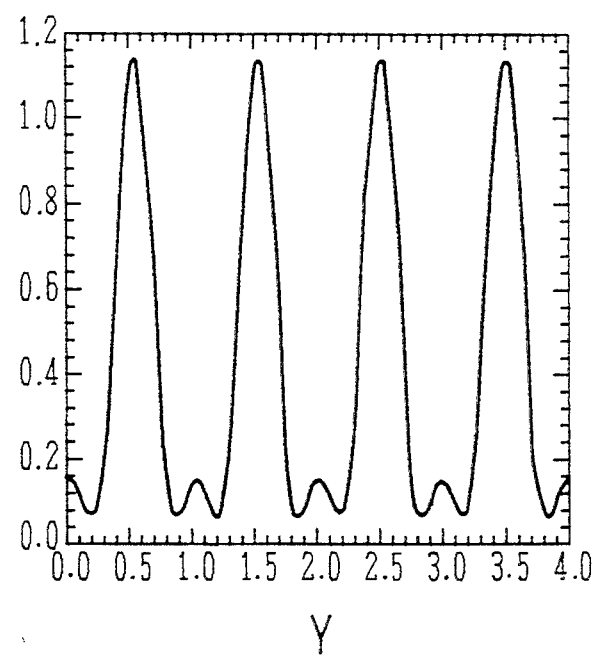

FIGS. 10, 11A, and 11b show light intensity distributions on a 0.5 $\mu$m defocussed plane of the pattern using embodiment unit masks.

As seen from the light intensity distribution shown in FIG. 10, the resolution and contrast substantially the same as those shown in FIG. 6 are obtained. From the graphs of FIGS. 11A and 11B, although the light intensity of the main peak lowers sightly, that of the sub peak also lowers, maintaining substantially the same contrast, in both the X and Y direction light intensity distributions.

Figure 12:
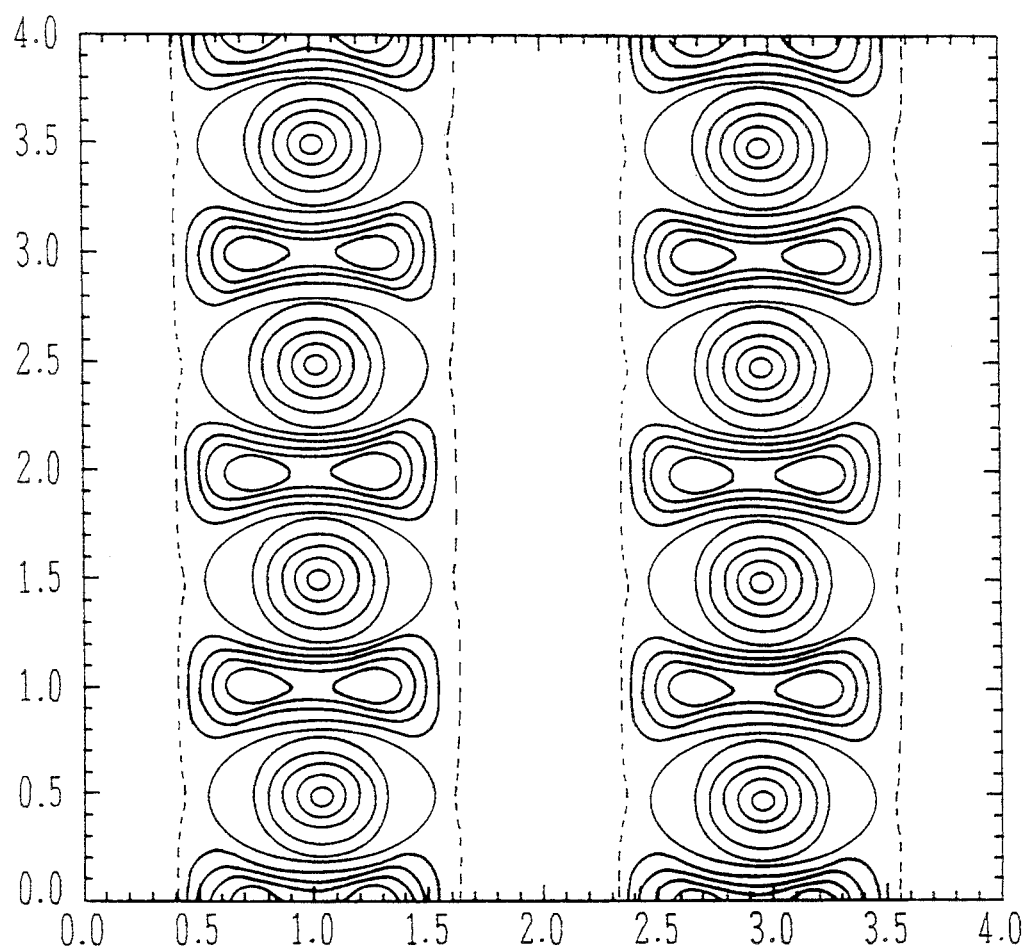
FIG. 12 is a contour line diagram showing the light intensity distribution on a 0.5 μm defocussed plane using a conventional unit mask.
Figure 13A:
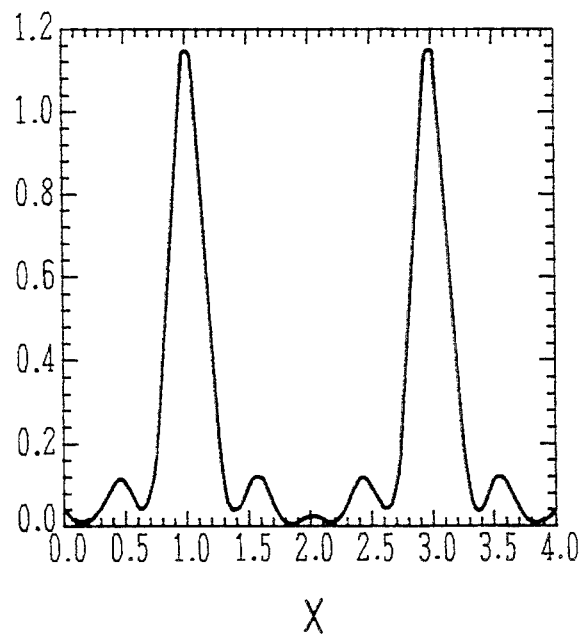
FIGS. 13A and 13B are graphs showing the light intensity distributions obtained by plotting the distribution shown in FIG. 12 in the X and Y directions.
Figure 13B:
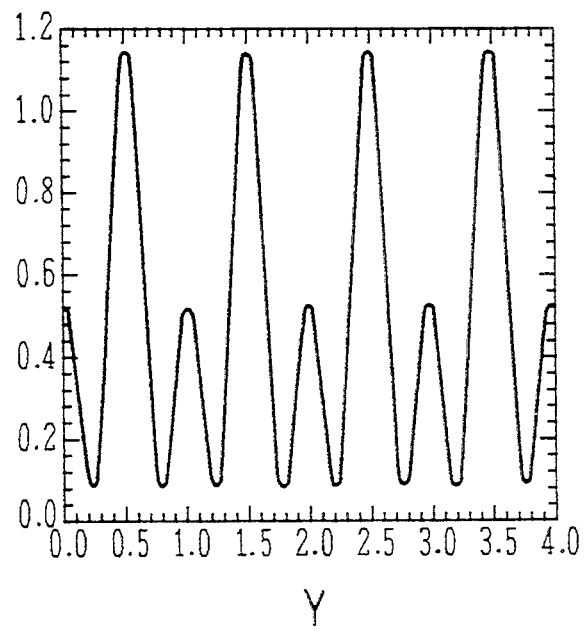

FIGS. 12, 13A and 13B show light intensity distributions on a 0.5 $\mu$m defocussed plane of the pattern using unit masks of the conventional technique. FIG. 12 shows the light intensity distribution on the 0.5 $\mu$m defocussed plane, and FIGS. 13A and 13B show the light intensity distributions in the X and Y directions. Similar to the light intensity distributions shown in FIGS. 8, 9A, and 9B, a high resolution is obtained in the X direction. However, in the Y direction, the intensity of the sub peak becomes high, resulting in a difficulty of developing main peaks without developing sub peaks, in practical use.

Figure 15A:
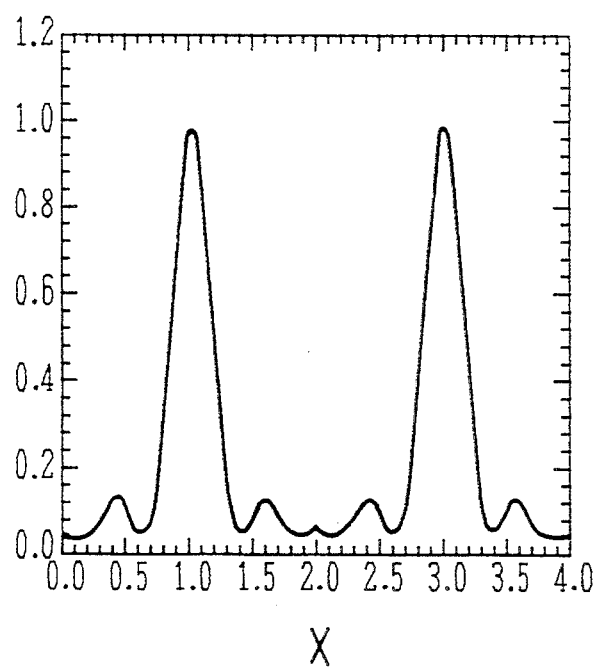
FIGS. 15A and 15B are graphs showing the light intensity distributions obtained by plotting the distribution shown in FIG. 14 in the X and Y directions.
Figure 15B:
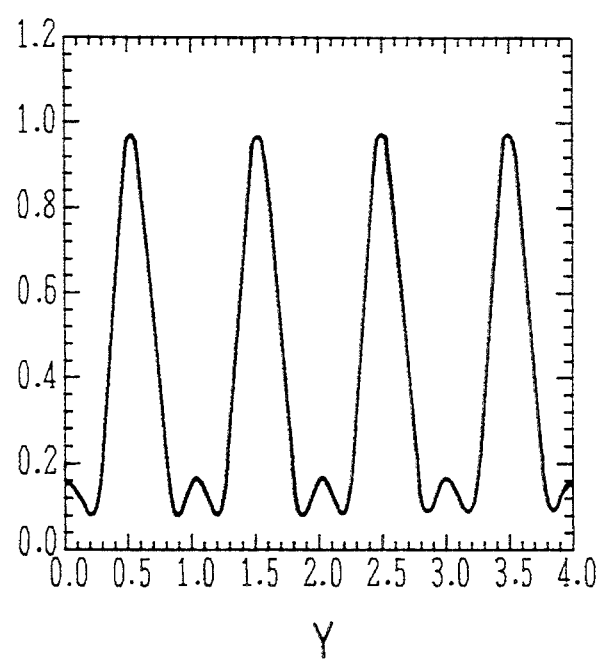

FIGS. 14, 15A and 15B show light intensity distributions on a 1.0 $\mu$m defocussed plane of the pattern using embodiment unit masks shown in FIG. 4A. FIG. 14 shows the light intensity distribution on the 1.0 $\mu$m defocussed plane, and FIGS. 15A and 15B show the light intensity distributions in the X and Y directions. Although the light intensity of the main peak lowers, the same contrast is maintained substantially. Although a new peak is observed between sub peaks, the light intensity is small, posing no practical problem.

Figure 16:
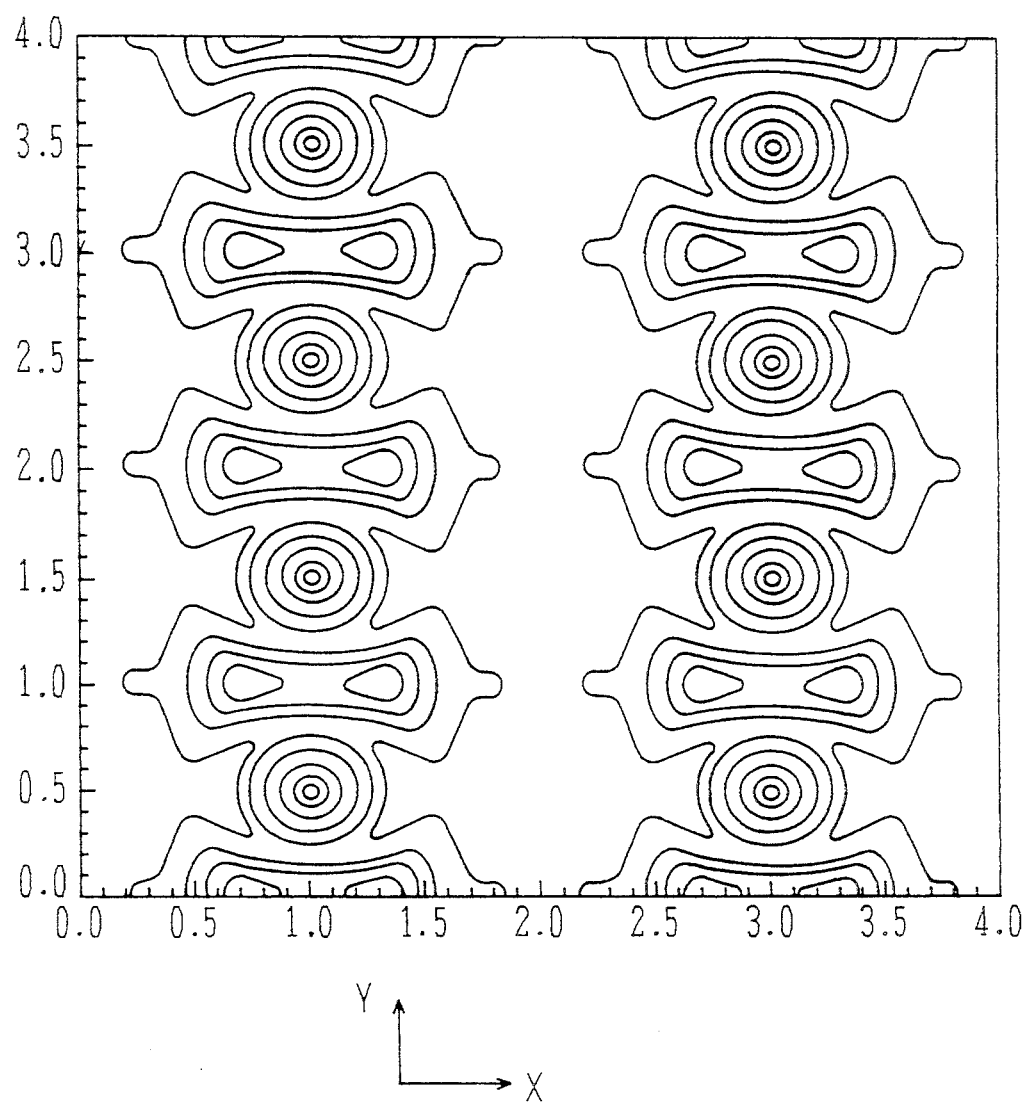
FIG. 16 is a contour line diagram showing the light intensity distribution on a 1.0 μm defocussed plane using a conventional unit mask.
Figure 17A:
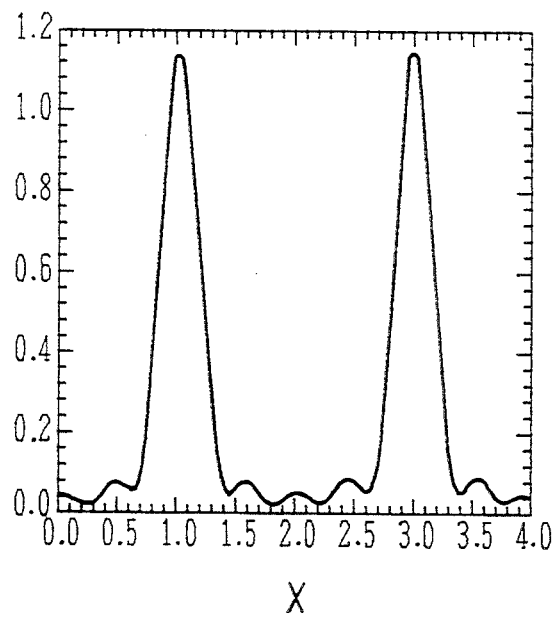
FIGS. 17A and 17B are graphs showing the light intensity distributions obtained by plotting the distribution shown in FIG. 16 in the X and Y directions.
Figure 17B:
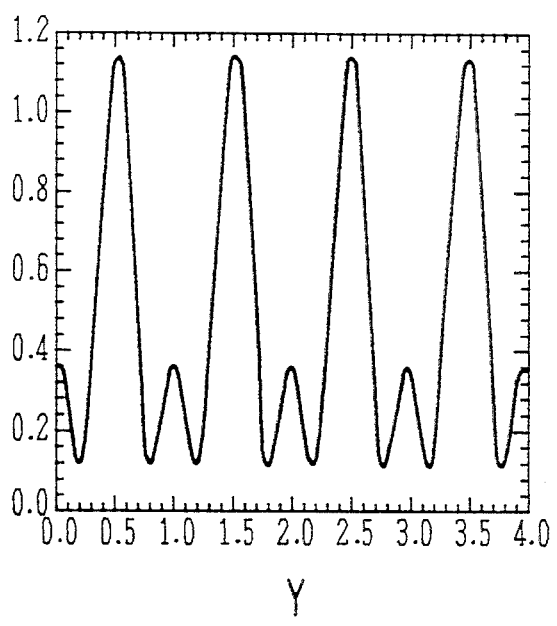

FIGS. 16, 17A and 17B show light intensity distributions on a 1.0 $\mu$m defocussed plane of the pattern using unit masks of FIG. 5A according to the conventional technique. FIG. 16 shows the light intensity distribution on the 1.0 $\mu$m defocussed plane, and FIGS. 17A and 17B show the light intensity distributions in the X and Y directions.

It can be observed from FIG. 16 that the light intensity distribution is considerably deformed at a low illuminance area. The X and Y direction light intensity distributions shown in FIGS. 17A and 17B indicate that the intensity of the sub peak becomes low. However, the intensity of the sub peak in the Y direction shown in FIG. 17B is not sufficiently small.

Figure 18A:
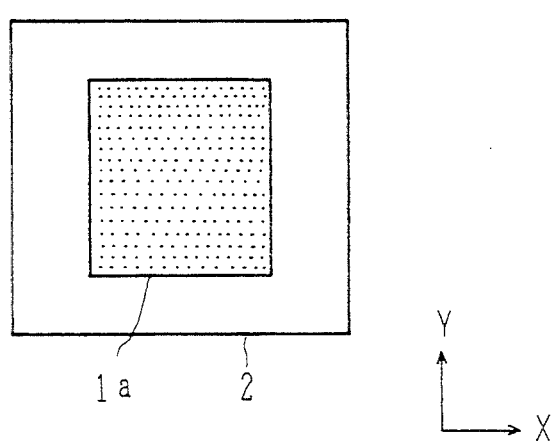
Figure 18B:
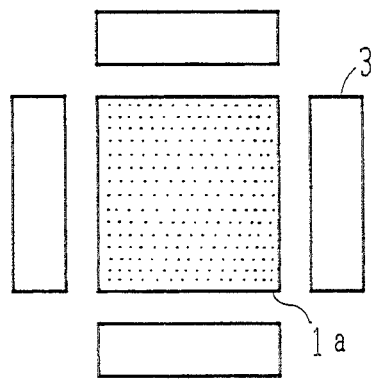

FIGS. 18A and 18B illustrate unit masks according to other embodiments of the present invention.

In FIG. 18A, a phase shifter 2 having different widths in the X and Y directions is formed around a square main hole 1a. The width of the horizontally extended phase shifter 2 is made narrower under the assumption that unit patterns are disposed densely in the vertical direction. Since the width of the phase shifter disposed in the direction of a shorter pitch of consecutive unit masks is made narrower, the resolution in this direction can be improved.

In FIG. 18B, phase shifters 3 are spaced apart from a square main hole 1a. The length of the side of each phase shifter is equal to that of the corresponding side of the main hole. The width of the horizontally disposed phase shifter is made narrower under tile assumption that these unit masks are disposed at a shorter pitch in the vertical direction.

Figure 18C:
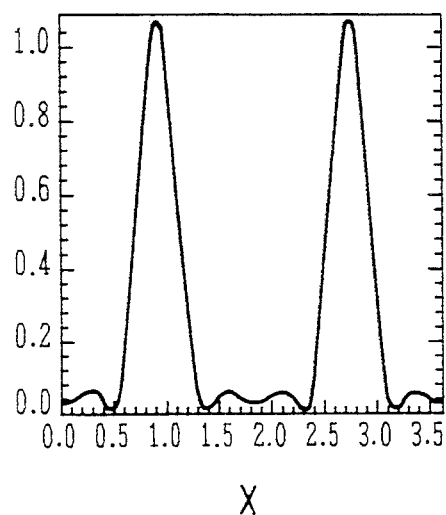
Figure 18D:
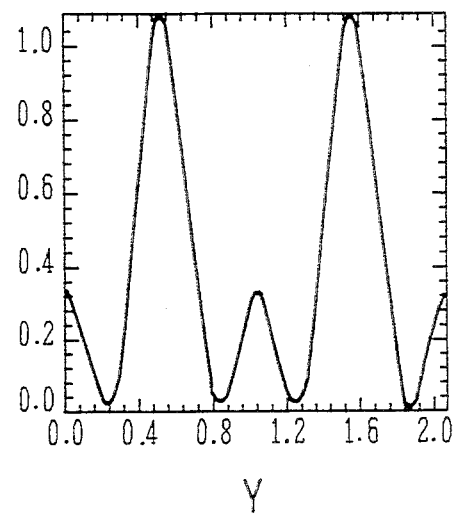

FIG. 18C and 18D show the X and Y direction light intensity distributions of the pattern using unit masks of FIG. 18A disposed at a pitch of 2.0 μm in the X direction and at a pitch of 1.0 μm in the Y direction.

The X direction has a sufficiently high contrast because of a longer pitch. The Y direction light intensity distribution are improved more than that shown in FIG. 9B, although sub peaks become rather strong.

In the above embodiment, the width of the phase shifter is changed in the direction of disposing unit masks. The size of the main hole may be changed with the direction and the width of the phase shifter may be maintained isometrically.

If the device pattern has different side lengths in the X and Y directions, the sizes of the main hole and/or phase shifter are changed in accordance with the pitch, from those values proportional with the side lengths of the device pattern.

The quality of an exposure process depends not only on the mask, but also on a light source and an optical system. An embodiment of a light source will be described next.

Figure 19:
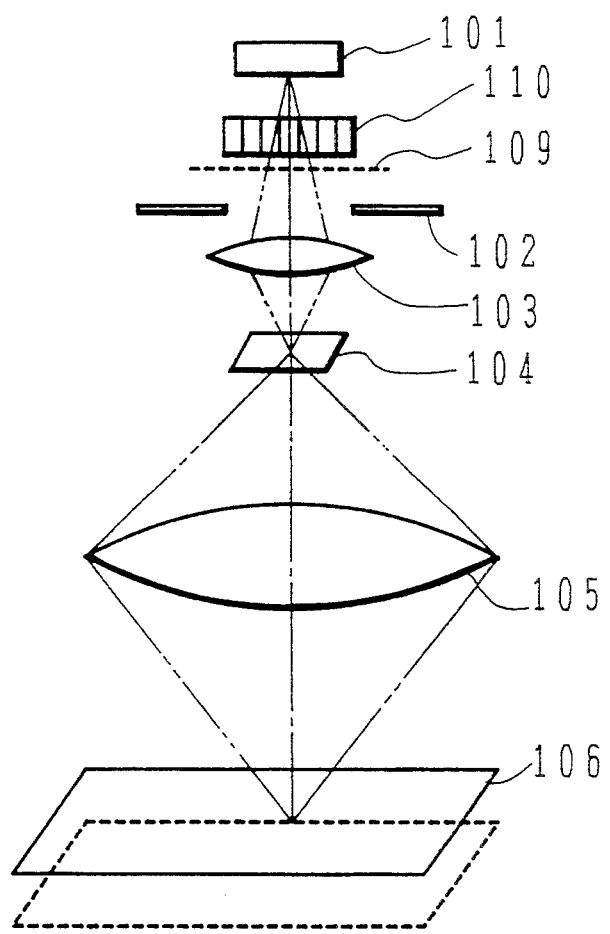
FIG. 19 is a schematic diagram showing an example of an exposure unit.

FIG. 19 is a schematic diagram showing an example of an exposure unit.

In FIG. 19, light emitted from a light source 101 is applied to a photoresist 106 via a fly eye lens 110, an aperture stop 102, a condenser lens 103, a phase shift mask 104, and a projecting lens 105. The pattern of the phase shift mask 104 is transferred to the photoresist 106 in the form of latent image. A fly eye lens 110 or compound eye lens is provided with a shutter 109 such as a liquid crystal shutter to selectively intercept light passing therethrough.

FIGS. 20A to 20F are plan views showing examples of a light outlet or emanating shape of the light source.

Figure 20A:
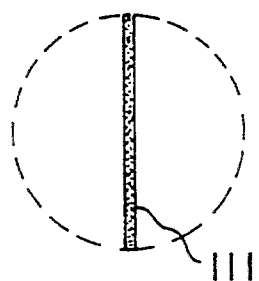
FIGS. 20A to 20F are plan views showing the light emamating shapes of light sources to be used in embodiments of the present invention.
Figure 20B:
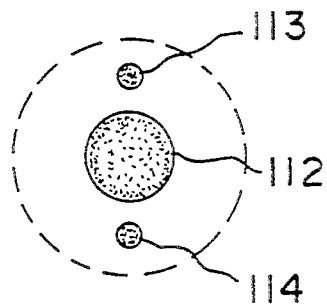
Figure 20C:
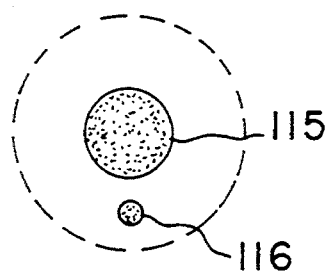
Figure 20D:
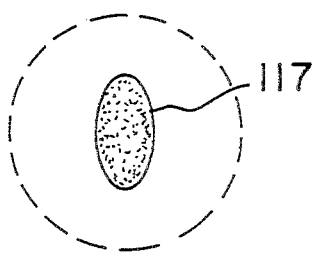
Figure 20E:
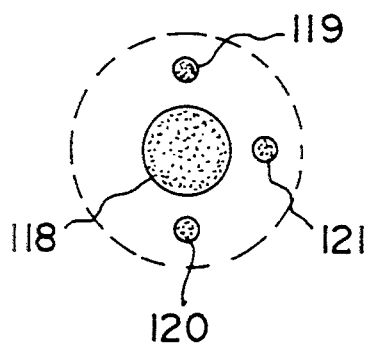
Figure 20F:
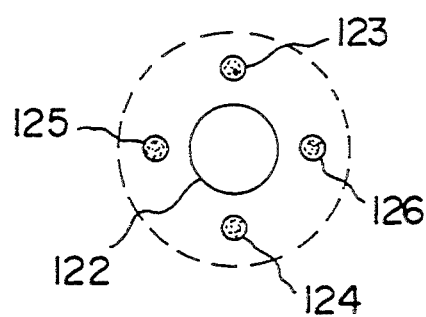

FIG. 20A shows a stripe light source for emitting light from a stripe area 111. FIG. 20B shows a dispersed-point light source for emitting light from a point 112 on the optical axis and from two symmetric points interposing the point 112. FIG. 20C shows a dispersed-point light source for emitting light from a point 115 on the optical axis and another point 116 near the point 115. FIG. 20D shows an ellipsoid light source for emitting light from an elliptic area 117. FIG. 20E shows a dispersed-point light source for emitting light from a point 118 on the optical axis and three points 119, 120, and 121 spaced radially from the point 118 in the two directions. FIG. 20F shows a dispersed-point light source for emitting light from a point 122 and four points 223 to 226 spaced radially from the point 122 in crossed directions.

The light outlet shape of the light sources shown in FIGS. 20A to 20F can be easily adjusted by partially shielding the fly eye lens 110 interposed between the condenser lens 103 and the light source 101.

Next, the light intensity distribution on the exposed photoresist obtained by using the light source 101 and various types of the phase shift mask 104 will be described.

(1-1) Levenson type phase shift mask

Figure 21:
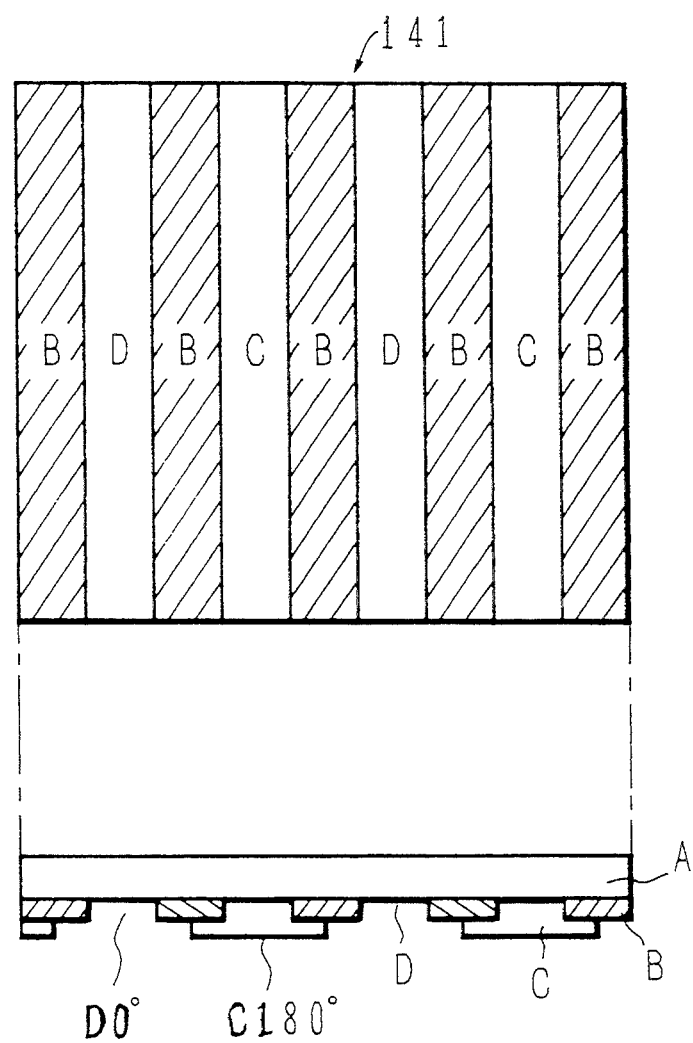
FIG. 21 shows a plan view and a side view illustrating the structure of a Levenson type phase shift mask.
Figure 22A:
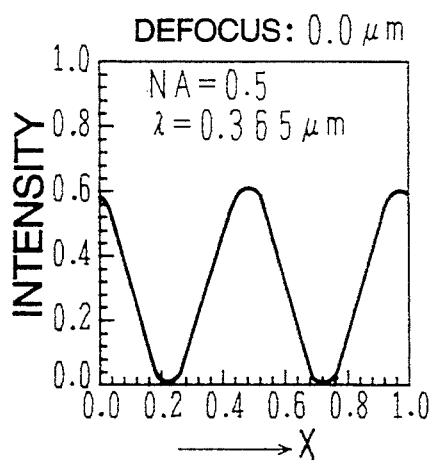
FIGS. 22A to 22E show the light intensity distributions of lines and spaces obtained by using a light source and a Levenson type phase shift mask according to an embodiment of the present invention.
Figure 22B:
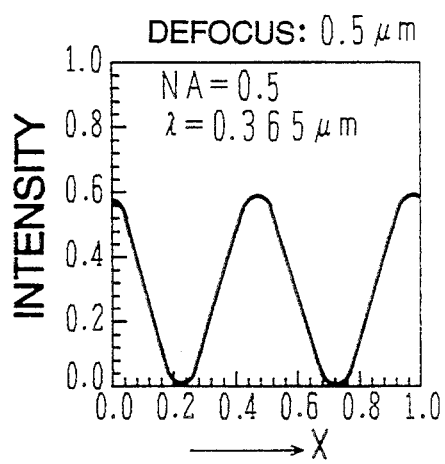
Figure 22C:
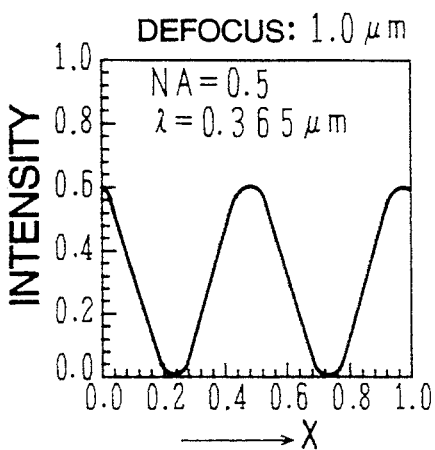
Figure 22D:
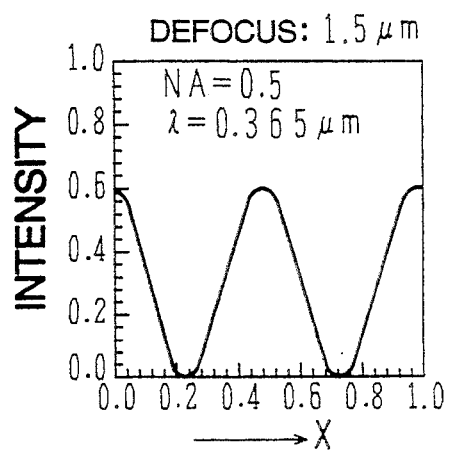
Figure 22E:
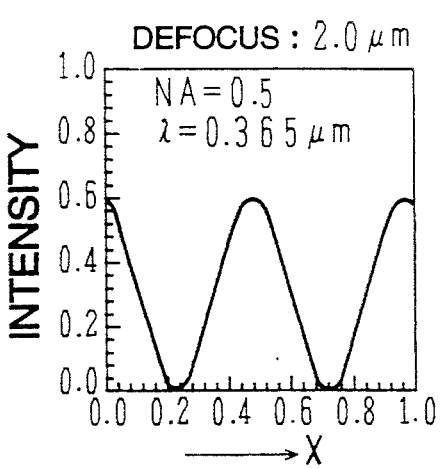

First, pattern transfer by a Levenson type shift mask 141 such as shown in FIG. 21 will be described.

The Levenson type phase shift mask 141 shown in FIG. 21 has a stripe pattern of lines and spaces of 0.25 μm in width. On a glass substrate A, a plurality of stripe light shielding areas B made of Cr are formed at a predetermined interval, and π phase shift areas C made of silicon nitride film are formed in every second areas between the light shielding areas B. The remaining areas with exposed glass substrate A are used as 0 phase shift areas D.

An example of using such lines and spaces is bit and word lines of a memory.

The resist 106 was exposed via the phase shift mask 141 by using the exposure unit shown in FIG. 19.

In this exposure, the line light source shown in FIG. 20A was used with the line being aligned in parallel to the stripe of the phase shift mask 141.

The light intensity distribution was observed by setting the defocus within the range of 0.0 to 2.0 μm. The results hardly indicated any difference as shown in FIGS. 22A to 22E. The illuminance was greater than the point light source because the stripe light source was used.

Although light from the light source 101 expands in the line direction and goes away from the optical axis, the light interference effects will not be degraded because of the direction of each light beam, thereby sufficiently obtaining the effects of the phase shift mask 141.

Figure 23A:
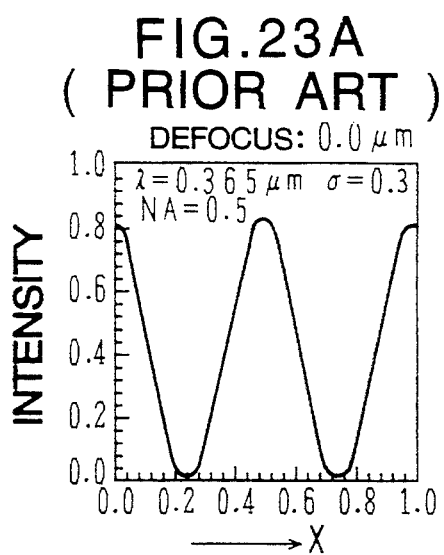
FIGS. 23A to 23F show the light intensity distributions of lines and spaces obtained by using a conventional light source and a Levenson type phase shift mask, and a plan view showing the light emanating shape of the conventional light source.
Figure 23B:
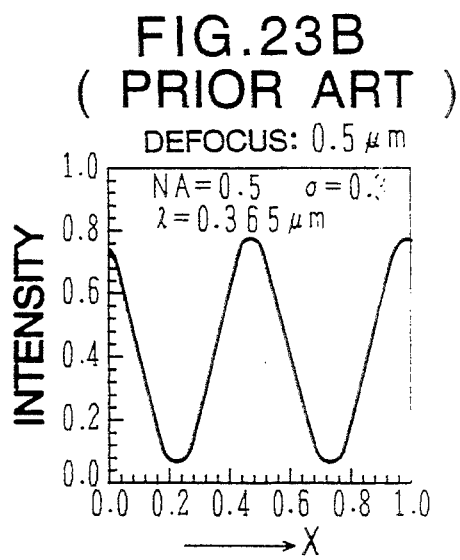
Figure 23C:
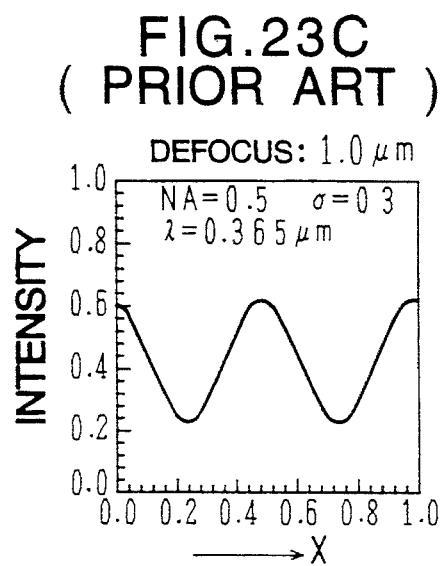
Figure 23D:
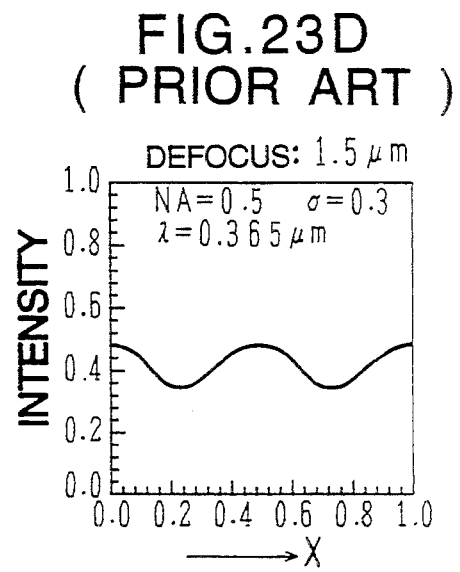
Figure 23E:
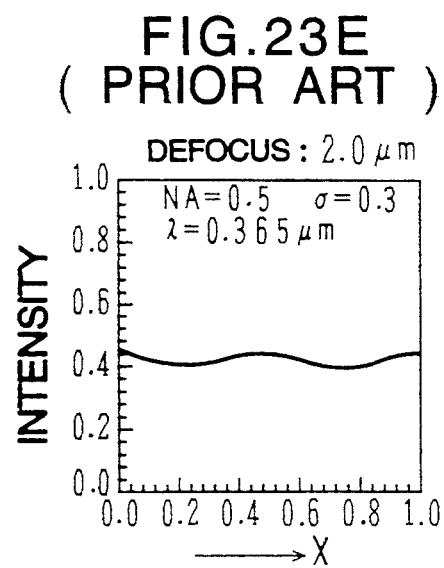
Figure 23F:
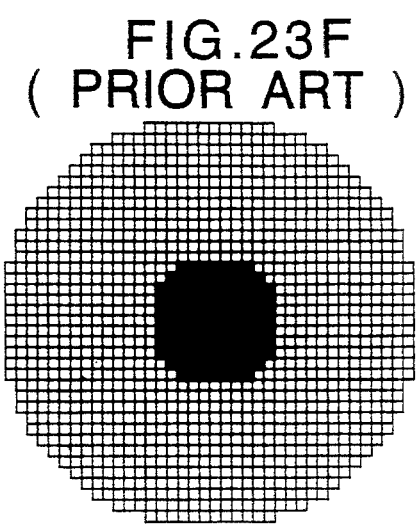

For the comparison between the stripe light source shown in FIG. 20A and a conventional point light source shown in FIG. 23F, the light intensity distribution was measured using the conventional point light source, the results being shown in FIGS. 23A to 23E. As appreciated, the greater the defocus, the lower the light intensity and depth of focus. In addition, the greater the defocus, the poorer the contrast.

It can be understood therefore that use of a stripe light source in exposing a line-and-space pattern suppresses greatly the degradation of the contrast as compared to the conventional example shown in FIGS. 23A to 23E, and that the depth of focus can be improved.

In the above example, the numerical aperture NA was 0.5, the coherence factor σ was 0.3, and the wavelength was set to 0.365 μm (i line). The same parameters were used in the following examples.

(1-2) Levenson type phase shift mask

In the above example (1-1), it has been discussed that the light intensity distribution was not deteriorated even at defocussed planes by using the stripe light source.

In practical applications, it becomes necessary to make the stripe wider in order to increase the light amount.

Figure 24A:
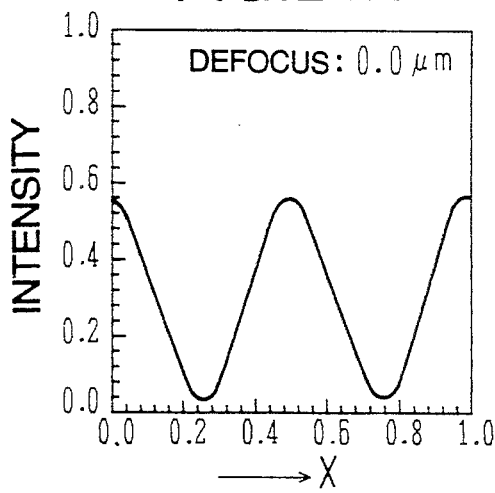
FIGS. 24A to 24F show the light intensity distributions of lines and spaces obtained by using another light source and a Levenson type phase shift mask according an embodiment of the present invention, and a plan view showing the light emanating shape of the light source.
Figure 24B:
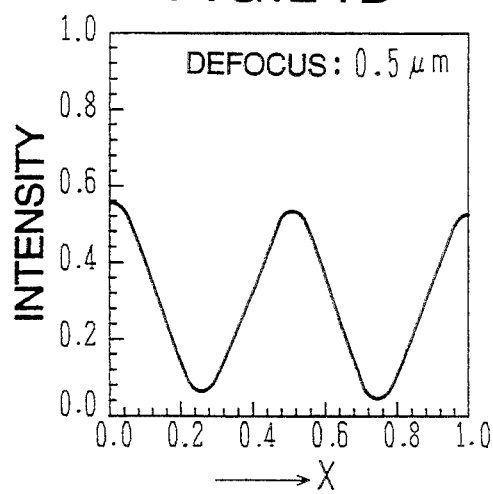
Figure 24C:
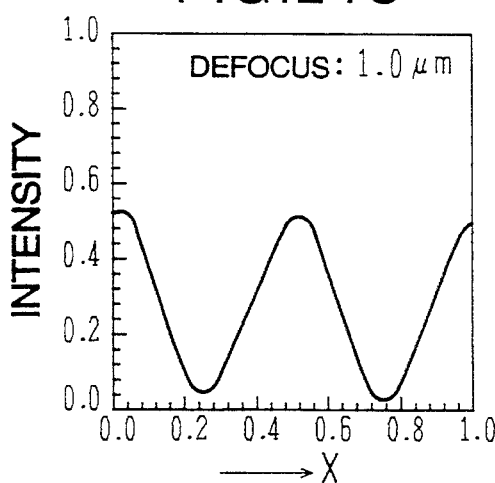
Figure 24D:
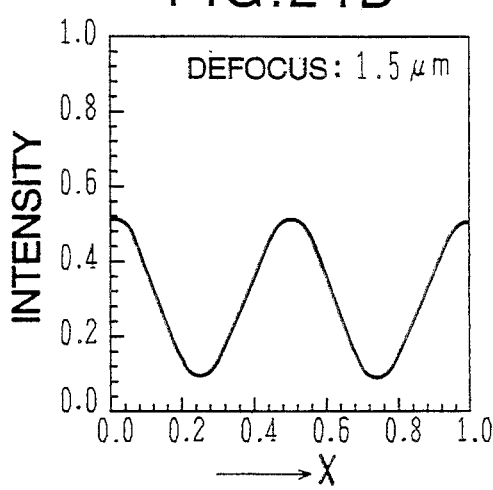
Figure 24E:
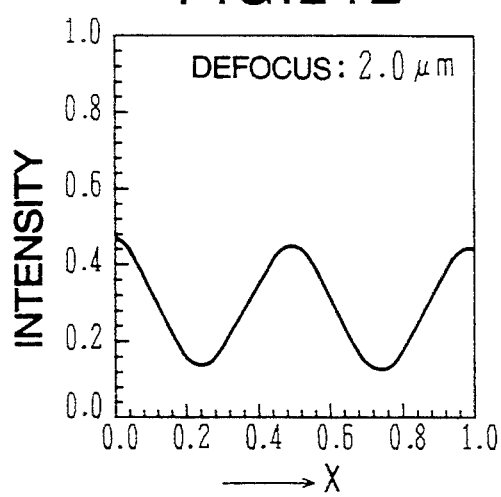
Figure 24F:
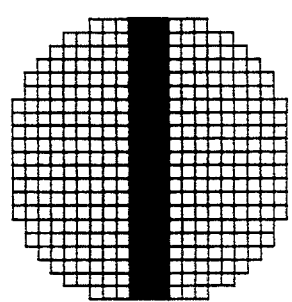

A stripe light source having the width of 0.14 time the angular aperture of the projecting lens 105 such as shown in FIG. 24F was used for the exposure, to check how the light intensity distribution is degraded at defocussed planes, the results being shown in FIGS. 24A to 24E indicating extremely small degradation as compared to a conventional point light source.

The pattern used in this example was a line-and-space pattern having a width of 0.25 μm.

(3) Cr-less type phase shift mask

In this example, a Cr-less type phase shift mask 142 such as shown in FIG. 2S was used for the exposure.

The Cr-less type phase shift mask 142 has a line-and-space stripe pattern. On a glass substrate E, a plurality of stripe π phase shift areas F are formed at a predetermined interval, and the remaining areas are used as 0 phase shift areas G.

The light intensity distribution was measured by using the phase shift mask 142 and the stripe light source shown in FIG. 20A.

The results are shown in FIGS. 26A to 26D which indicate that the light intensity distribution changes scarcely.

Figure 25:
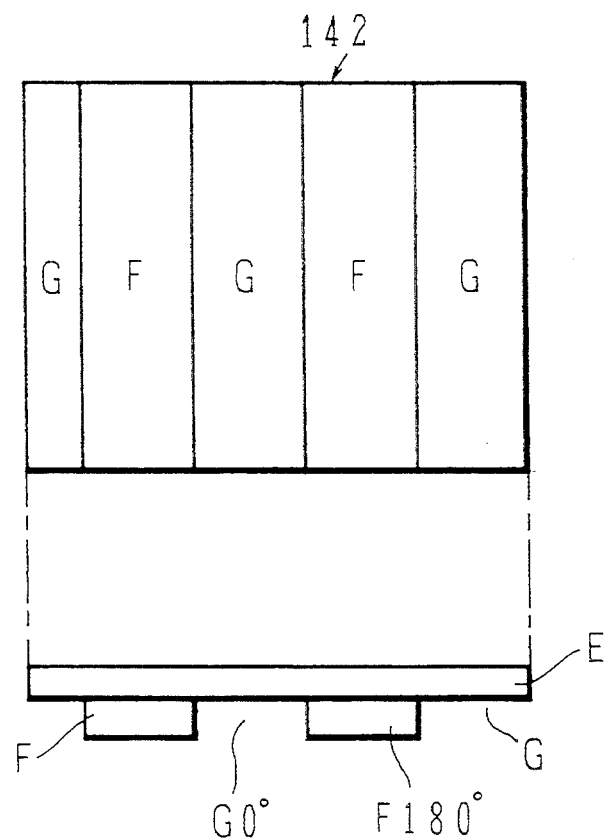
FIG. 25 shows a plan view and a side view illustrating the structure of a Cr-less type phase shift mask.
Figure 26A:
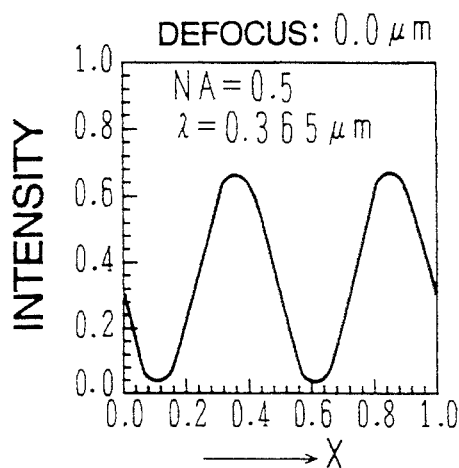
FIGS. 26A to 26D show the light intensity distributions of lines and spaces obtained by using a light source and a Cr-less type phase shift mask according an embodiment of the present invention.
Figure 26B:
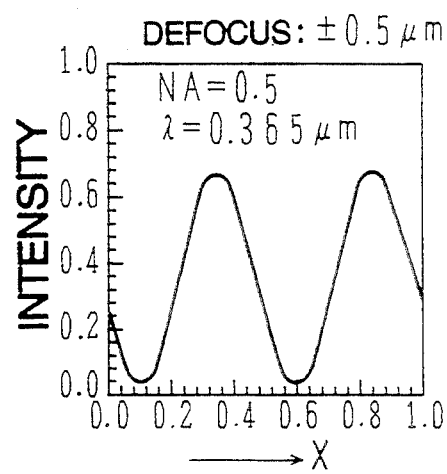
Figure 26C:
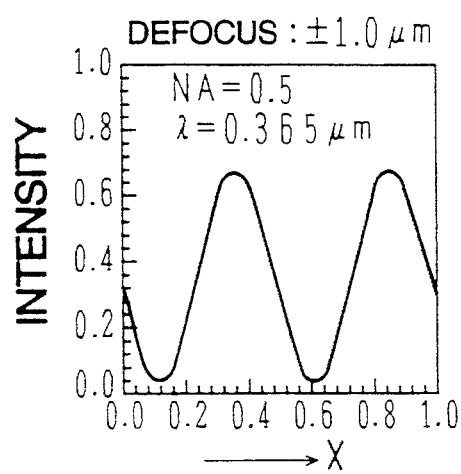
Figure 26D:
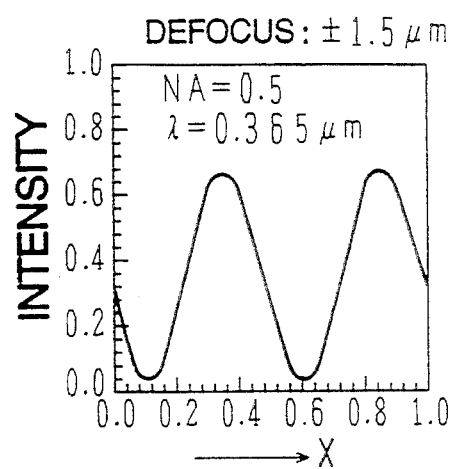
Figure 27A:
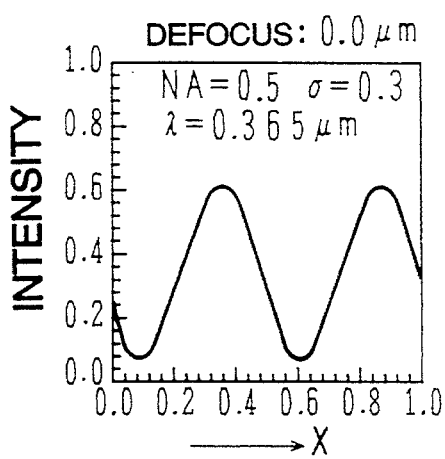
FIGS. 27A to 27D show the light intensity distributions of lines and spaces obtained by using a conventional light source and a Cr-less type phase shift mask.
Figure 27B:
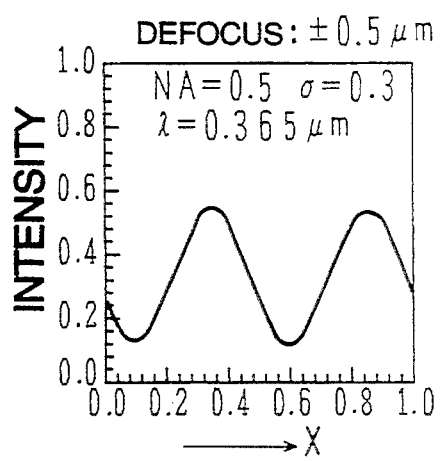
Figure 27C:
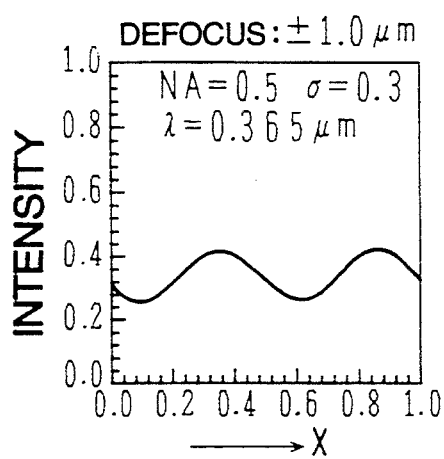
Figure 27D:
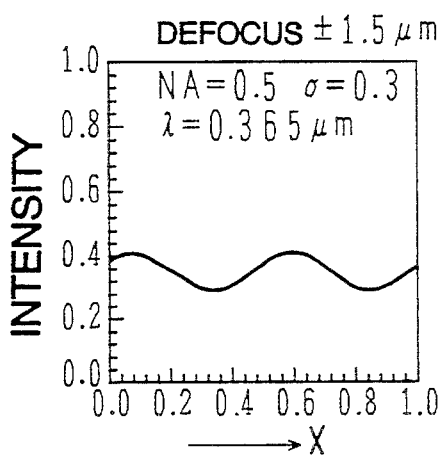

For the comparison sake, the light intensity distribution was measured using the Cr-less phase shift mask 142 shown in FIG. 25 and a conventional point light source, the results being shown in FIGS. 27A to 27D which indicate that the contrast becomes worse as the depth of focus becomes shallower and the defocus becomes greater. As appreciated from the results shown in FIGS. 26A to 26D, a contrast was obtained which was higher than the conventional example shown in FIGS. 27A to 27D. It can be seen therefore that the resolution and the depth of focus can be improved.

In this manner, the precision of a pattern transferred to the photoresist 106 can be improved.

(4) Edge emphasized type phase shift mask 107

Figure 28:
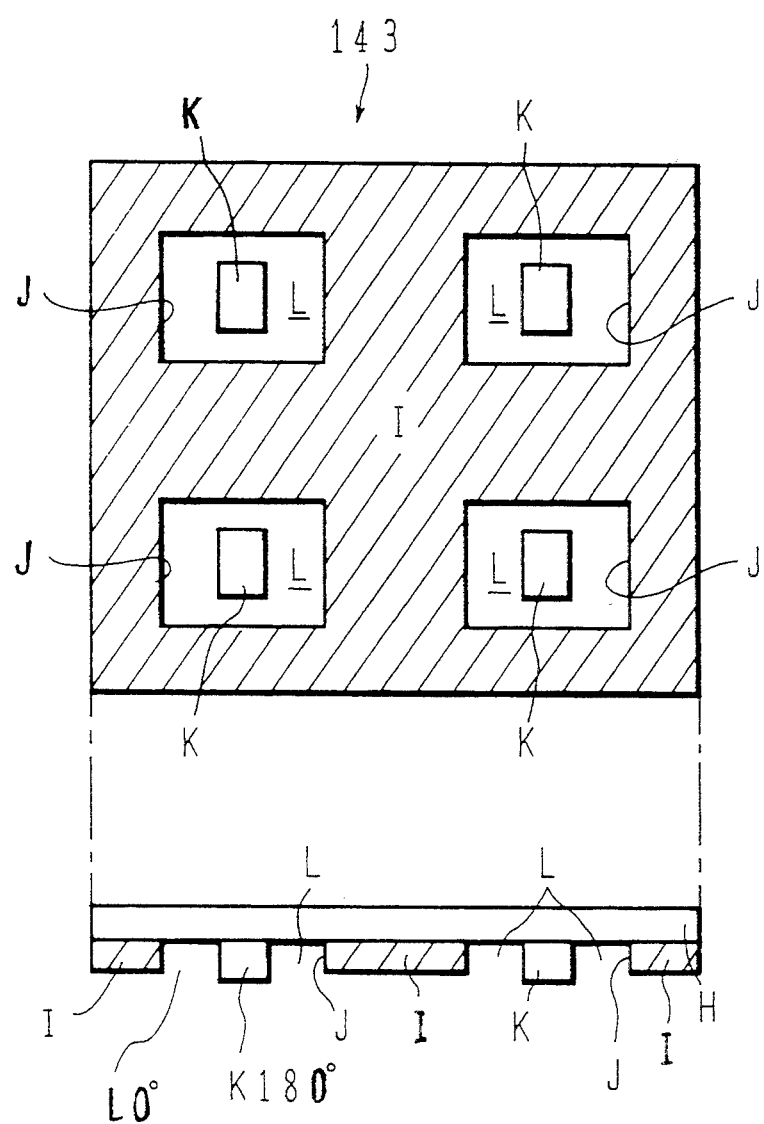
FIG. 28 shows a plan view and a cross section of an example of an edge emphasized type phase shift mask.

In this example, an edge emphasized phase shift mask 143 such as shown in FIG. 28 is used.

The edge emphasized type phase shift mask 143 is used for transferring a hole forming pattern. Hole areas J are formed in a Cr light shielding area I covering a glass substrate H. A $\pi$ phase shift area K is formed in a central small area of each hole area J, and the glass substrate exposed in each hole area J is used as a 0 phase shift area. The pitches of consecutive units in the mask 143 are 2 $\mu$m and 1 $\mu$m in the X and Y directions (in the horizontal and vertical directions), respectively.

A pattern was transferred by using the unidirectionally dispersed light source shown in FIG. 20B. In this case, light is emitted from the central large point 112 and small points 113 and 114 interposing the center point 112, and the light from the small points 113 and 114 function as noises of the light from the center point 112. The direction of disposing the small points 113 and 114 was set to the direction of disposing the hole areas J at a shorter pitch.

Figure 29A:
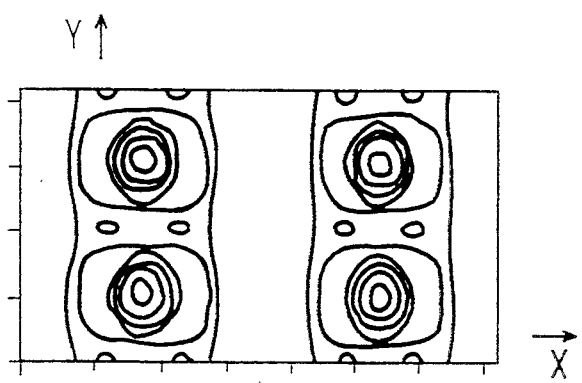
FIGS. 29A to 29C show the light intensity distributions of holes obtained by using a light source and an edge emphasized type phase shift mask according to an embodiment of the present invention.
Figure 29B:
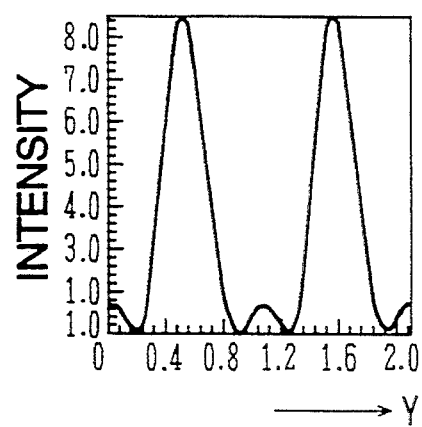
Figure 29C:
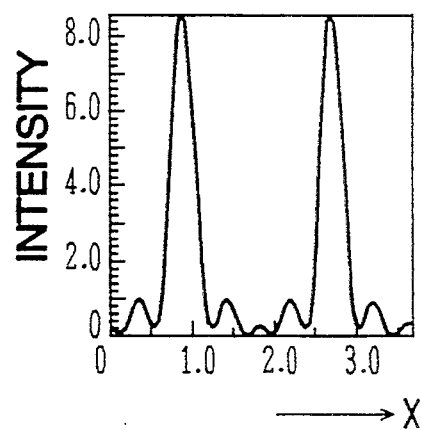

In this example, sub peaks by the light interference at the narrow areas formed between the hole areas J at the pitch of 1 $\mu$m become an important issue. However, light noises applied in this shorter pitch direction suppressed the interference effects of the phase shifter as shown in the light intensity distributions shown in FIGS. 29A to 29C, greatly lowering the intensity of sub peaks at the narrow areas.

Figure 30A:
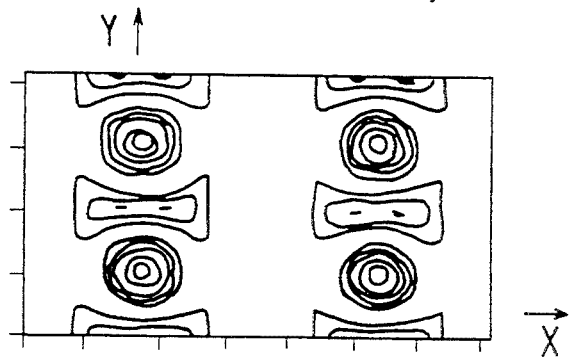
FIGS. 30A to 30C show the light intensity distributions of holes obtained by using a conventional light source and an edge emphasized type phase shift mask.

For the comparison sake, the light intensity distribution at the exposure plane was measured by using the mask 143 shown in FIG. 28 and a conventional point light source, the results being indicated by contour lines shown in FIG. 30A. The light intensity distributions as viewed from line X-X and line Y-Y are shown in FIGS. 30B and 30C.

Figure 30B:
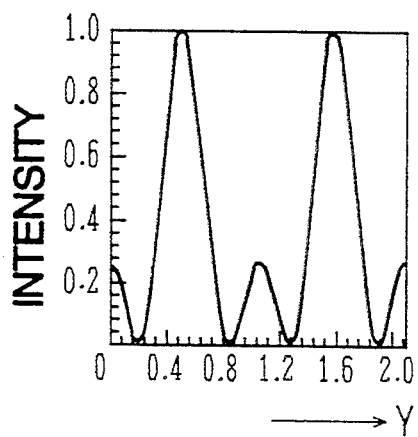
Figure 30C:
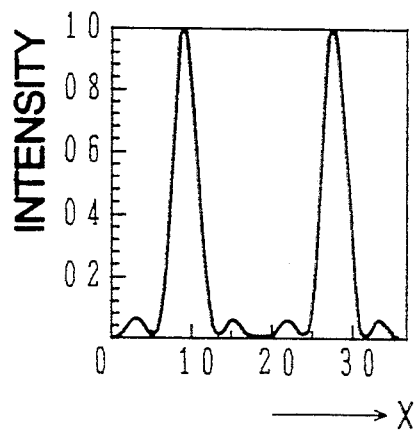
Figure 31A:
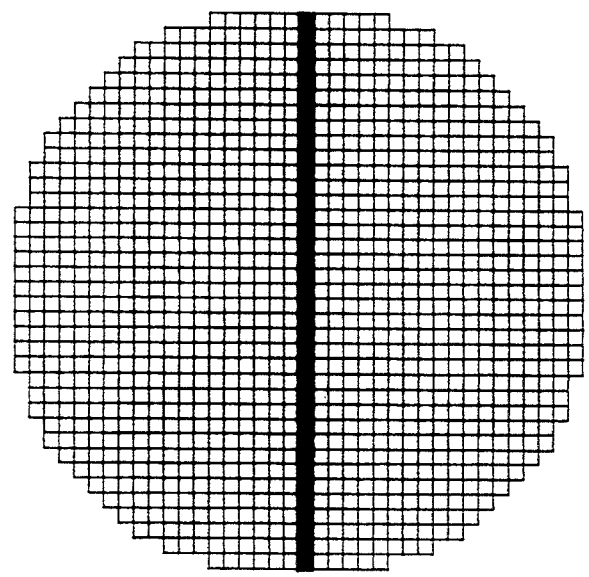
FIGS. 31A to 31F are plan views showing the matrix patterns of liquid crystal used for the light sources shown in FIGS. 20A to 20F.
Figure 31B:
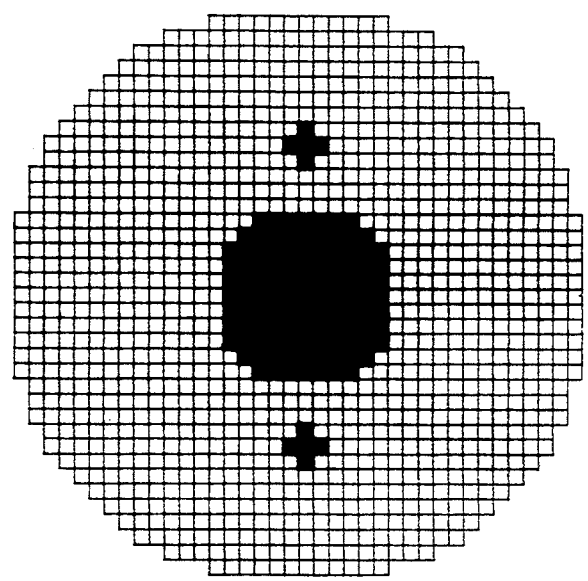
Figure 31C:
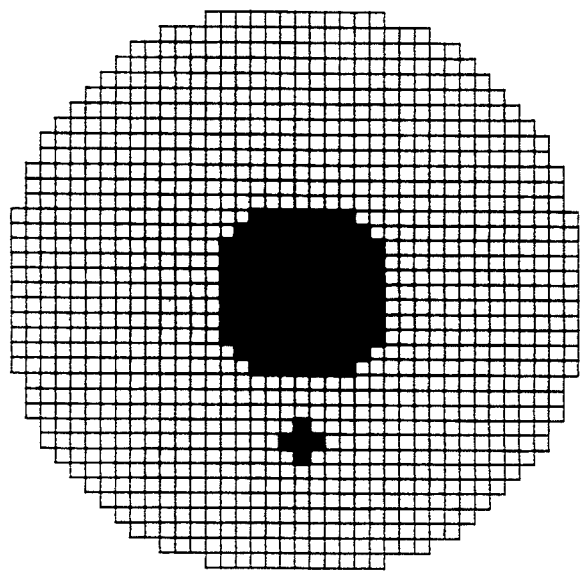
Figure 31D:
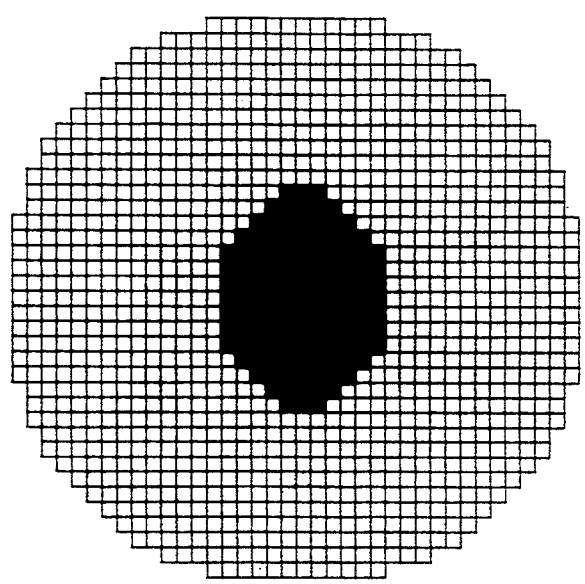
Figure 31E:
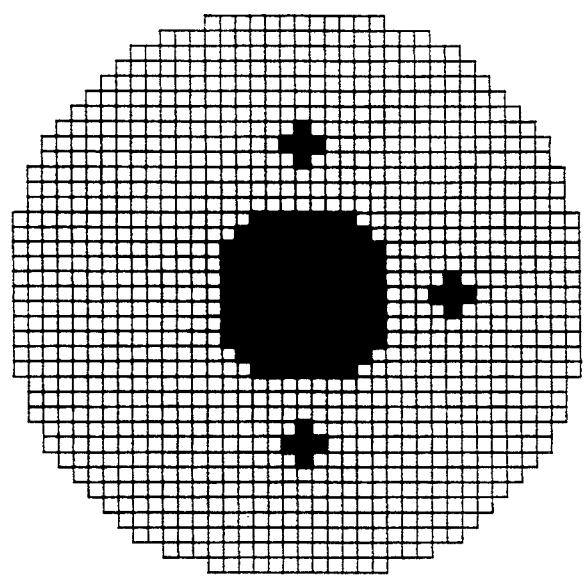
Figure 31F:
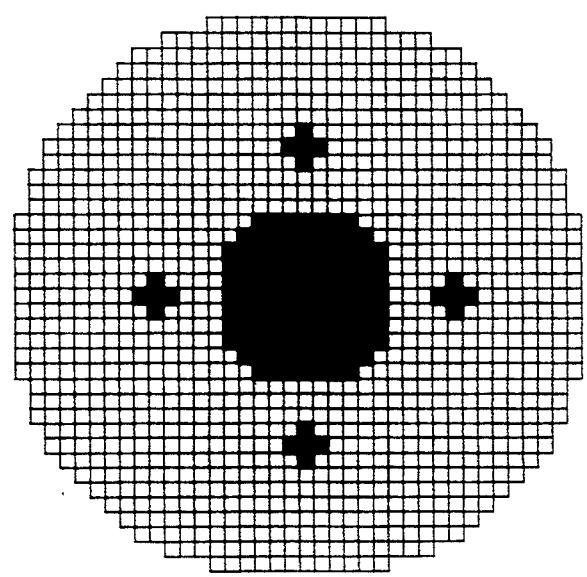

As seen from FIG. 30B, high intensity sub peaks are generated at the narrow areas between the hole areas J, by the interference of light incident from a plurality of hole areas J.

As the dispersed-point light source, in addition to the light source shown in FIG. 20B having dispersed points disposed in one direction, the dispersed-point light source shown in FIG. 20C having dispersed points disposed on one side of the center point, and the ellipsoid light source such as shown in FIG. 20D, may also be used.

In the case of the dispersed-point light sources shown in FIGS. 20E and 20F having dispersed points in two directions and in crossed directions, the light interference effects by the phase shifter in these directions can be weakened, considerably suppressing the intensities of sub peaks in these directions.

(5) Other phase shift masks

Other phase shift masks may be used, such as a multistage type, an auxiliary pattern type, and a shifter light type. Also in these examples, the light sources shown in FIGS. 20A to 20F may be used.

The light sources shown in FIGS. 20A to 20F can be realized by mounting a shutter on a fly eye lens. For example, the light sources shown in FIGS. 20A to 20F can be realized by the shutters having cell matrices shown in FIGS. 31A to 31F.

As described above, one of the stripe light source, dispersed-point light source, and ellipsoid light source suitable for the pattern of the phase shift mask is selected, and light from the light source is expanded in the direction of reducing the light interference by the phase shift mask or in the direction in which the reduction of the light interference gives no problem. In this manner, the light interference can be suppressed in the predetermined direction, and the light illuminance can be increased in the other direction, thereby keeping tile advantages of the phase shift alive.

The resolution and the depth of focus can therefore be improved considerably as compared to a conventional point light source.

The performance of an exposure system can be simulated by calculating the light intensity distribution near an image plane through ray tracing. If the number of light rays is increased, the calculation precision can be improved, but the amount of calculations increases correspondingly. It is known that there are fine areas which can be considered optically equivalent, even if interference or the like of light rays is taken into consideration. If a subject is treated as an aggregation of such fine areas, automatic design can be made easier.

Figure 32:
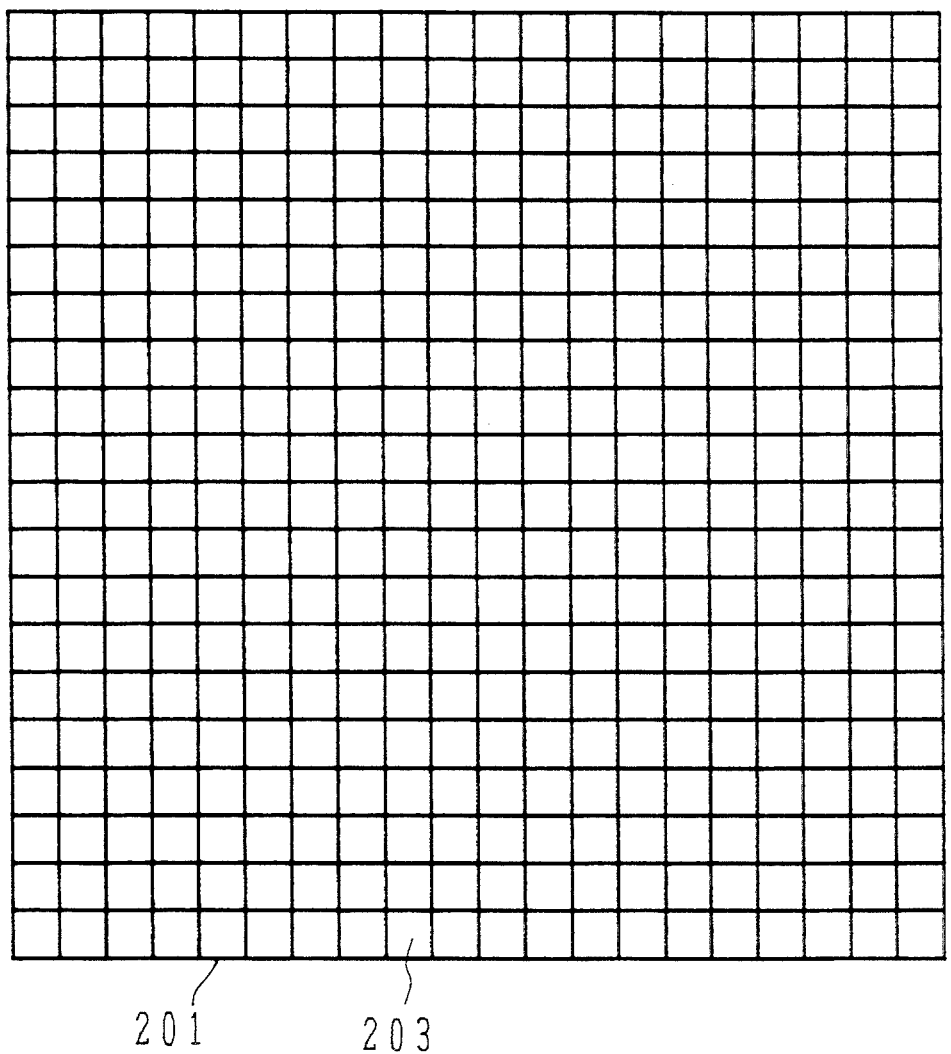
FIG. 32 is a schematic plan view showing the fundamental structure of an exposure mask according to an embodiment of the present invention.

FIG. 32 shows the fundamental structure of an exposure mask according to an embodiment of the present invention. The mask 201 is made of a number of cell areas 203 of a square shape for example. An optimum exposure beam transmission characteristic is set to each cell area 203. For example, one of two states of light transmission and light interception may be used as the exposure beam transmission characteristics, and set to each cell area 203. Optimization of a mask pattern can be proceeded rationally by defining the mask pattern by finite elements. Each cell area 203 has preferably a side length of 0.001 to 1 $\mu$m although this length depends on a device pattern and an exposure beam wavelength.

Instead of using two states of light transmission and light interception as the exposure beam transmission characteristics of each cell area 203, a plurality of transmission states with different phases may be used. In this case, a mask pattern having a phase difference such as a phase shift reticle can be designed.

Figure 33A:
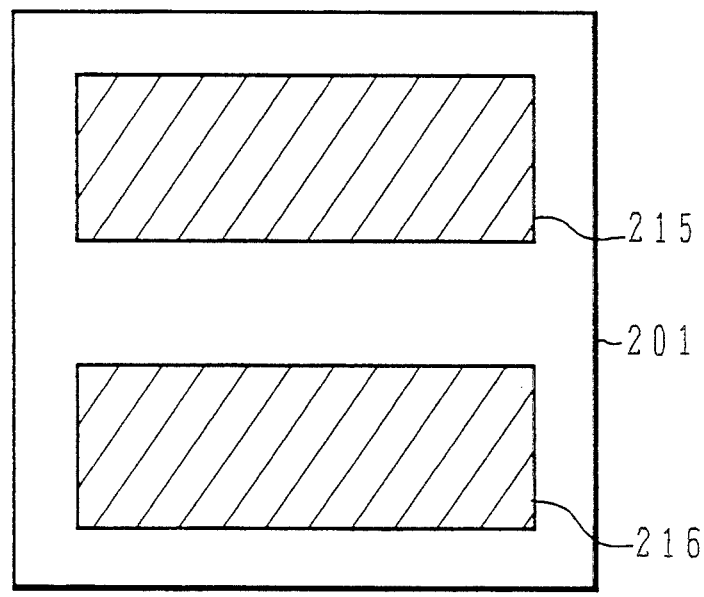
FIGS. 33A is a plan view of a mask according to a conventional technique.
Figure 33B:
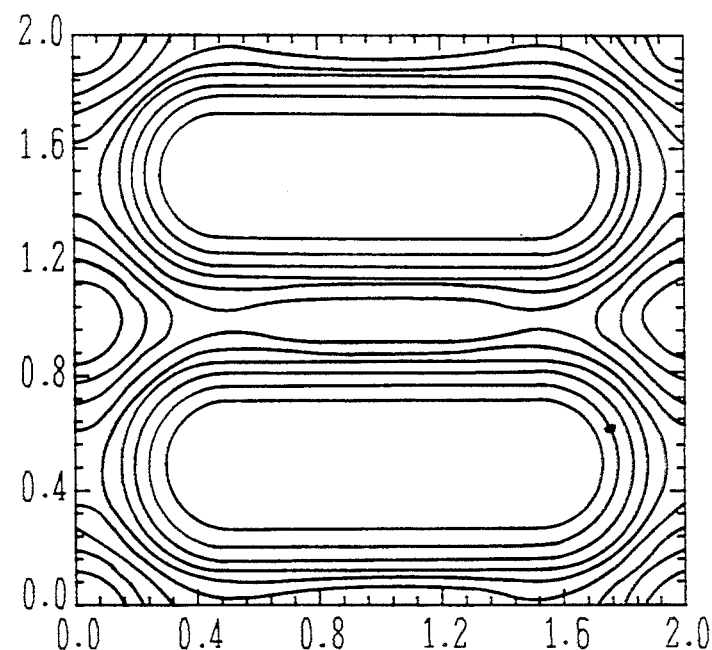
FIG. 33B is graph showing the light intensity distribution on the image plane obtained by the mask shown in FIG. 33A.

For the comparison purpose, an example of a mask pattern according to a conventional technique will be described. FIGS. 33A and 33B show an example of a conventional mask and its intensity distribution on an image plane. This mask 201 has two patterns 215 and 216 generally at the central area of the mask.

These patterns 215 and 216 have the shapes in proportion to those to be formed on the image plane. For example, the patterns have the shapes of the device patterns enlarged at five to ten times magnification. The sizes of, and distances between, the patterns 215 and 216 on the image plane are in the order of the wavelength of the light beam to be used.

In such a case, light waves passed through the mask and focussed on the image plane diffract and interfere with each other so that the light intensity distribution on the image plane does not correspond to the shapes of the patterns 215 and 216 of the mask 201.

It is assumed that the mask 201 shown in FIG. 33A is a 2.0 μm, 2.0 μm square, and the patterns 215 and 216 each have a size of 1.6 μm, 0.6 μm and are focussed on the image plane by using the optical system having the numerical aperture NA=0.5 and wavelength WL=0.365 μm.

FIG. 33B shows the light intensity distribution when the optical system focusses the mask patterns right on the image plane. Curves in FIG. 33B are contour lines of the light intensity distribution.

Figure 34A:
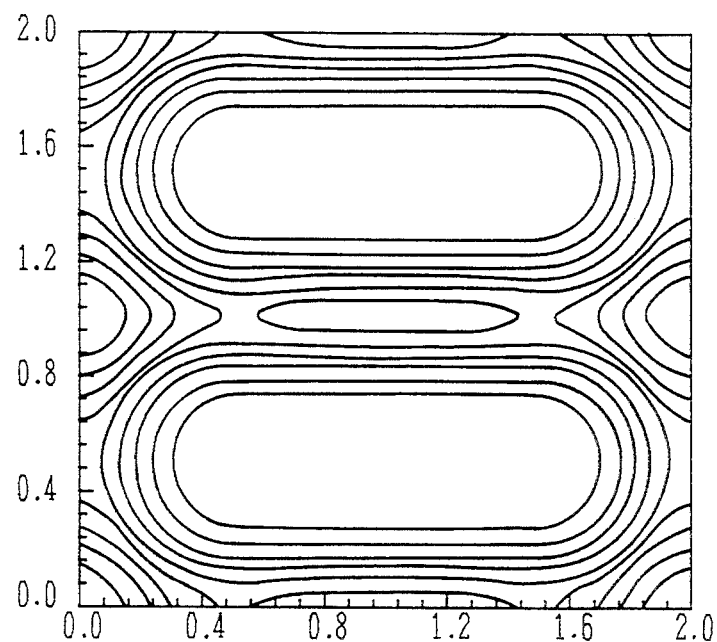
FIGS. 34A and 34B awe graphs showing the light intensity distributions on the defocus planes obtained by the mask shown in FIG. 33A.
Figure 34B:
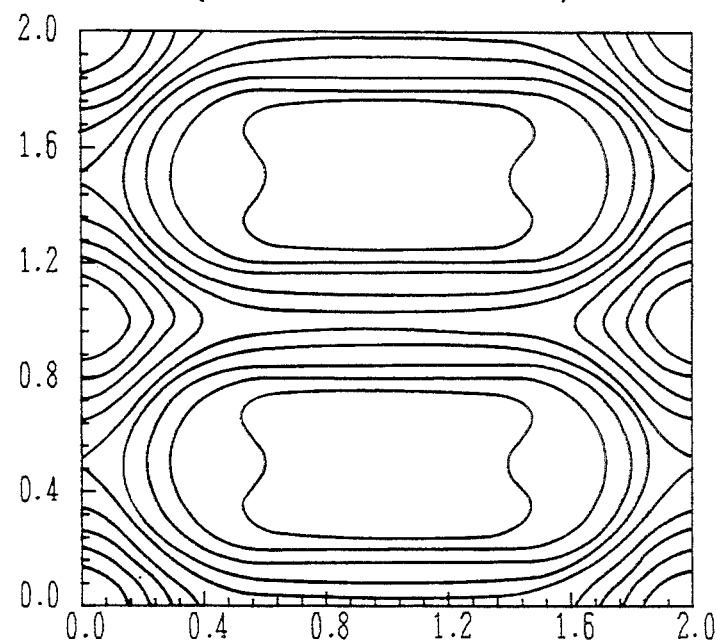

FIGS. 34A and 34B show the light intensity distributions on the image plane when the mask of FIG. 33A and the above-described optical system are used to focus the patterns at the planes higher by 0.25 μm and lower by 0.5 μm than the image plane.

As seen from FIGS. 33B, 34A and 34B, the corners of the patterns 215 and 216 of the mask 201 are rounded and the contrast in the areas of the patterns 215 and 216 is degraded. At the degree of defocus becomes greater, the contrast in the areas of the patterns 215 and 216 is degraded further.

In the semiconductor manufacturing process, if light is exposed in the manner described with FIGS. 33A, 33B, 34A, and 33B on the resist mask coated on the surface of a semiconductor wafer, desired patterns cannot be obtained, but the corners of the patterns are rounded and adjacent patterns may be mixed.

Figure 35A:
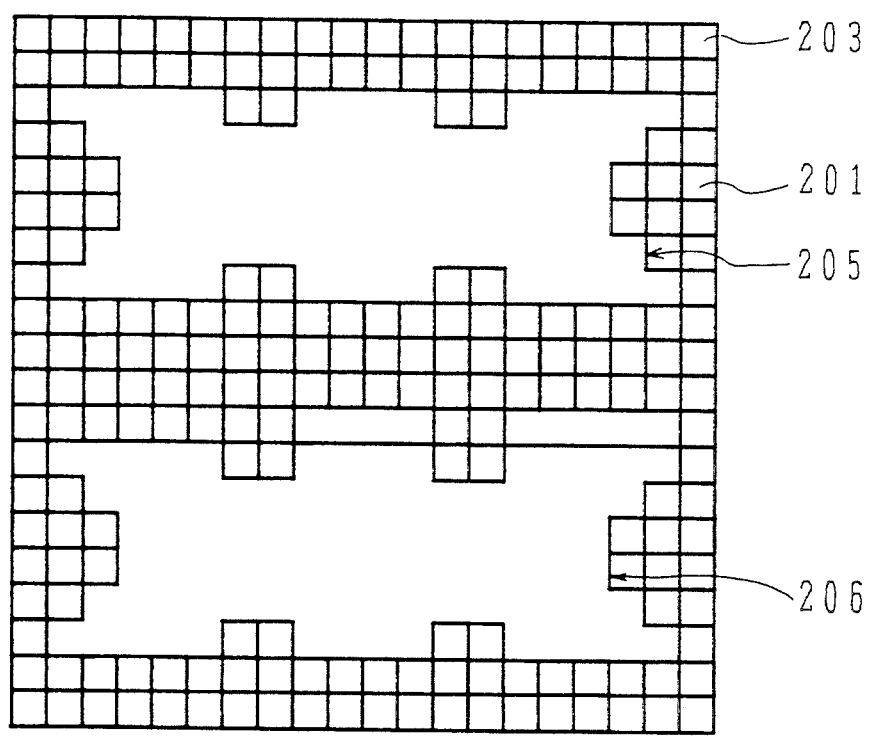
FIGS. 35A is a plan view of a mask according to an embodiment of the present invention.
Figure 35B:
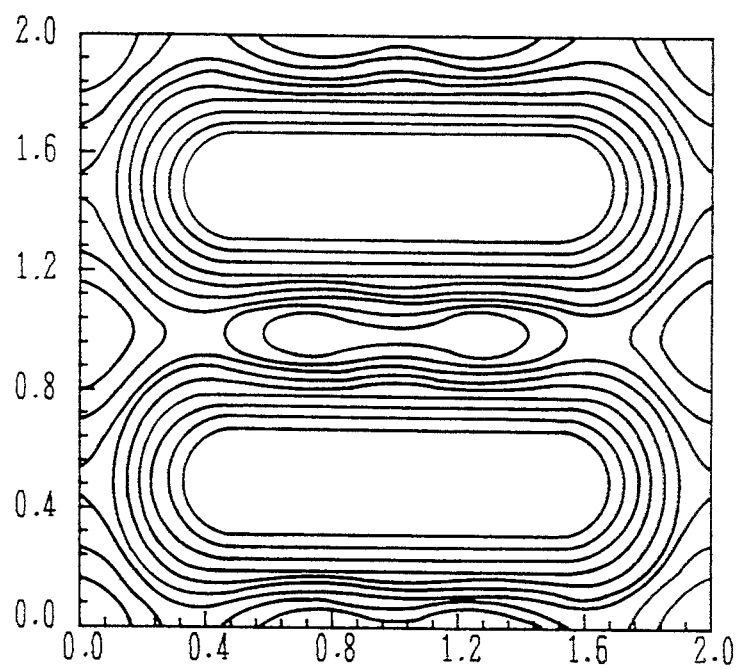
FIG. 35B is graph showing the light intensity distribution on the image plane obtained by the mask shown in FIG. 35A.

FIGS. 35A and 35B illustrate a mask according to an embodiment of the present invention. The mask 201 shown in FIG. 35A has a number of cell areas 203 and is formed with light transmission patterns 205 and 206.

The mask 201 has a size of 2 μm * 2 μm on the image plane similar to the mask shown in FIG. 33A, and each cell area 203 is a 0.1 μm, 0.1 μm square on tile image plane. The light transmission characteristic is set uniformly over the whole area of each cell area 203. The cell areas in the light transmission patterns 205 and 206 are set to the light transmission state, and the other cell areas are set to the light interception state.

The mask shown in FIG. 35A is used for exposing rectangular patterns. The shape of each pattern is not a rectangle, but tile areas at the corners are extended outward, and projecting areas are formed on the longer sides of the rectangle.

Figure 36A:
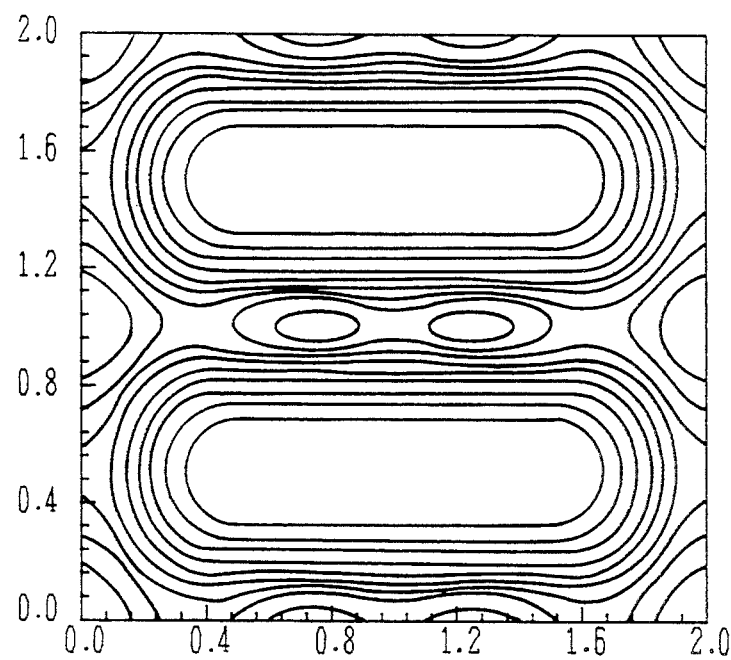
FIGS. 36A and 36B are graphs showing the light intensity distributions on the defocus planes obtained by the mask shown in FIG. 35A.
Figure 36B:
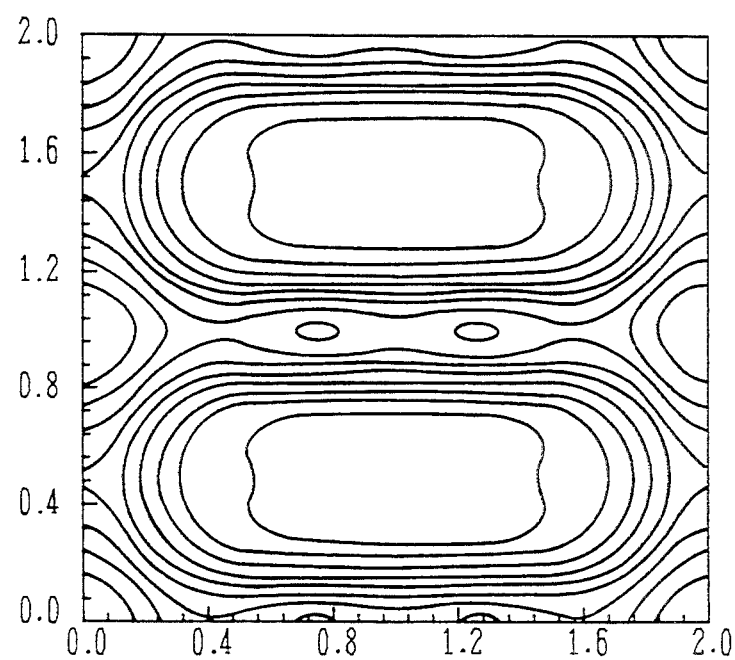

FIGS. 35B, 36A, and 36B are diagrams showing the light intensity distributions on the image plane when the patterns are exposed by using the mask shown in FIG. 35A and the optical system having the numerical aperture NA=0.5 and the exposure light wavelength WL=0.365 μm. The light intensity distribution shown in FIG. 35B was obtained by focussing the patterns of the mask 301 right on the image plane. The light intensity distributions shown in FIGS. 36A and 36B were obtained by focussing the patterns of the mask 201 on the planes higher by 0.25 μm and lower by 0.5 μm than the image plane.

As compared to the patterns same as the designed device patterns of the mask described with FIG. 33A, the patterns of this embodiment provide the light intensity distribution more like objective rectangular patterns. In addition, a number of contours are formed in the area of the patterns 205 and 206, providing a better contrast.

Next, a process of designing a mask pattern will be described which can expose a desired pattern on the image plane by using the mask having the fundamental structure shown in FIG. 32.

FIG. 37 is a flow chart illustratively explaining a mask designing process.

At Step S1, a mask is divided to form a mesh. The configuration of divided cell areas is assumed to be a configuration of genes of an individual. For example, as shown in FIG. 32, the mask 201 is divided into a number of cell areas 203, and each divided cell area 203 is assumed to be a gene. The configuration of genes determines an inherited character of an individual.

The light intensity distribution on the image plane formed by the mask 201 is assumed to be the character of an individual. The individual includes the mask 201 and the light intensity distribution formed by the mask 201.

At Step S2, m children mutated from a parent of an initial configuration are asexually generated. For example, if the design patterns are the patterns 215 and 216 shown in FIG. 33A, these design patterns are used as the initial configuration. A mask with a phase shifter or a phase shift mask pattern whose size has been adjusted as in the embodiments described before, may also be used. The mutated child is represented by a mask newly generated by reversing the states of optional cell areas 203. The optional cell areas are determined by using random numbers designating coordinates (x, y), wherein x represents a coordinate of the X axis of the mask 201, and y represents a coordinate of the Y axis. Mutation may be performed by any other method so long as it can change the state of each cell area selected randomly to a desired state.

After generating m children, m grandchildren are generated by each of m children. In this case, because there are a plurality of children, each grandchild may be generated by mating or mutation.

In the case of mating, a partner is selected and the logical calculations such as AND, OR, and NOT are executed between a child and a partner child to determine the light transmission state of each cell of a mask to be newly generated.

In selecting mating or mutation, random numbers may be used. For example, by using random numbers, one of AND mating, OR mating, and mutation is selected to determine the light transmission state of each cell area of a mask to be newly generated.

At Step S4, individuals having inherited superior characters are selected from a number of generated individuals and the remaining individuals are weeded out, because it takes a very long time to calculate a number of individuals.

Specifically, the characters of m * m grandchildren generated from m children, i.e., the light intensity distributions, are simulated and compared with the environmental restriction conditions, i.e., the ideal light intensity distribution corresponding to a desired pattern. In this manner, only m individuals having superior characters are selected and the remaining individuals are weeded out.

A photoresist film of a semiconductor device or the like is not always formed on a flat surface. The light intensity distribution at the defocus plane becomes significant if a photoresist film formed on a stepped surface is exposed. Therefore, the light intensity distributions at the focus plane and defocus plane are calculated, if necessary, and compared with the ideal light intensity distribution.

The judgment whether the character is superior (dominant) or inferior (recessive) is performed, for example, by sampling the cell areas where the most important light intensity distribution locate, and by integrating the weighted shifts from the ideal light intensity distribution to obtain an energy E. The smaller the energy E, the more the character is superior (dominant). In this way, m individuals having inherited superior characters are selected from m * m individuals.

At Step S5, Steps S3 and S4 are repeated until all survived individuals converge to take generally homogeneous genes. An individual having such configuration of genes is used as a best individual.

With the above procedure, a device pattern such as shown in FIG. 35A can be obtained basing upon the design pattern shown in FIG. 33A. In order to converge the process explained in FIG. 37 quickly, it is preferable to adopt an abortion process at Step S3.

Figure 38:
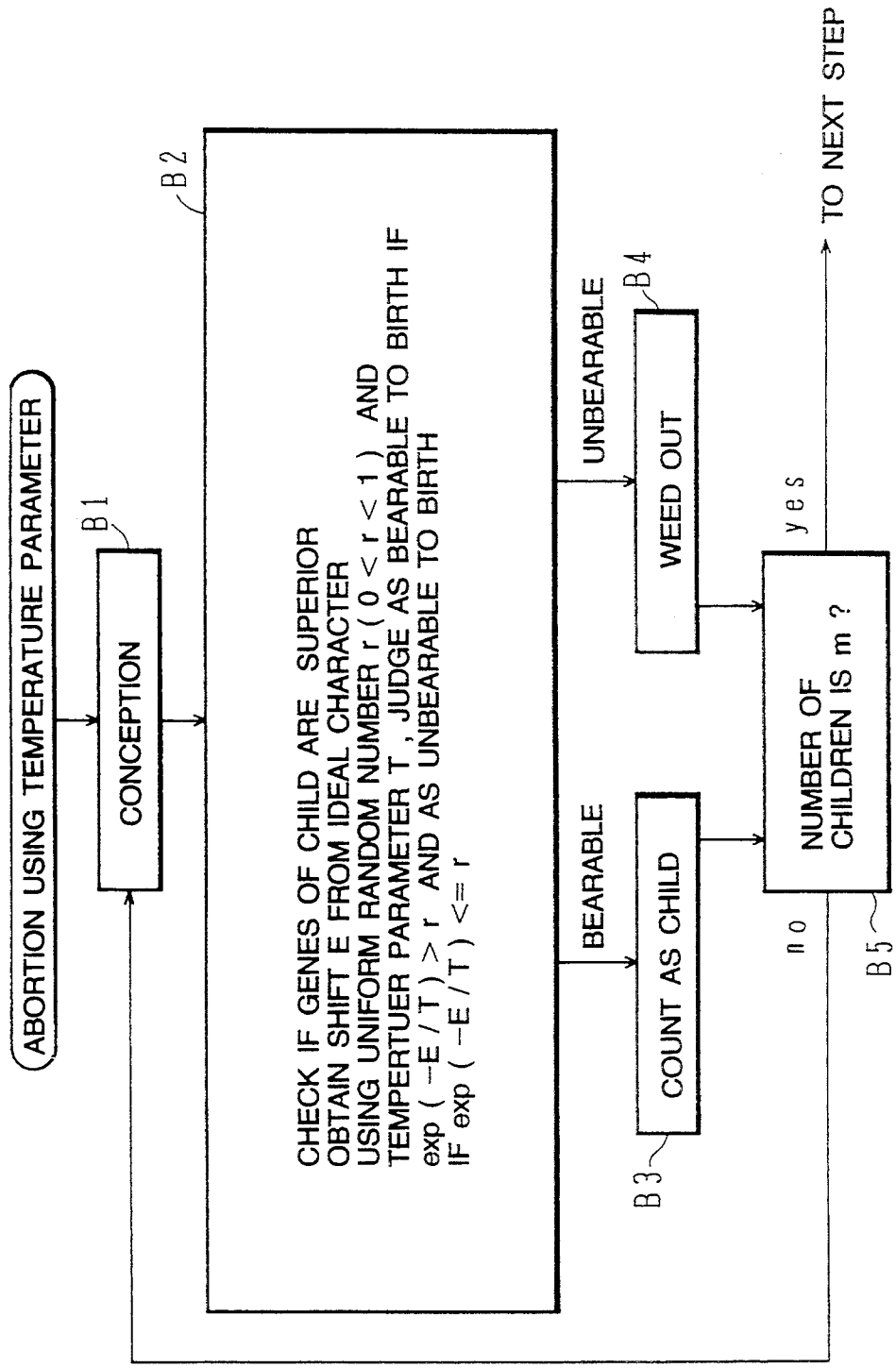
FIG. 38 is a flow chart explaining the abortion process using a temperature parameter.

FIG. 38 is a flow chart explaining the abortion process using a temperature parameter T which is a threshold value for judging whether the temperature is suitable for an individual to survive.

In generating a new individual, either a mating partner is identified or mutation is performed for the conception at Step B1. Although a new individual is identified by the conception, prior to giving a birth, it is checked at Step B2 whether the new child has superior genes. Specifically, the light intensity distribution (character) of the new child is simulated and the shift E from the ideal character is calculated. The degree of superiority of a character is expressed by exp(-E/T). As the judgement criterion, a uniform random number r is used. Namely, if exp(-E/T)>r, it is judged that the child has a character bearable to birth, whereas if exp(-E/T)<r or =r, it is judged that the child has a character unbearable to birth.

If it is judged that the child has a character bearable to birth, the child is counted as a new individual at Step B3.

On the other hand, if it is judged that the child has a character unbearable to birth, the child is weeded out at Step B4. The character of a new individual is judged in the above manner, to weed out (abort) the individual with an inferior character and to generate (give birth to) only an individual with a superior character.

After Steps B3 and B4, it is checked at Step B5 whether the number of generated children is m. If not still m, the control returns to Step B1 following a "no" arrow for the next conception. If m, the control follows a "yes" arrow to execute the next Step.

In the above manner, at Step S3 of FIG. 37, m grandchildren are generated from each of m children and the character of each new individual is judged to weed out an individual with an inferior character. Therefore, it is possible to use individuals having homogeneous and superior characters at next Step S4. With such a selection explained in the flow chart of FIG. 37, the convergence of the process can be enhanced.

At Step B2 of FIG. 38 whereat the genes are judged if they are superior or inferior, the shift E from the ideal character is not necessarily calculated for the whole area of the mask.

For example, in the case of a contact hole pattern, it is important that the hole is reliably formed at the center of the hole pattern, and the peripheral shape of the hole is allowed to be deformed more or less. In such a case, the character of an individual may be judged only at the central area of the hole pattern.

In the case of a capacitor electrode or the like of a semiconductor memory cell, the area of the capacitor electrode has a significant meaning. In such a case, the character of an individual may be judged by sampling cell areas at the pattern peripheral area.

It is preferable to set the temperature parameter T to a relatively high value at Step B2 at the initial stage of the process and gradually to a low value as the calculation progresses. If the temperature parameter T is set to a low value, an individual having a comparably large shift is also weeded out, promoting the convergence. If the temperature parameter is set to a low value at the initial stage of the process, a local solution may occur.

Figure 39A:
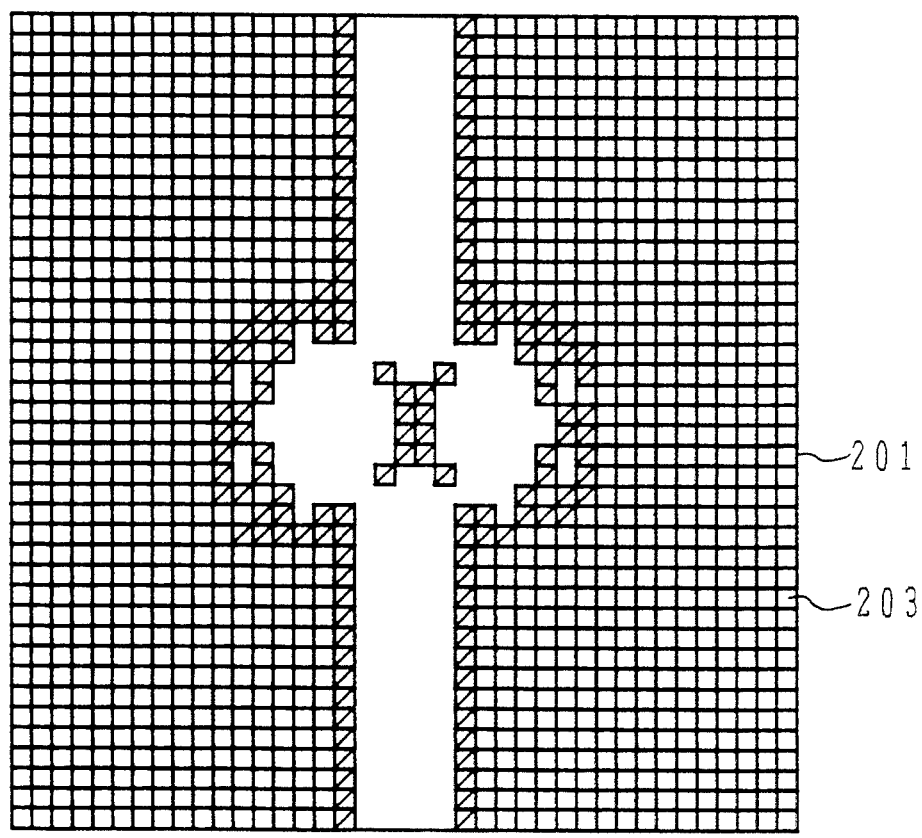
FIGS. 39A is a plan view of a mask according to an embodiment of the present invention.
Figure 39B:
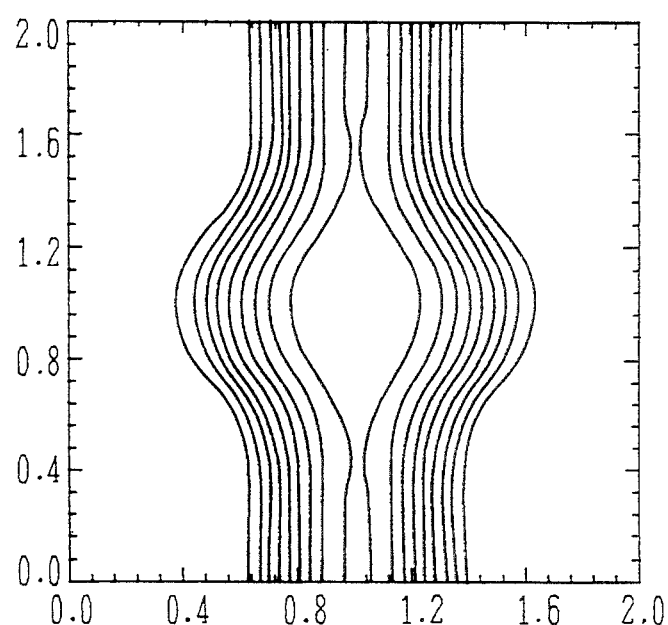
FIG. 39B is graph showing the light intensity distribution on the image plane obtained by the mask shown in FIG. 39A.

FIGS. 39A and 39B illustrate an example of a mask according to another embodiment of the present invention. FIGS. 39A is a plan view showing a pattern of the mask, and FIG. 39B shows the light intensity distribution on the focus plane obtained by the mask shown in FIG. 39A.

Figure 40A:
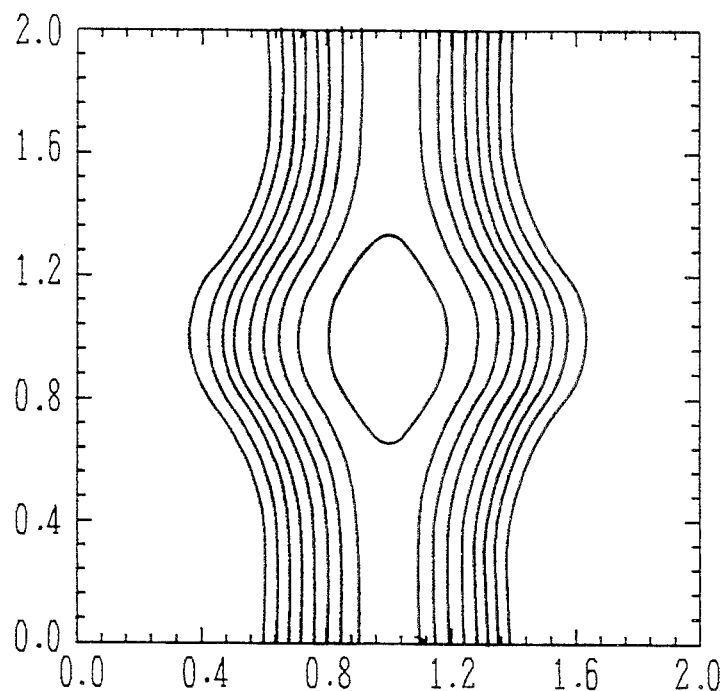
FIGS. 40A and 40B are graphs showing the light intensity distributions on the defocus planes obtained by the mask shown in FIG. 39A.
Figure 40B:
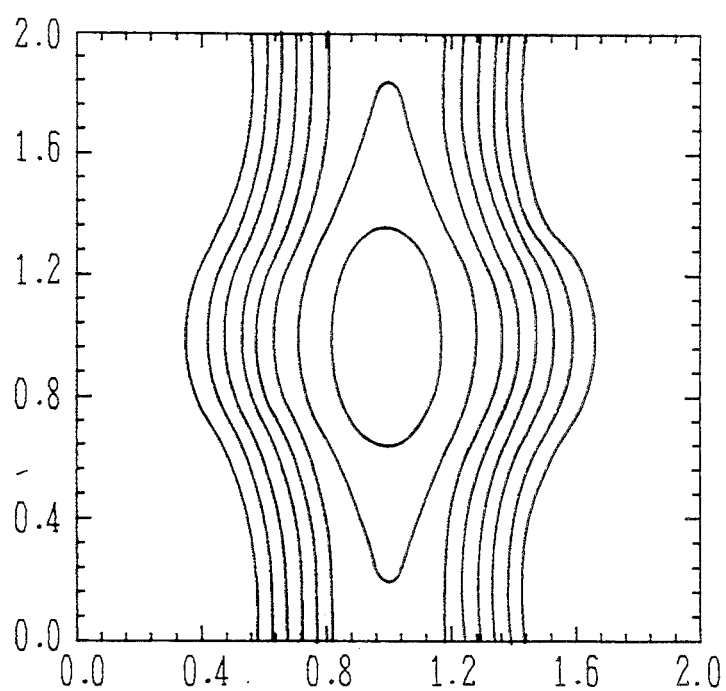

FIGS. 40A and 40B are light intensity distributions at the defocus planes 0.25 μm higher and 0.5 μm lower than the focus plane.

Similar to the mask of the embodiment described previously, the mask 201 shown in FIG. 39A has a size of 2.0 μm * 2.0 μm on the image plane, and each cell area 203 is a square of 0.05 μm, 0.05 μm.

In the mask pattern shown in FIG. 39A, light interception areas are partially located at the central area, and light interception and transmission areas are mixed and distributed at the circumferential area.

The mask pattern shown in FIG. 39A was focussed on the image plane by using the optical system having a numerical aperture NA=0.5 and the exposure wavelength WL=0.365.

With this mask, the light intensity distributions on the image plane had generally a uniform light intensity and a high contrast at the central area.

For the comparison purpose, the mask and light intensity distributions according to a conventional technique are shown in FIGS. 41A, 41B, 42A, and 42B, which correspond to FIGS. 39A, 39B, 40A, and 40B, respectively.

Figure 41A:
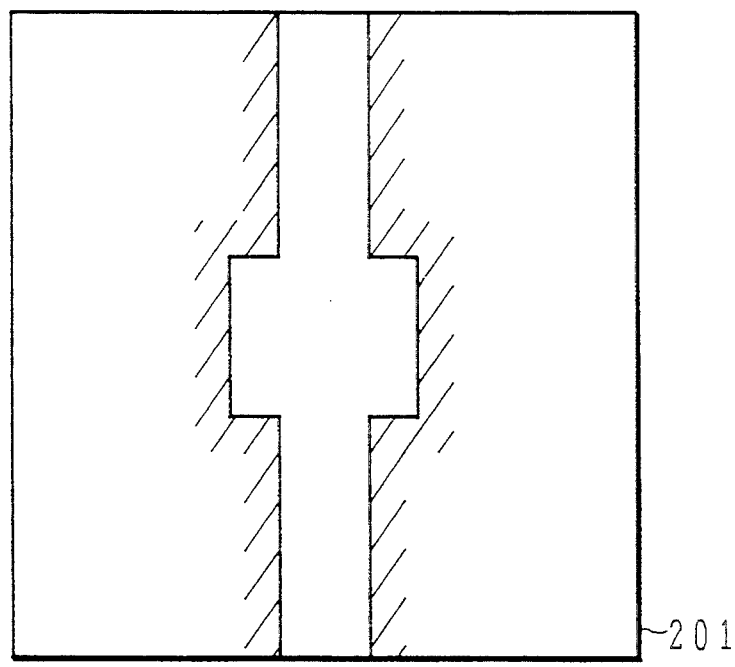
FIGS. 41A is a plan view of a mask according to a conventional technique.

FIG. 41A shows a mask having the shape corresponding to a design pattern to be focussed on the image plane. This pattern is formed by a stripe having a width of 0.3 μm and a square of 0.5 μm, 0.5 μm superposed on the stripe. With the pattern same as the design pattern, the light intensity distributions on the planes are shown in FIGS. 41B, 42A, and 42B.

Figure 41B:
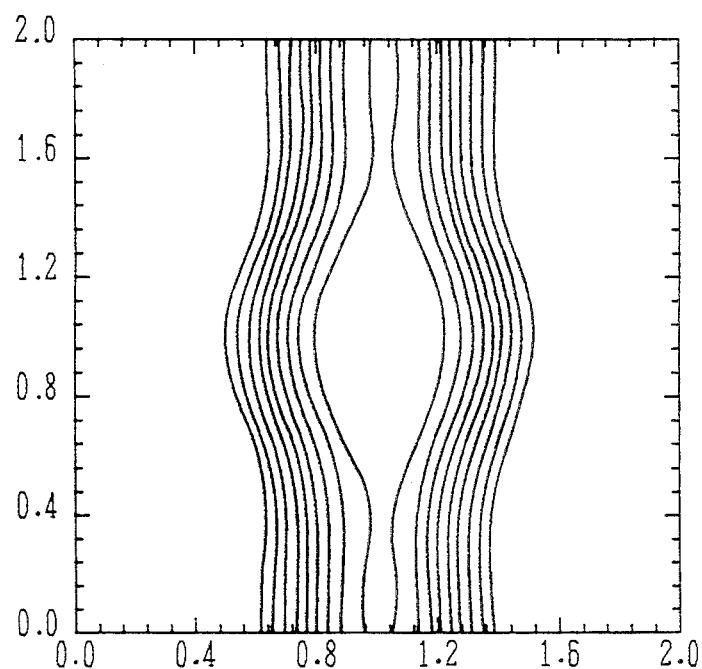
FIG. 41B is graph showing the light intensity distribution on the image plane obtained by the mask shown in FIG. 41A.
Figure 42A:
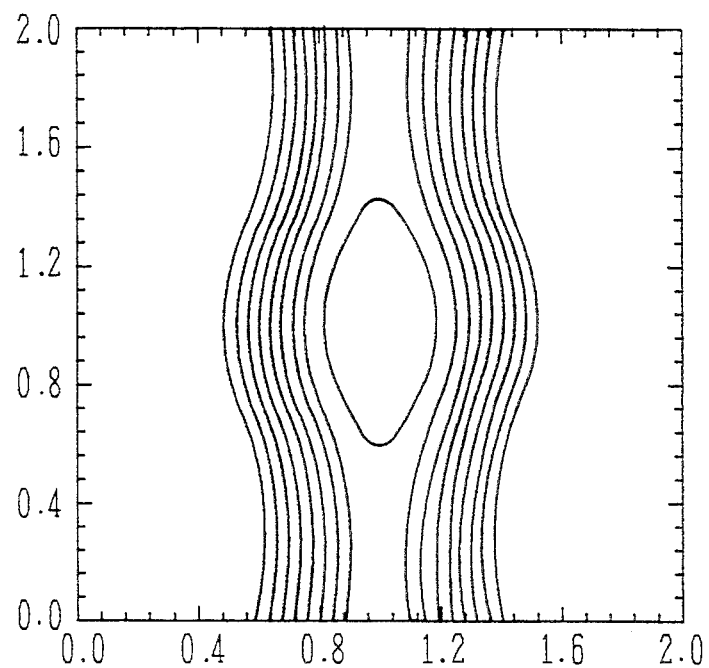
FIGS. 42A and 42B are graphs showing the light intensity distributions on the defocus planes obtained by the mask shown in FIG. 41A.
Figure 42B:
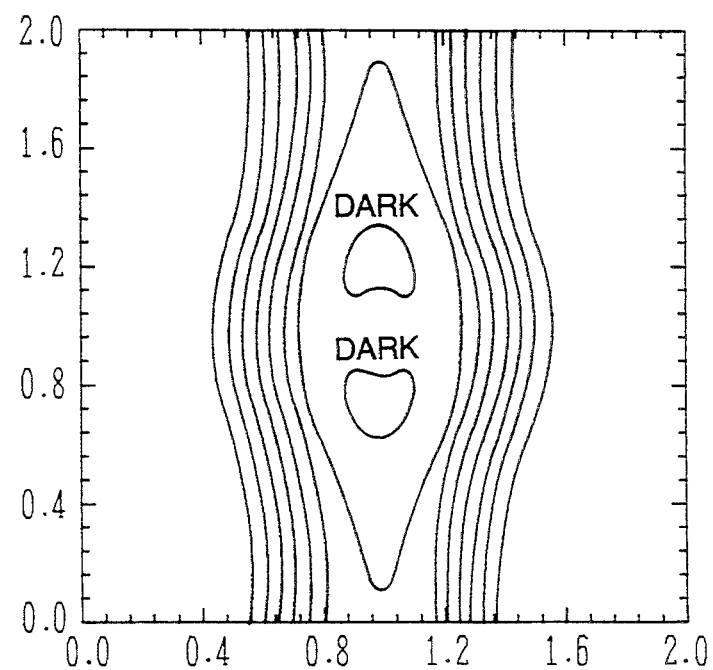

FIG. 41B shows the light intensity distribution on the focus image plane, and FIGS. 42A and 42B show the light intensity distributions on the defocus planes 0.25 μm higher and 0.50 μm lower than the focus image plane.

Irrespective of the square pattern of the mask shown in FIG. 41A, all the light intensity distributions shown in FIGS. 41B, 42A, and 42B have round corners and narrow central areas where the light intensity distribution is flat. The light intensity distribution shown in FIG. 42B has low light intensity areas at the central area of the pattern.

As above, the mask shown in FIG. 39A having the shape different from the desired pattern shown in FIG. 41A can provide a highly precise exposure.

As described in the above, a mask is divided into a number of cell areas, each cell area is set with a particular light transmission state, and individuals having superior characters are selected and converged in accordance with an inheritance algorithm, to thereby allow an optimum pattern to be obtained.

In the above description, light exposure has been described by way of example. The exposure beam is not limited to only a light beam so long as it has a wave motion. However, the above embodiments are excellent particularly in using light having a wavelength easy to design the optical system and in correcting the deformation of the focussed pattern to be caused by light diffraction and interference.

The shape of a cell area dividing a mask is not limited to a square, but other shapes may be used if they can divide the whole area of a mask uniformly.

In the above description, optimizing the pattern of a mask has been described. The same method may be used in optimizing the pattern of a light source. For example, in the case where a shutter is provided to each unit lens of a fly eye lens, each unit lens is used as a cell. The light source pattern suitable for focussing an optimum image relative to a subject mask pattern can be obtained by using the inheritance process like that described above.

In the optical systems described above, the mask has been set perpendicular to the optical axis. Recently, an oblique incidence optical system has been proposed in which the optical axis is set oblique to the mask.

Figure 43:
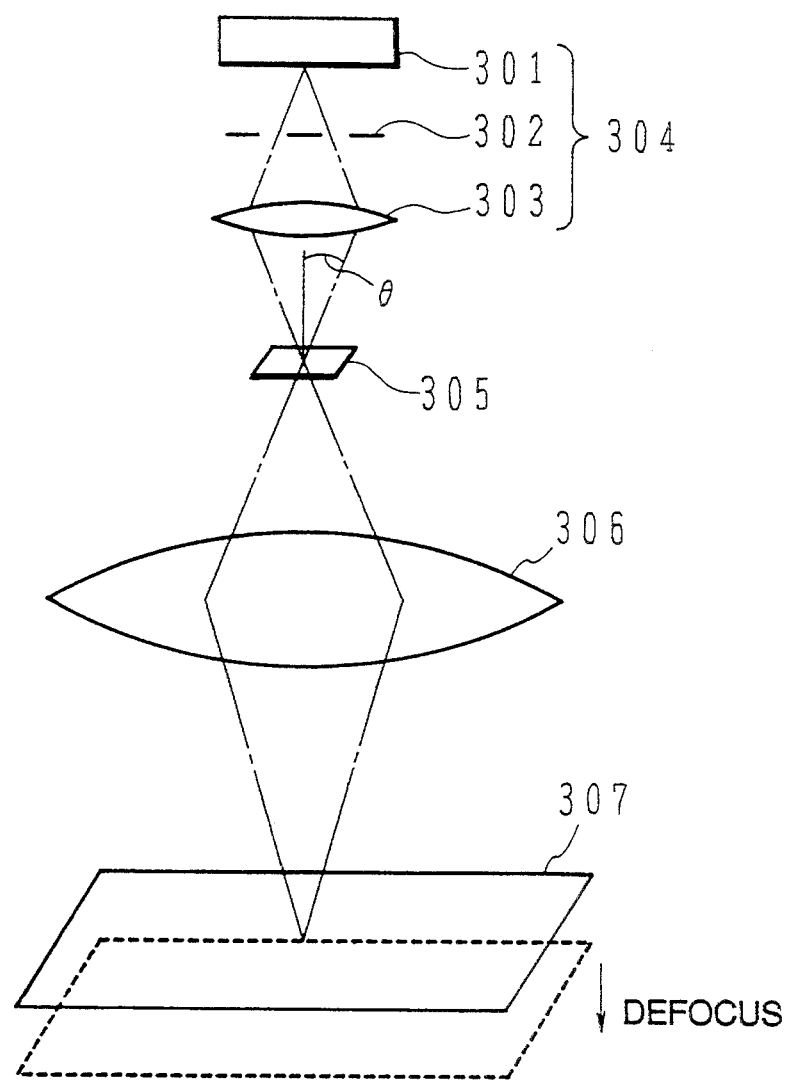
FIG. 43 is a schematic diagram showing a light exposure unit.
Figure 44:
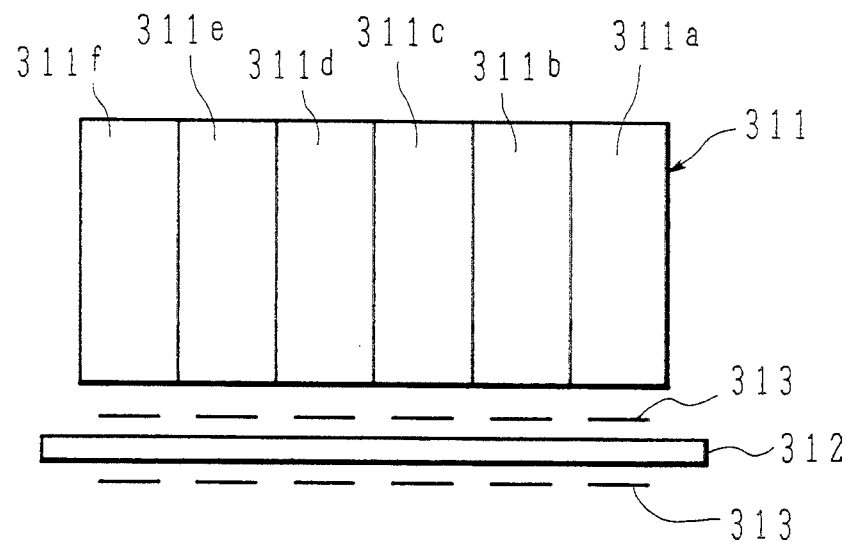
FIG. 44 is a schematic cross section showing a fly eye lens and an aperture stop made of a liquid crystal panel.

FIG. 43 is a schematic diagram of a light exposure unit (stepper) which is formed by: a modified illumination system 304 having a light source 301 such as a mercury lamp or an excimer laser, an aperture stop with a transparent hole, and a condenser lens 303; a photomask or reticle 305 having a predetermined pattern; a projecting lens 306; and a resist film (projection plane) 307 coated on a substrate. In this modified illumination system 304, the position of an aperture stop 302 is displaced from tile optical axis, and light incident to the photomask is oblique. In an ordinary optical system, the position of the transparent hole of an aperture stop is aligned with the optical axis, and light incident to the photomask is vertical. A compound eye condenser lens (fly eye lens) such as shown in FIG. 44 may be provided between the light source and aperture stop.

Figure 45:
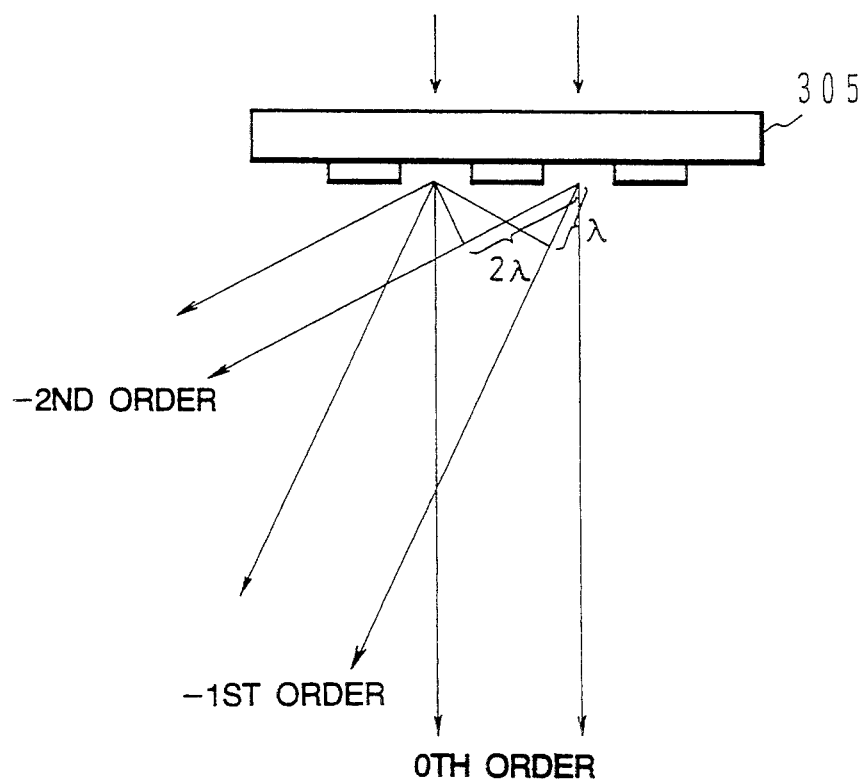
FIG. 45 is a schematic diagram showing diffraction light beams of light applied to a photomask in the vertical direction.
Figure 46:
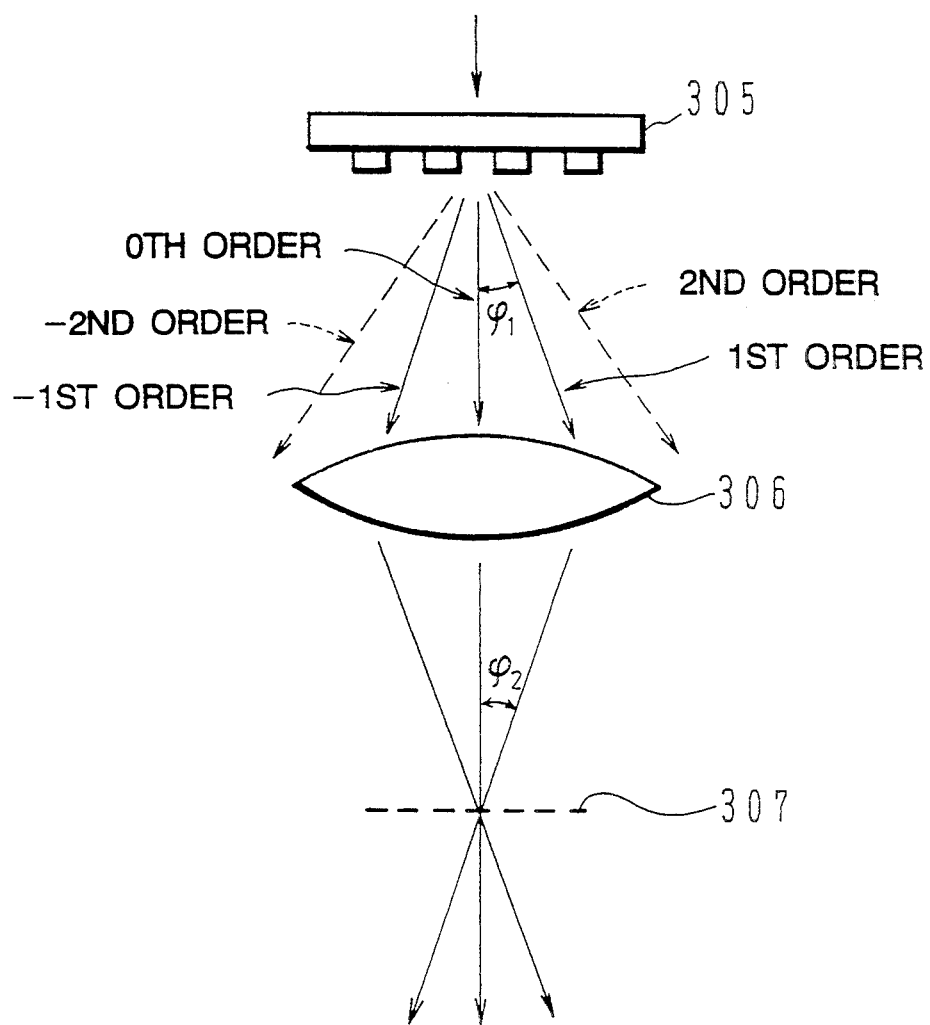
FIG. 46 is a schematic diagram showing part of a light exposure unit in which light is applied to a photomask in the vertical direction.

The shape of light from the light source is fixed by the shape of the transparent hole of the aperture stop in the case of the system shown in FIG. 43. In the case of a fly eye lens, unit eyes may be disposed to determine the shape of light radiated from a light source. If the shape is to be changed with each different application and an aperture stop is used, a suitable aperture stop having a particular shape of a transparent hole may be used. Alternatively, respective unit eyes 311a to 311f are provided with shutter mechanisms. For example, a liquid crystal panel 312 is disposed at the light inlet or outlet side of the fly eye, and each unit eye is provided with a pair of electrodes 313 to apply a voltage and control light transmission and interception. In an ordinary light exposure technique, as shown in FIG. 45, light is applied from the back of the photomask 305 to the mask 305 in the vertical direction, and light beams diffracted by the mask 305 are converged as shown in FIG. 46 by the projection optical system (projecting lens) 306 to focus the pattern on the projection plane (corresponding to the resist film) 307. In FIG. 45, only 0th, −1st, and −2nd order diffraction light waves are shown, and +1st and +2nd order diffraction light waves are omitted. As illustrated in FIG. 46, the relationship between a diffraction light wave of diffraction angle $\phi_1$ and the light wave passed through a projection optical system and focused at an angle $\phi_2$ is given by:

$$R*\phi_1=\phi_2,$$

where R is a reduction factor of the projection optical system. In the following, the reduction factor is assumed to be R=1 (equal magnification) since it is not relevant to the gist of the present embodiment.

With a light exposure technique, it is important to improve the resolution by setting the numerical aperture NA of a lens high and shortening the wavelength of a light source. However, as NA increases, the depth of focus reduces. In this context, a modified illuminating method (oblique incidence illuminating method) has drawn attention recently.

As the shapes of a transparent hole of an aperture stop to be used by the modified illuminating method, there are known a ring transparent hole, and point-symmetrical four transparent holes. In the conventional illuminating method, illuminating light is vertically incident to the photomask or reticle from the circular transparent hole aligned with the optical axis of an exposure unit.

Figure 47:
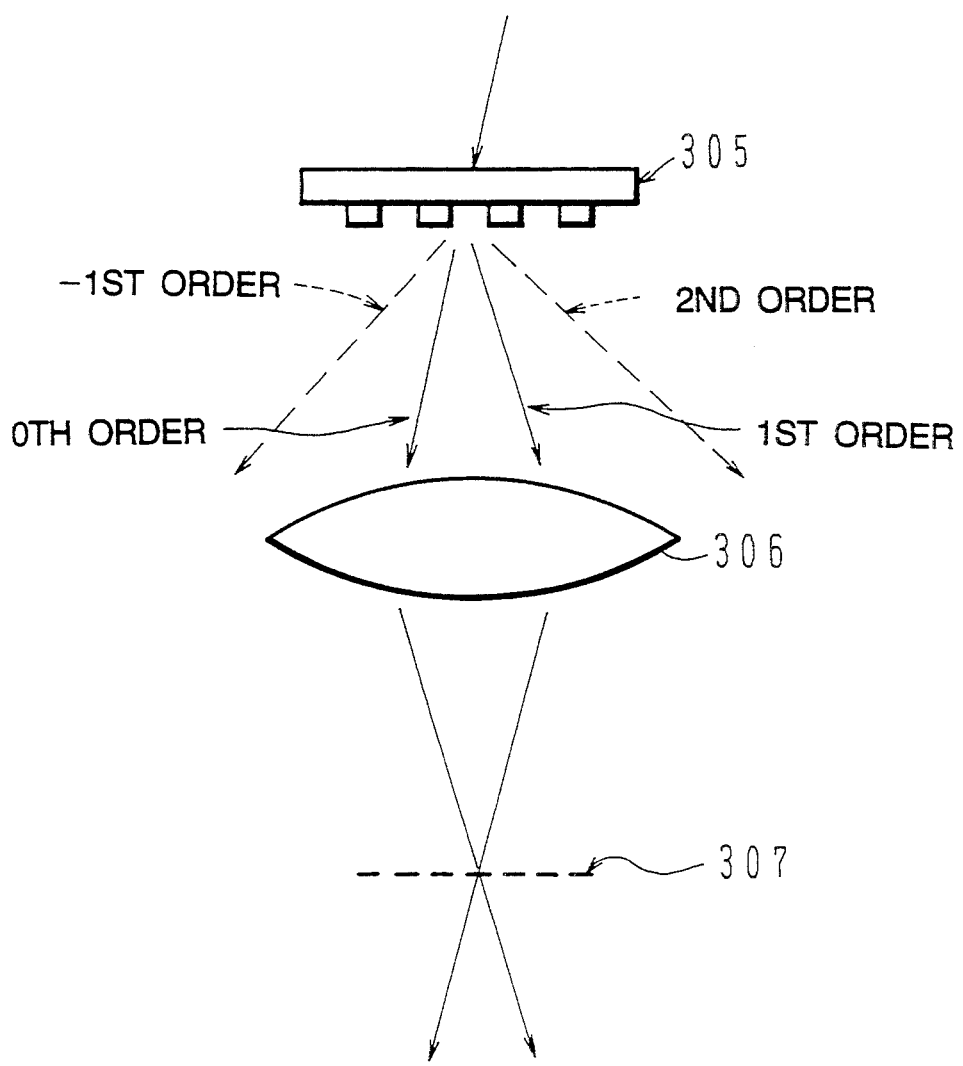
FIG. 47 is a schematic diagram showing part of a light exposure unit in which light is applied obliquely to a photomask.

Basically, as shown in FIG. 46 three light beams from the photomask including 0th, +1st, and −1st order light beams are focussed. In the modified illuminating method, however, the position of an aperture stop is displaced from the optical axis, and as shown in FIG. 47 illuminating light from the transparent hole is obliquely incident to the photomask. Two light beams from the photomask including 0th and +1st order (or 0th and −1st order) light beams are focussed. Although the conventional illuminating method provides a higher contrast at the focus plane, the modified illuminating method provides a higher contrast at the defocus plane, improving as a whole the depth of focus and the resolution more than the conventional method.

The embodiments of a modified oblique incidence optical system and Comparison Examples will be described in detail below.

The light exposure unit (stepper) used with the embodiments has the structure shown in FIG. 43. In the embodiments, the shape of a transparent hole of the aperture stop 302 is different from the conventional shape. The shape of light from a light source (corresponding to the shape of a transparent hole or transparent area) may be determined by using the shutter mechanism provided to each unit eye of a fly eye lens.

Figure 48:
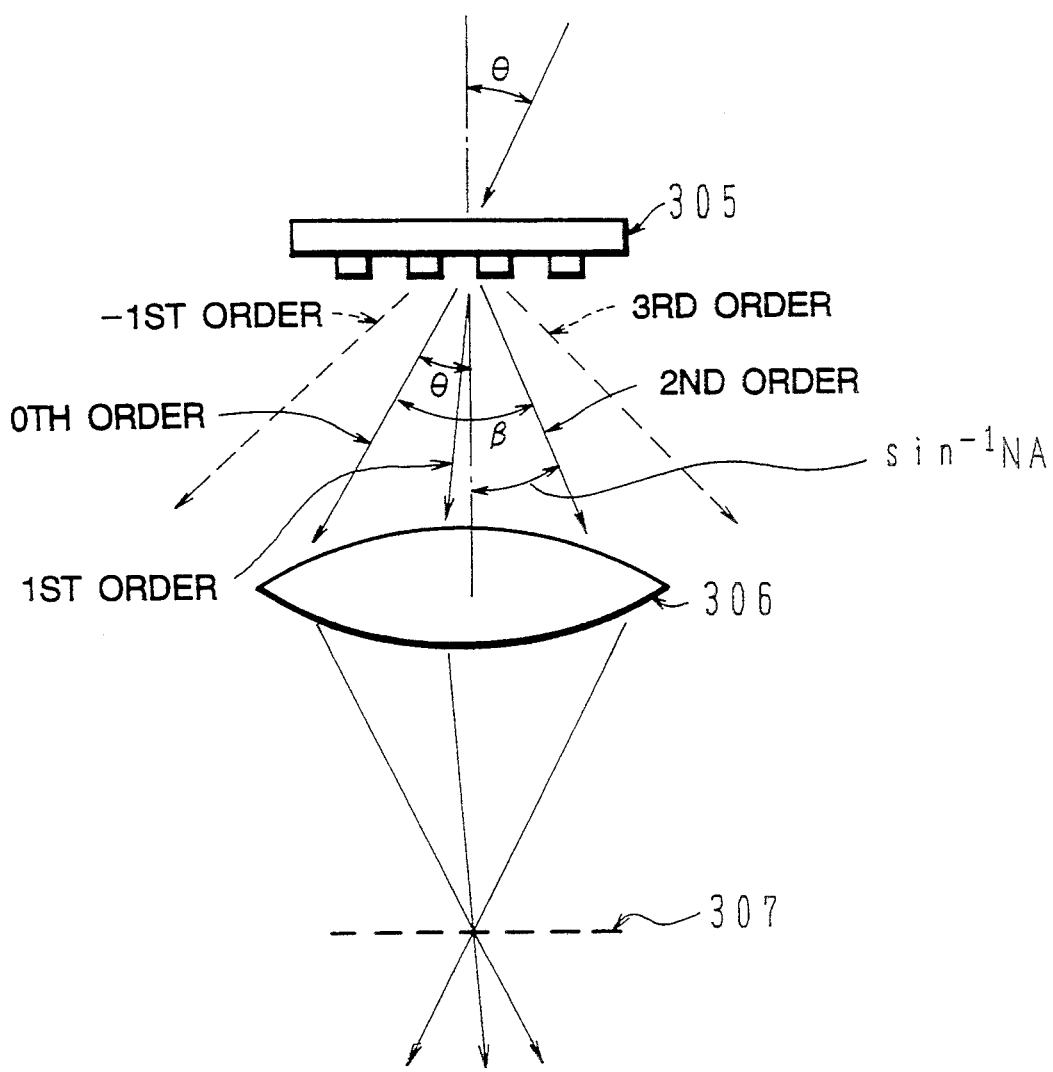
FIG. 48 is a schematic partial view showing a light exposure unit in which light is applied obliquely, according to an embodiment of the present invention.

In the light exposure method of this embodiment, an image is focussed by three light beams including 0th, 1st, and 2nd order light beams, as illustrated in FIG. 48. The incident light angle $\theta$ is accordingly set within a range of $\sin^{-1}NA >/=(> or =) R\theta >/= \sin^{-1}(2\lambda/p) - \sin^{-1}NA$. The higher order light beam is used to improve both the resolution and the depth of focus.

The numerical aperture NA of a projection lens corresponds to $\sin \theta$ where $\theta$ represents the incident light angle to the outermost circumference of the lens. The lower limit of the incident angle $\theta$ is determined by the angle of the 0th order light incident to the outermost circumference of the lens on one side. Therefore, $\sin^{-1}NA >/= \theta (R=1)$. The higher limit of the incident angle $\theta$ is determined by the angle of the 2nd order light incident to the outermost circumference of the lens on the opposite side. Representing the second order diffraction light from a parallel lattice having a pitch p as $\beta$, $\theta + \sin^{-1}NA = \beta$ and $\beta = \sin^{-1}(2\lambda/p)$. Therefore, $\theta = \sin^{-1}(2\lambda/p) - \sin^{-1}NA$.

This embodiment method is effective for the case where the ratio of a line to a space of a photomask pattern is not 1:1, for example, 0.2:0.8. A line-and-space pattern is a pattern where a plurality of relatively linear stripes for light transmission and interception are alternately disposed on a photomask in parallel and at a constant pitch (with respect to the width of a line-and-space pair).

The wavelength λ of light from the light source is constant, for example, a mercury g line (434 nm), i line (365 nm), or excimer laser beam (254 nm of KrF excimer laser), so that the range of the incident angle $\theta$ can be determined from the pattern pitch p.

Figure 49:
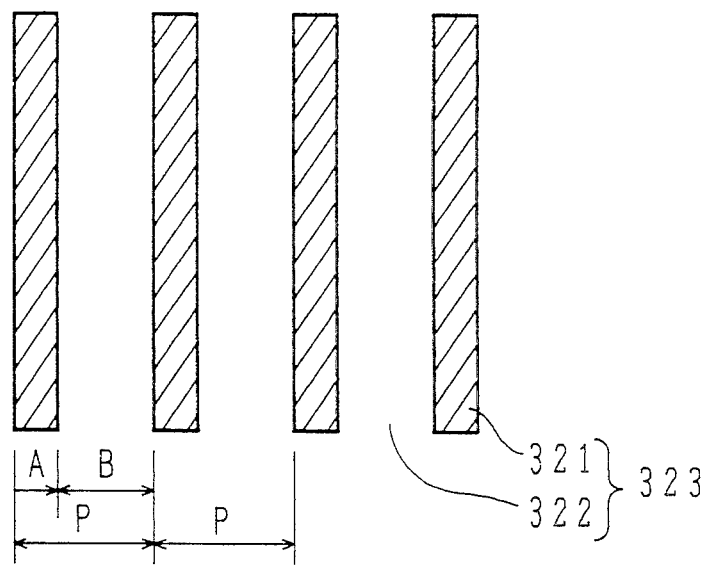
FIG. 49 is a partial plan view showing a line-and-space pattern.
Figure 50A:
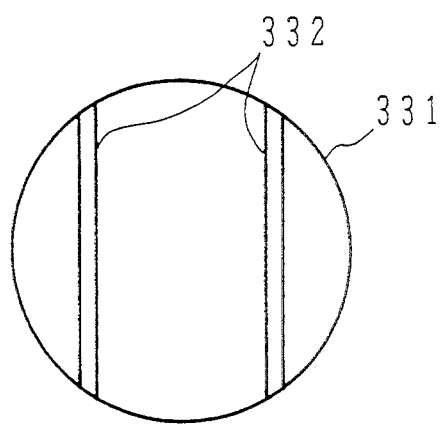
FIG. 50A is a plan view showing an aperture stop with two strip transparent holes.
Figure 50B:
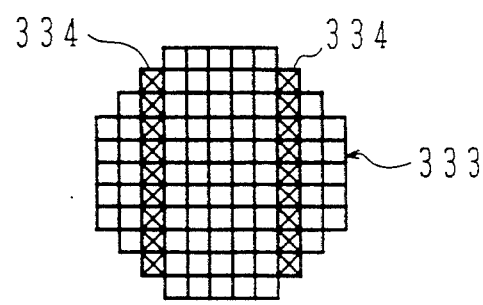
FIG. 50B is a schematic diagram showing the aperture stop of FIG. 50A.

As shown in FIG. 49, a line-and-space pattern 323 having light transmission stripes 321 and light interception stripes 322 were formed on the photomask 305 by a known method. For example, a Cr light shielding film of a desired pattern is formed on a quartz glass to obtain the photomask 305. The line widths A and B were set as 0.2:0.8 and the repetitive pattern 323 was formed at a constant pitch p. As shown in FIG. 50A, two stripe transparent holes 332 were formed on the aperture stop 331 in parallel to each other and symmetrically with the optical axis of the light exposure unit. Light from the light source 301 passes through the two slits 332 of the aperture stop 331 and becomes incident to the condenser lens 303. The aperture stop 331 was mounted so as to make the transparent stripe holes 332 parallel with the line-and-space pattern 323 of the photomask. The two stripe transparent holes may be realized by two stripe transparent holes 334 such as shown in FIG. 50B by using an aperture stop 333 made of an aggregation of liquid crystal cells.

Light is applied from the condenser lens 303 to the photomask 305 at the incident angle $\theta$ representing the angle between the incident light at the photomask and the optical axis of the light exposure unit. The incident angle $\theta$ is set within a range of:

$$\sin^{-1}NA >/= R\theta >/= \sin^{-1}(2\lambda/p) - \sin^{-1}NA,$$

where NA represents a numerical aperture of the projection optical system, R represents a reduction factor, p represents a pitch of pairs of lines and spaces at the projection plane, and λ represents the wavelength of the projecting light. Light beams from the photomask 305 including S0th, 1st, and 2nd order diffraction light beams are applied to the projection lens 306 and focussed on the resist film 307 at the projection plane. The pattern 323 of the photomask 305 is transferred and exposed on the resist film 307 on the substrate such as a semiconductor wafer, and developed to obtain a resist pattern.

Light exposure was simulated under the following conditions. The light intensity distributions in the direction perpendicular to the direction of lines and spaces were calculated on the projection plane and defocus planes, the results being shown in FIGS. 51A to 51D.

| | |
|---|---|
| Wavelength of light from light source (λ) | i line (0.365 μm) |
| Numerical aperture of lens (NA) | 0.5 |
| Coherence factor (σ) | 0.5 |
| Pitch of line-space pairs (p) | 1.0 μm |
| Line width | 0.2 μm |
| Space width | 0.8 μm |
| Incident angle (θ) | 16 degrees |
| | on wafer |

The incident angle $\theta$ is an angle smaller than the angle calculated from 2 * 1.0, sin $\theta = 0.365$.

Figure 51A:
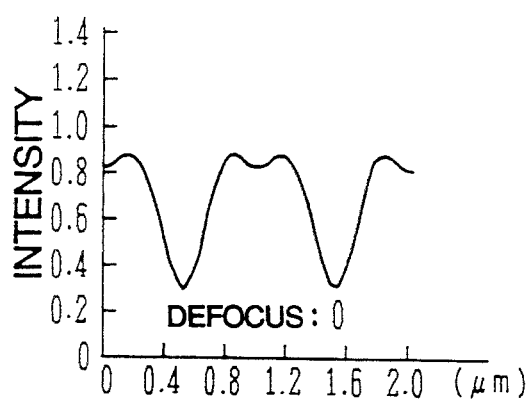
Figure 51B:
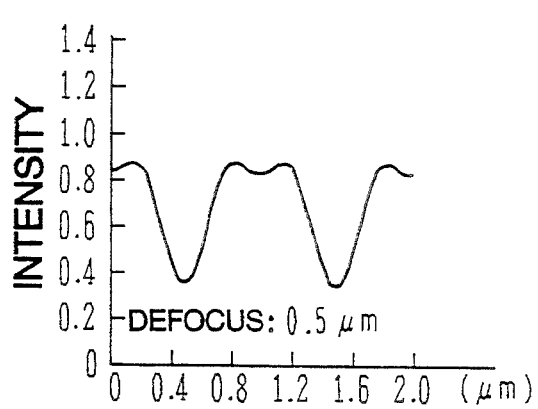
Figure 51C:
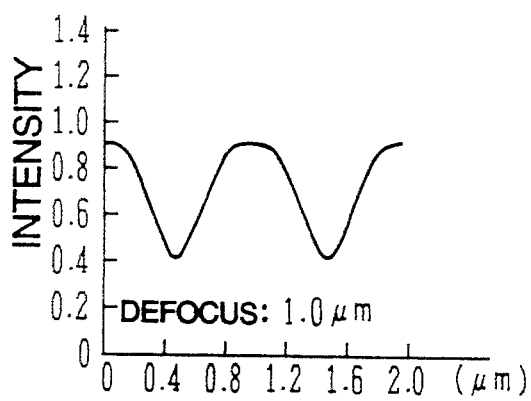
Figure 51D:
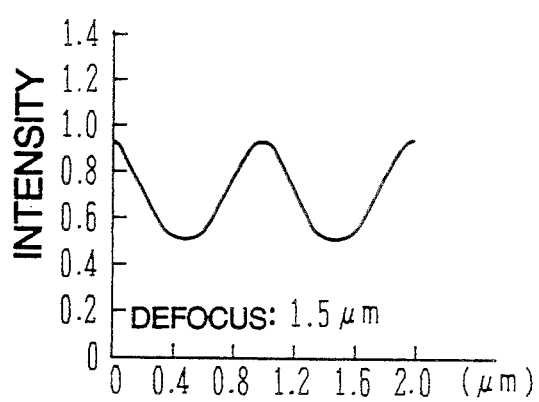

FIG. 51A shows the light intensity distribution on the focus plane (in focus), FIG. 51B shows the light intensity distribution on the defocus plane (out of focus by 0.5 μm), FIG. 51C shows the light intensity distribution on the defocus plane (out of focus by 1.0 μm), and FIG. 51D shows the light intensity distribution on the defocus plane (out of focus by 1.5 μm). As seen from FIGS. 51A to 51D, the profiles of the light intensity distributions are generally the same, and hence have a large depth of focus.

Figure 52:
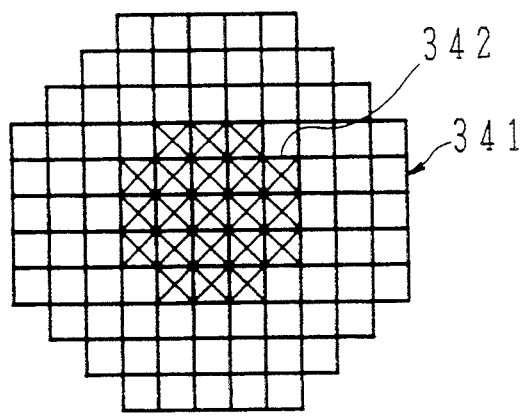
FIG. 52 is a plan view of an aperture stop with a circular transparent hole.

By using the same light exposure unit and same photomask, the above embodiment was compared with Comparison Example which has a conventional aperture stop with a circular hole ($\sigma = 0.5$). Comparison Example having a transparent hole 342 shown in FIG. 52 was simulated. The light intensity distributions on the focus and defocus planes were calculated, the results being shown in FIGS. 53A to 53D.

Figure 53A:
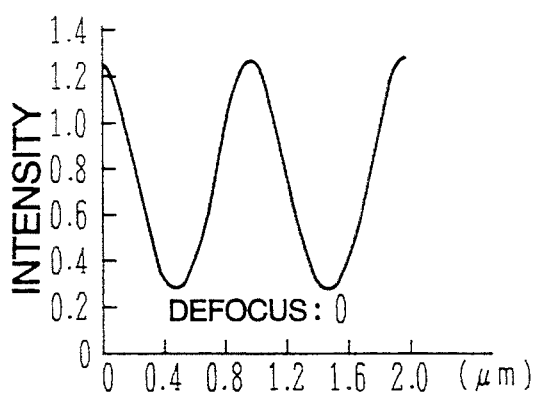
Figure 53B:
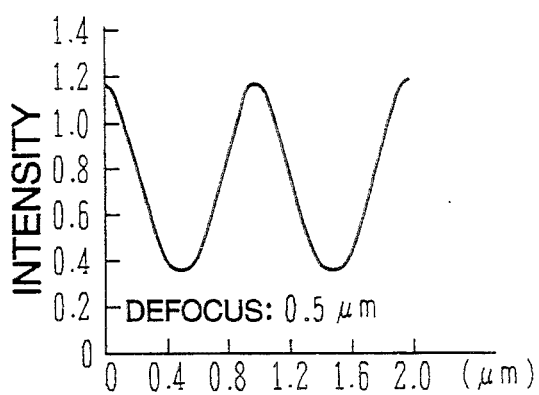
Figure 53C:
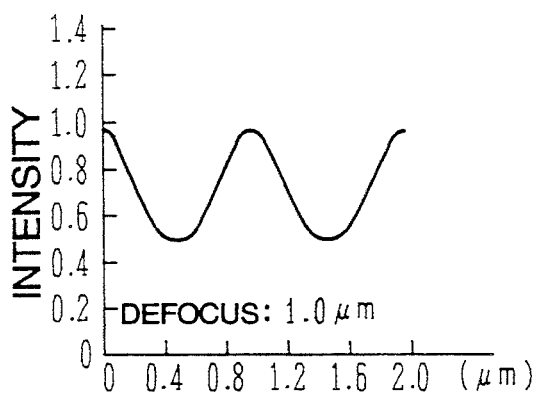
Figure 53D:
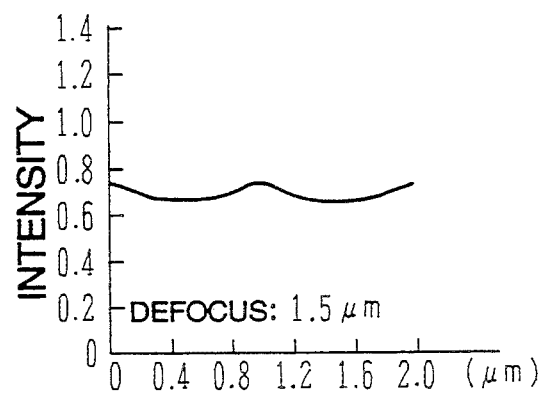

FIG. 53A shows the light intensity distribution on the focus plane (in focus), FIG. 53B shows the light intensity distribution on the defocus plane (out of focus by S0.5 μm), FIG. 53C shows the light intensity distribution on the defocus plane (out of focus by 1.0 μm), and FIG. 53D shows the light intensity distribution on the defocus plane (out of focus by 1.5 μm). As seen from FIGS. 53A to 53D, the contrast of light intensity under in focus is large, but the contrast becomes smaller and the resolution lowers as the defocus becomes grater. The depth of focus is therefore smaller than that of FIGS. 51A to 51D.

Figure 54:
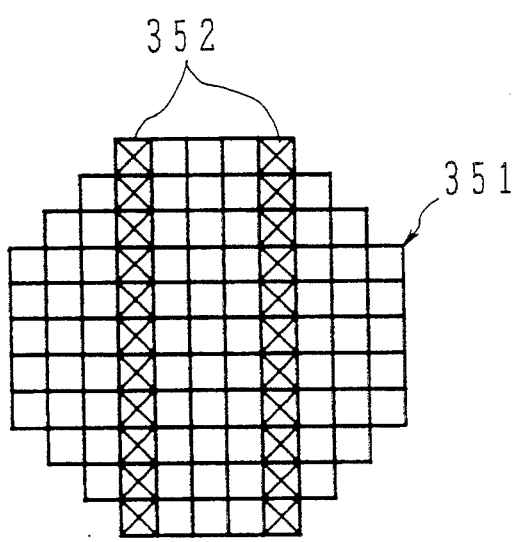
FIG. 54 is a plan view showing an aperture stop having two transparent stripe holes disposed symmetrically and in parallel, the aperture stop being used as a comparison example.

By using the same light exposure unit and same photomask, the above embodiment was compared with Comparison Example which has an aperture stop 351 with two stripe transparent holes 352 as shown in FIG. 54 like that shown in FIG. 50B. The light exposure simulation results of the light intensity distributions on the focus and defocus planes are shown in FIGS. 55A to FIG. 55D. With the aperture 351, the incident angle was set to $\theta = \sin^{-1}(\lambda/2p)$ to use mainly the 0th and +1st order diffraction light beams.

Figure 55A:
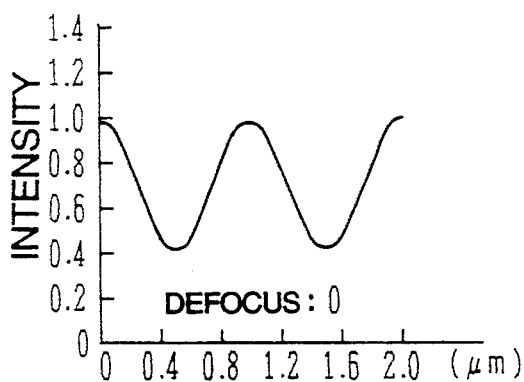
Figure 55B:
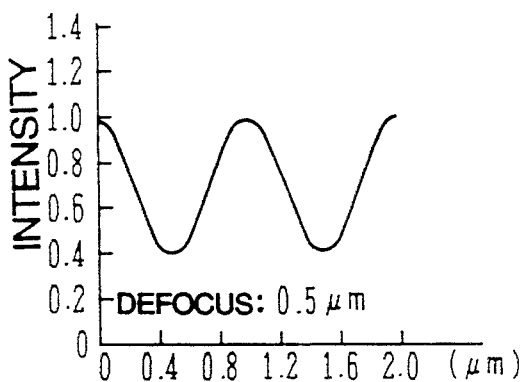
FIG. 55B is a graph showing the light intensity distribution on the defocus plane defocussed by 0.5 μm.
Figure 55C:
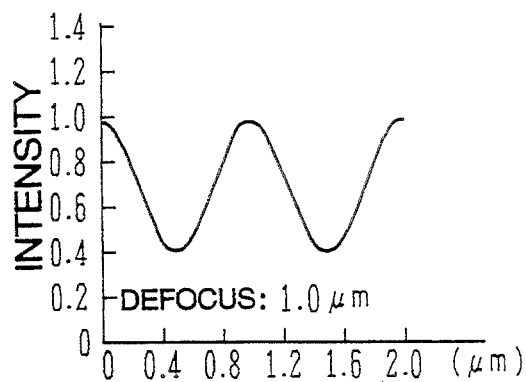
FIG. 55C is a graph showing the light intensity distribution on the defocus plane defocussed by 1.0 μm.
Figure 55D:
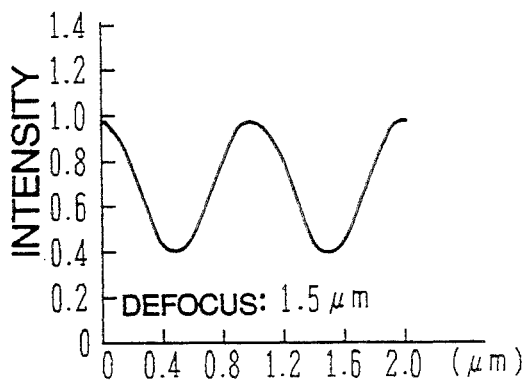
FIG. 55D is a graph showing the light intensity distribution on the defocus plane defocussed by 1.5 μm.

FIG. 55A shows the light intensity distribution on the focus plane (in focus), FIG. 55B shows the light intensity distribution on the defocus plane (out of focus by 0.5 μm), FIG. 55C shows the light intensity distribution on the defocus plane (out of focus by 1.0 μm), and FIG. 55D shows the light intensity distribution on the defocus plane (out of focus by 1.5 μm). As seen from FIGS. 55A to 55D, the contrast of light intensity does not lower even if the defocus becomes great, as compared with the above-described embodiment and Comparison Example, and the depth of focus is large like the above embodiment. However, the number of Fourier spectra of the line-and-space pattern such as of a width ratio 2:8 capable of being received by the lens is only two as will be detailed later, so that an image represented by one sine curve is focussed. The light intensity distributions are therefore not suitable for the line-and-space pattern of 2:8 ratio although they are suitable for 1:1 ratio.

Figure 56A:
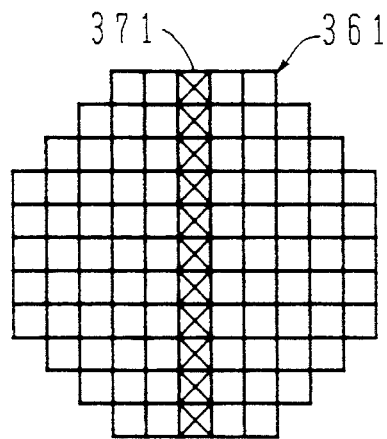
FIGS. 56A to 56F are schematic diagrams showing aperture stops each having one stripe transparent hole at a different position.
Figure 56D:
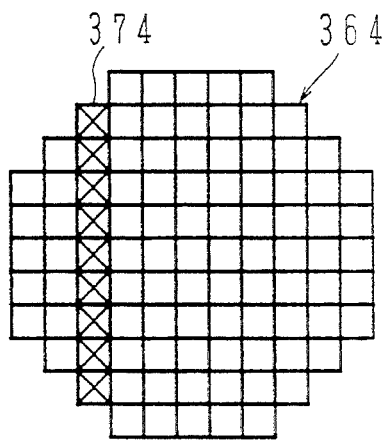
Figure 56B:
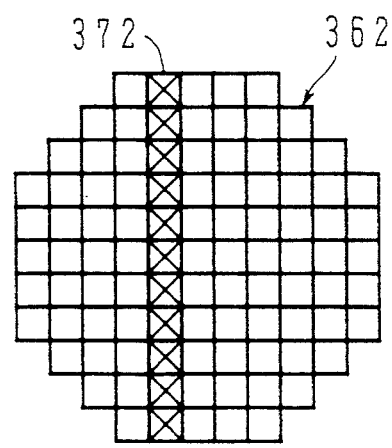
Figure 56E:
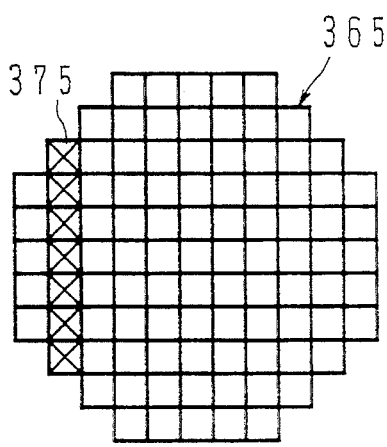
Figure 56C:
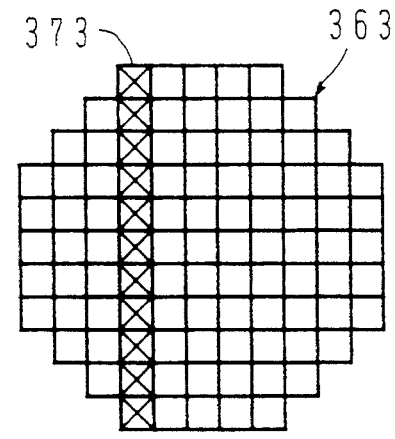
Figure 56F:
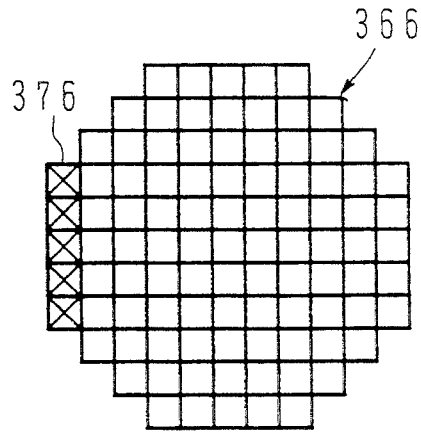

By using the same photomask 305 and light exposure unit of the above-described embodiment, the spectrum intensity at the iris (projection lens) was simulated by projecting a line-and-space pattern and by changing the number of transparent stripe holes (one or two holes) of an aperture stop and the position of each hole. Consider now aperture stops 361 to 366 shown in FIGS. 56A to 56F each having a corresponding one of stripe transparent holes 371 to 376, the holes being formed at different positions from the central area to the outside. FIGS. 56A to 56C show the aperture stops of Comparison Examples for applying the 0th and 1st diffraction light beams, and FIGS. 56D to 56F show the aperture stops for applying the 0th, 1st, and 2nd diffraction light beams. The aperture stop shown in FIG. 56C in particular has the stripe transparent hole 373 at the position of the incident angle $\theta = \sin^{-1}(\lambda/2p)$.

Fourier spectra shown in FIGS. 57A to 57C and FIGS. 58A to 58C correspond to the aperture stops 361 to 366 shown in FIGS. 56A to 56F. In the case of the aperture stops 364 to 366, two small peaks are present on the right side of one high peak as seen from the Fourier spectra shown in FIGS. 58A to 58C. In contrast, the aperture stop 363 generates one small peak on the right side of one high peak as shown in FIG. 67C, and the aperture stops 361 and 362 generate two small peaks on the left and right sides of one high peak. Use of only two Fourier spectra provides the light intensity distributions shown in FIGS. 55A to 55D which are not suitable for transferring patterns except the line-and-space pattern of 1:1 ratio. Use of three Fourier spectra including the 1st, 0th, and −1st orders provides the light intensity distributions shown in FIGS. 53A to 53D and having small depth of focus. Use of three Fourier spectra including the 0th, 1st, and 2nd orders provides large depth of focus as shown in FIGS. 51A to 51D.

In order to use the three Fourier spectra including the 0th, 1st, and 2nd orders for the image focussing, it is necessary that NA is greater than $\lambda/p$ and that the angle $\theta$ is set within the above-described range of:

$$\sin^{-1} NA >/= R\theta >/= \sin^{-1}(2\lambda/p) - \sin^{-1} NA.$$

Figure 59A:
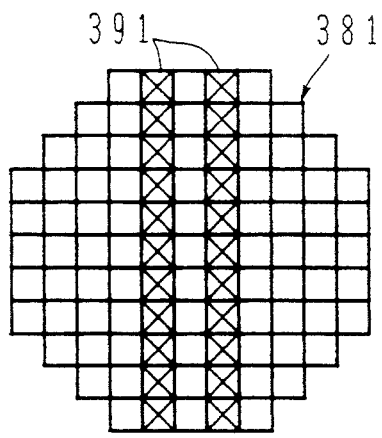
FIGS. 59A to 59E are schematic diagrams showing aperture stops each having two stripe transparent holes at different positions.
Figure 59D:
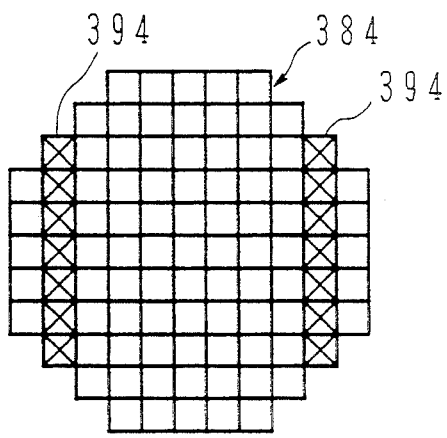
Figure 59B:
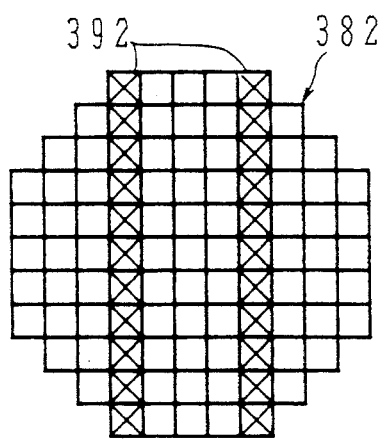
Figure 59E:
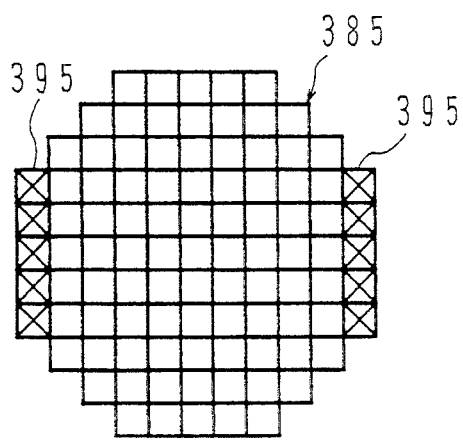
Figure 59C:
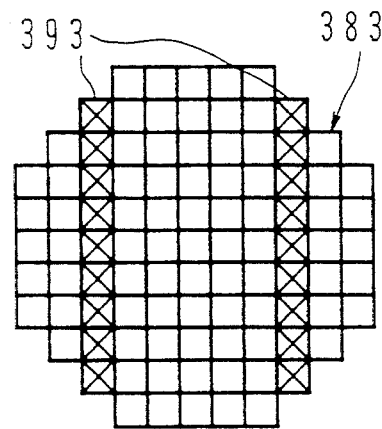
Figure 60A:
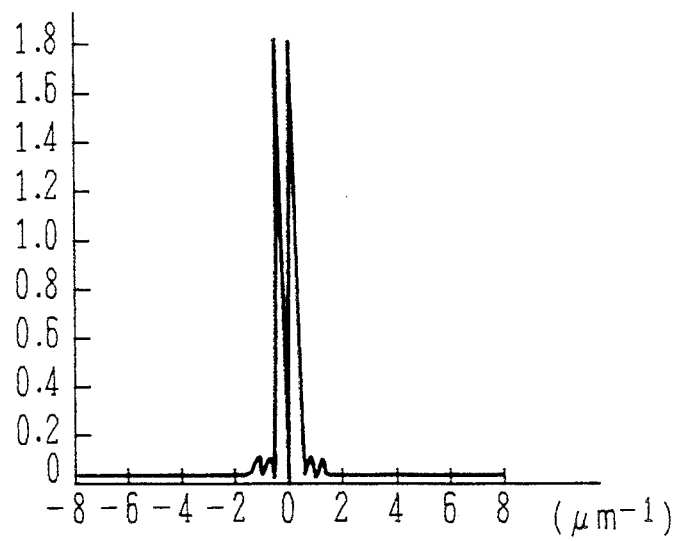
Figure 60B:
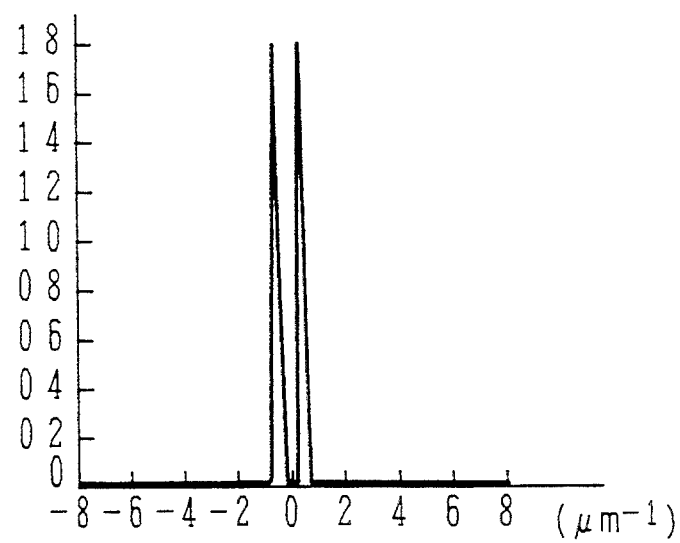
Figure 61A:
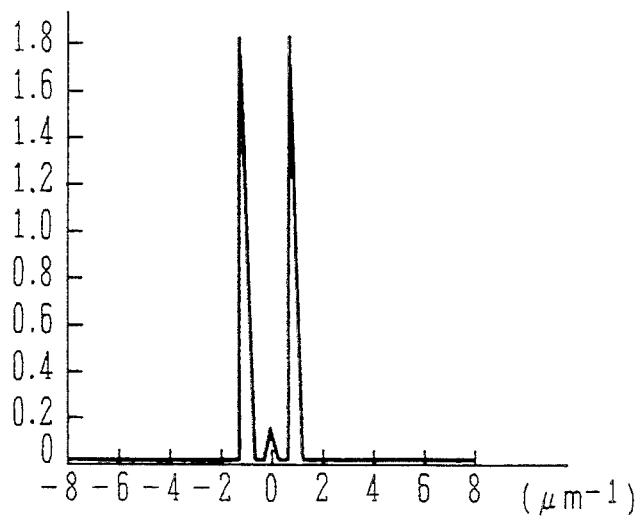
Figure 61B:
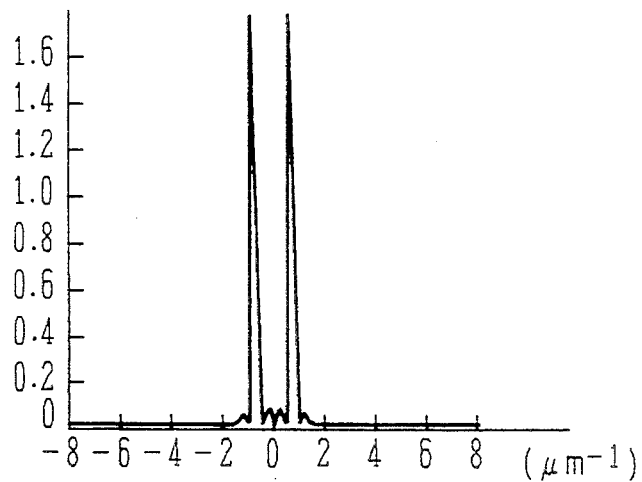
Figure 61C:
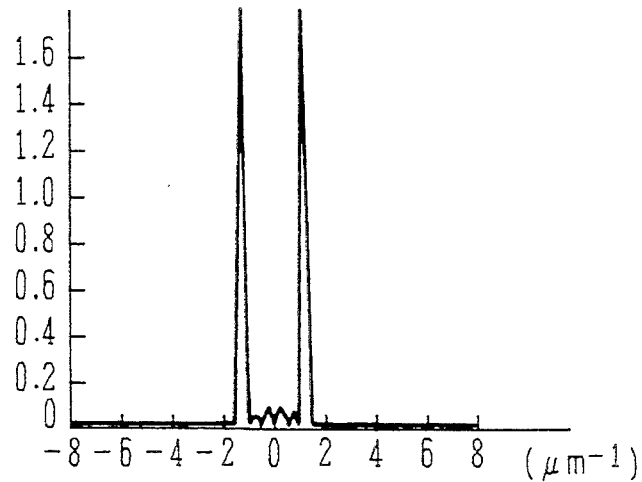
Figure 64A:
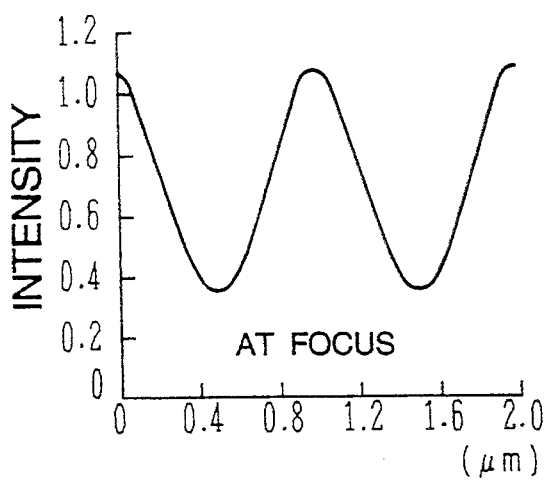
Figure 64A:
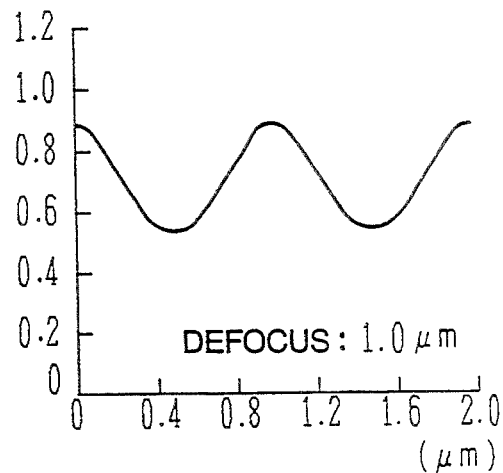
Figure 64B:
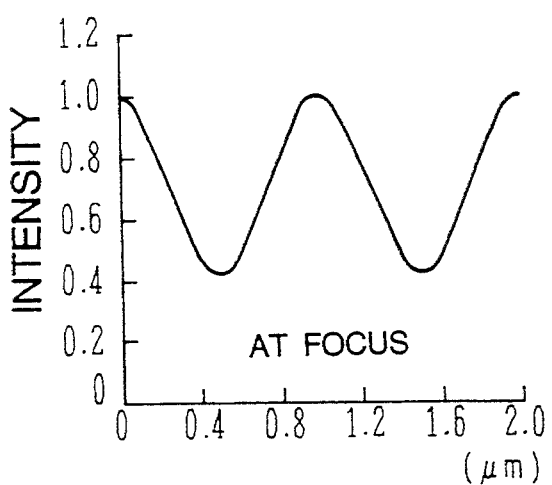
Figure 64B:
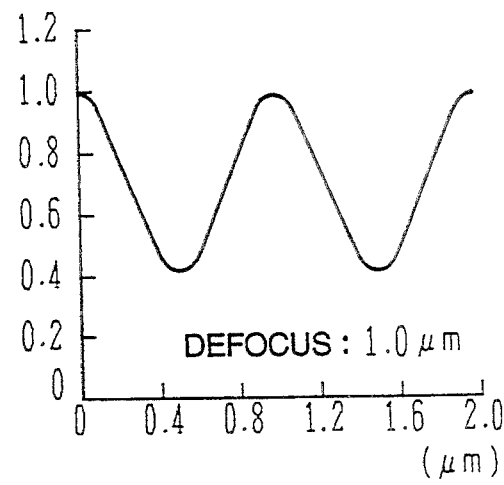

Next, aperture stops 381 to 385 shown in FIGS. 59A to 59E were prepared. Each aperture stop has corresponding two stripe transparent holes 391 to 395, the holes being formed at different positions from the central area to the outside. FIGS. 59A and 59B show the aperture stops of Comparison Examples, and FIGS. 59C to 59E show the aperture stops for applying the 0th, 1st, and 2nd diffraction light beams. In practical applications, it is preferable to use an aperture stop having two stripe transparent holes because the light amount by one stripe transparent hole is not sufficient and the two stripe transparent holes are balanced symmetrically with the optical axis. The aperture stop shown in FIG. 59B in particular has the two stripe transparent holes 392 at the positions of the incident angle $\theta = \sin^{-1}(\lambda/2p)$.

Light intensity Fourier spectra shown in FIGS. 60A and 60B and FIGS. 61A to 61C correspond to the aperture stops 381 to 385 shown in FIGS. 59A to 59E, respectively. These spectra can be obtained by symmetrically superposing spectra of respective aperture stops (FIGS. 57B and 57C, FIGS. 58A to 58C). The aperture stops 381 to 385 shown in FIGS. 59A to 59E correspond to the aperture stops 362 to 366 shown in FIGS. 56B to 56F.

Figure 58A:
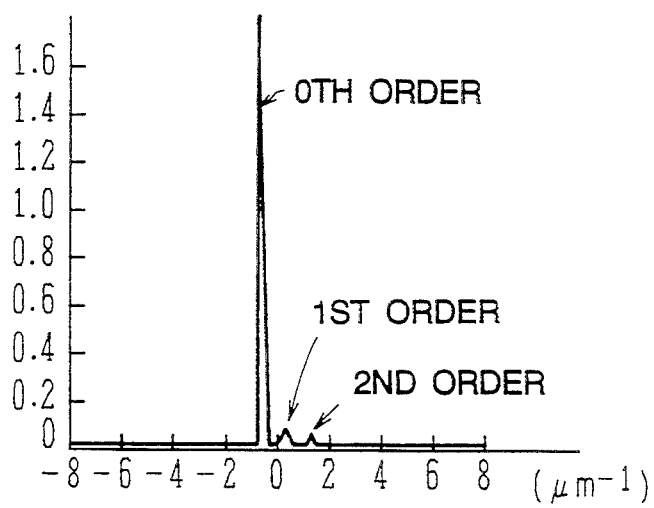
Figure 58B:
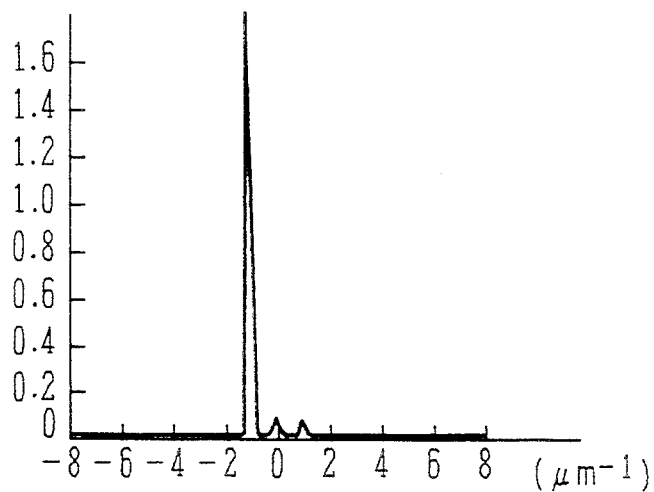
Figure 58C:
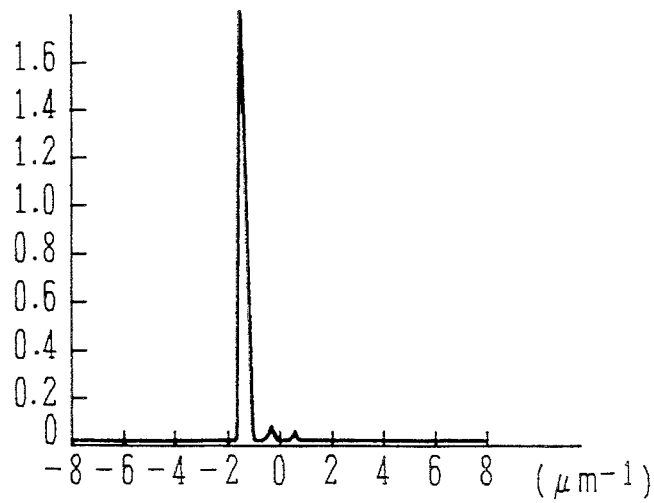

As shown in FIG. 48, an image is focussed by using the 0th, 1st, and 2nd order diffraction light beams. As shown in FIGS. 58A to 58C, the intensity of the 0th order diffraction light beam differs greatly from the intensities of the 1st and 2nd order diffraction light beams. If the aperture stops shown in FIGS. 56D to 56F are used, there is a fear of asymmetry of the light intensity distributions on the right and left sides. Such asymmetry is likely to occur at the defocus. This problem can be solved by symmetrically forming the stripe transparent holes (corresponding to the shape of light from the light source) as shown in FIGS. 59C to 59E. Examples of such configuration will be described next.

Light exposure was simulated by using the same photomask 305 and light exposure unit of the above-described embodiment and the aperture stops shown in FIGS. 56A to 56F and FIGS. 59A to 59E, under the same conditions of the above-described embodiment. The light intensity distributions at the focus plane (resist film projection plane) and defocus plane (out of focus by 1.0 μm) in the direction perpendicular to the direction of lines and spaces, are shown in FIGS. 62A to 62C, FIGS. 63A to 63C, FIGS. 64A and 64B, and FIGS. 63A to 63C.

Figure 65A:
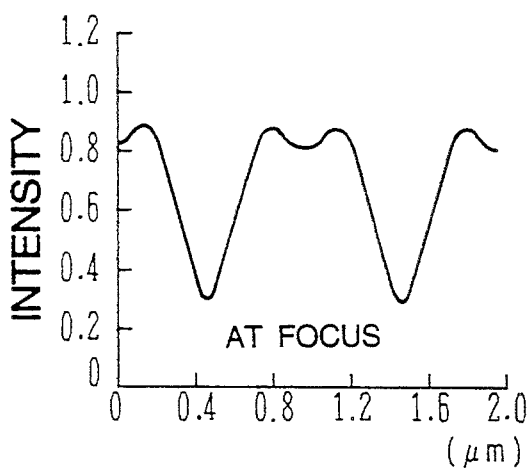
Figure 65A:
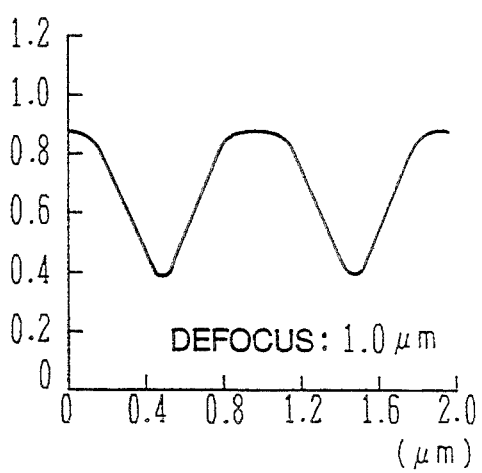
Figure 65B:
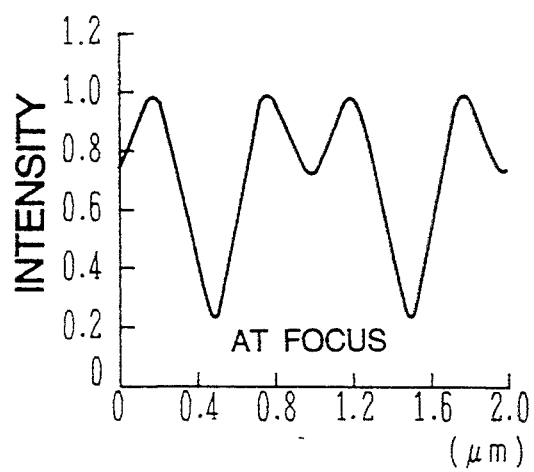
Figure 65B:
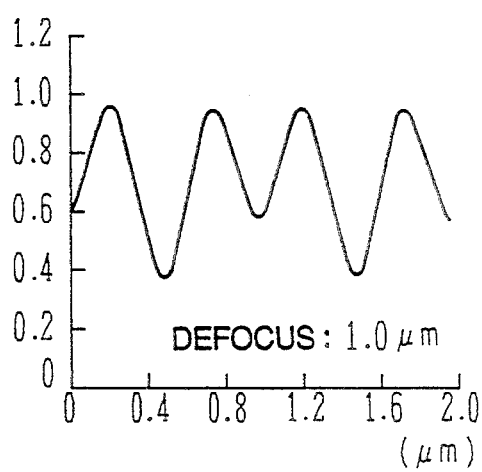
Figure 65C:
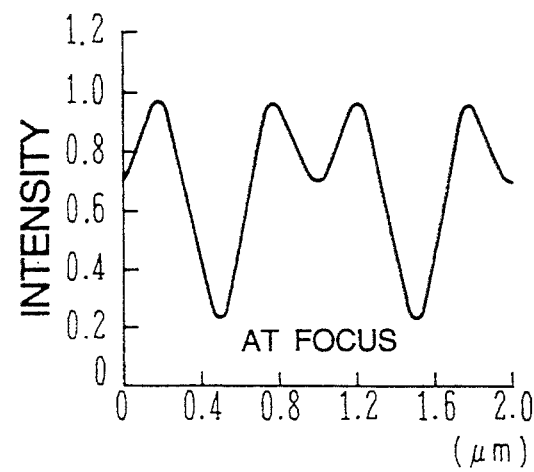
Figure 65C:
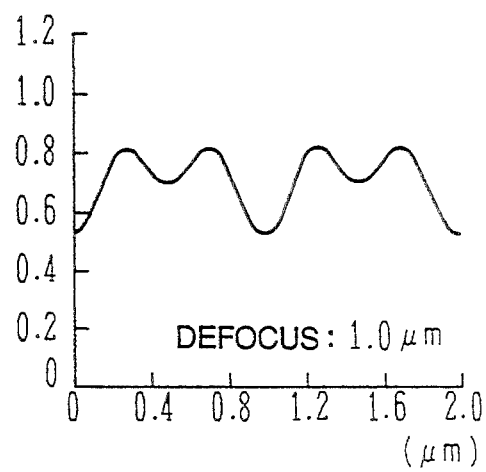

FIGS. 63A to 63C indicate that the light intensity distributions become asymmetric on the right and left sides at the defocus plane (out of focus by 1 μm) if the aperture stops shown in FIGS. 56D to 56F are used. The positions of patterns on a positive resist (positions with minimum light intensities) were also displaced by the defocus. FIGS. 65A to 65C indicate that the light intensity distributions are symmetrical on the right and left sides even at the defocus plane if the aperture stops shown in FIGS. 59C to 59E are used. With the aperture stop shown in FIG. 59E, the contrast lowers greatly at the defocus plane by 1 μm.

Figure 66:
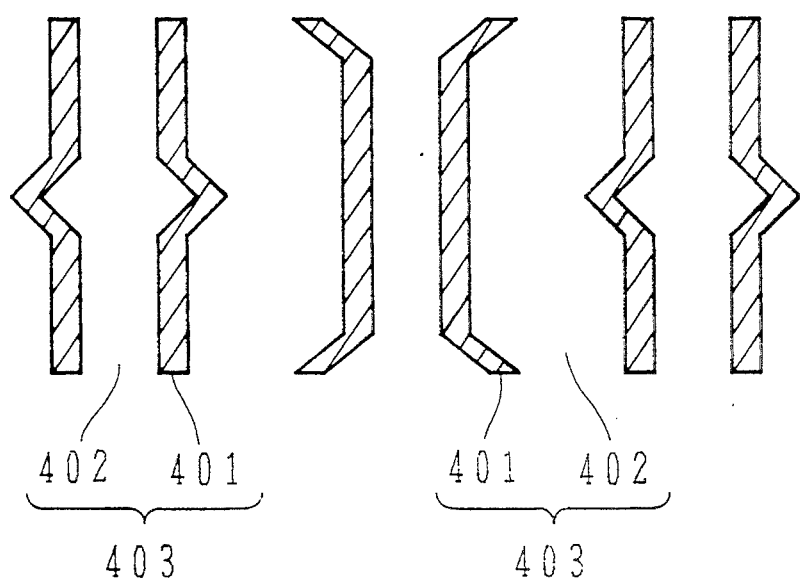
FIG. 66 is a partial plan view showing a line-and-space pattern having different line and space widths.

As shown in FIG. 66, a repetitive line-and-space pattern 403 having light interception line patterns 401 and transparent hole (space) patterns 402 disposed at a constant pitch were formed on a photomask by a known method, this line-and-space pattern corresponding to such as word lines of a DRAM. Light exposure was simulated by using the aperture stop (two stripe transparent holes) shown in FIG. 50B and the light exposure unit of the above-described embodiment, under the following conditions. The light intensity distributions represented three-dimensionally by contour lines were calculated on the projection plane and defocus planes, the results being shown in FIGS. 67 to 69.

| | |
|---|---|
| Wavelength of light from light source ($\lambda$) | i line (0.365 μm) |
| Numerical aperture of lens (NA) | 0.57 |
| Coherence factor ($\sigma$) | 0.5 |
| Pitch of lines and spaces (p) | 0.90 μm (1.8 μm in period) |
| Line width | 0.3 μm |
| Minimum space width | 0.5 μm |
| Incident angle ($\theta$) | 18 degrees |

The incident angle $\theta$ is an angle smaller than the angle calculated from $2 * 0.9 * \sin 0 = 0.365$.

Figure 67:
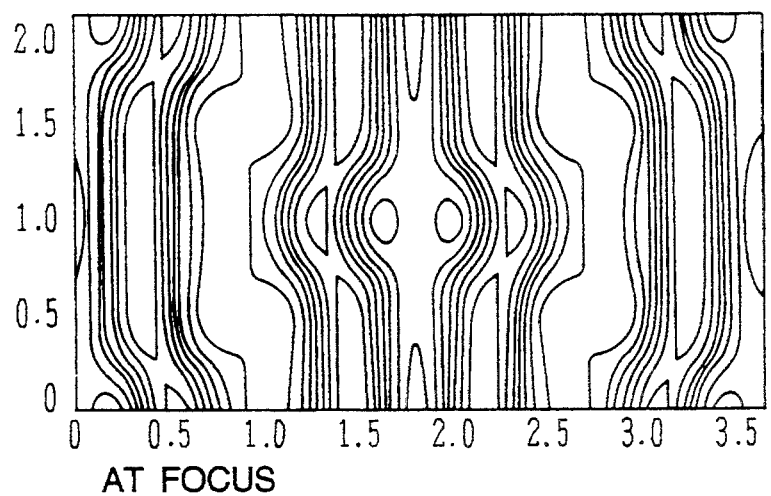
FIGS. 67 to 69 are graphs showing the three-dimensional light intensity distributions of the pattern shown in FIG. 66, obtained by using the aperture stop shown in FIG. 50B, respectively at the focus plane, defocus plane by 0.4 μm, and defocus plane by 0.8 μm.
Figure 68:
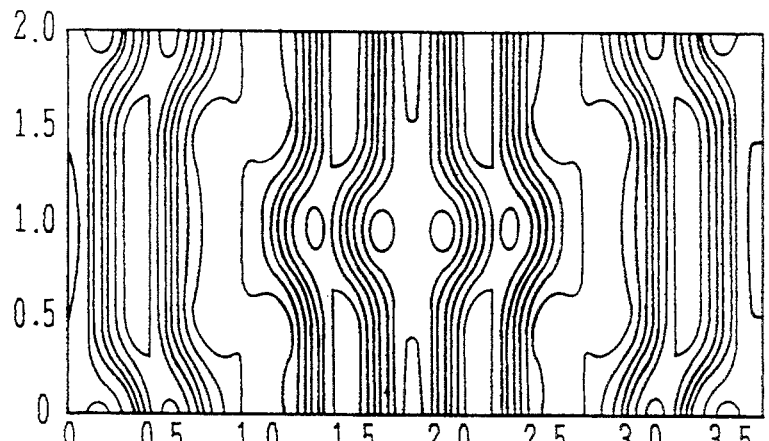
Figure 69:
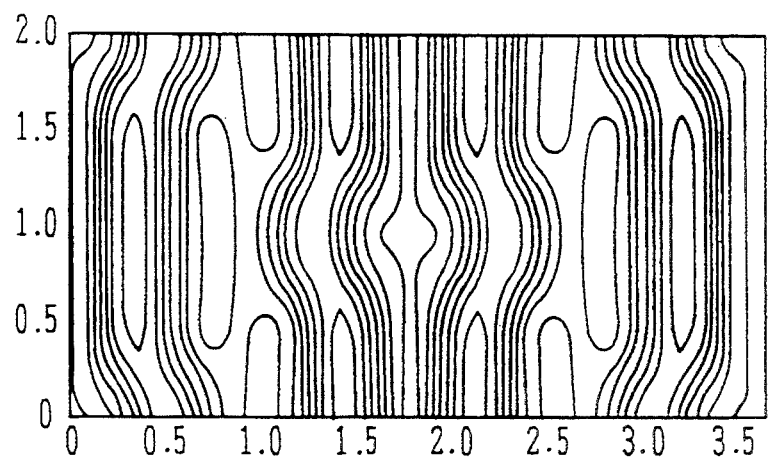

FIG. 67 shows the light intensity distribution on the focus plane (in focus), FIG. 68 shows the light intensity distribution on the defocus plane (out of focus by 0.4 μm), and FIG. 69 shows the light intensity distribution on the defocus plane (out of focus by 0.8 μm). As seen from FIGS. 67 to 69, the profiles of the light intensity distributions are generally the same, and have a large depth of focus.

By using the same light exposure unit and same photomask, the above embodiment was compared with Comparison Example which has a conventional aperture stop with a circular hole ($\sigma=0.5$). The light intensity distributions on the focus and defocus planes were calculated, the results being shown in FIGS. 70 to 72.

Figure 70:
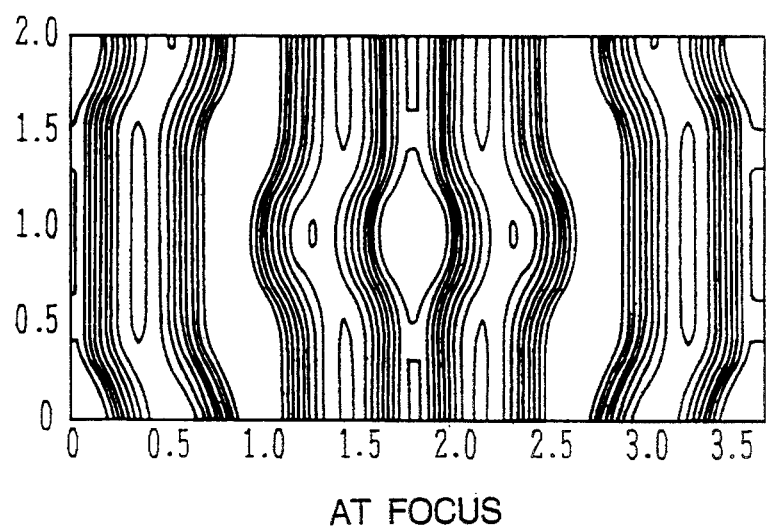
Figure 71:
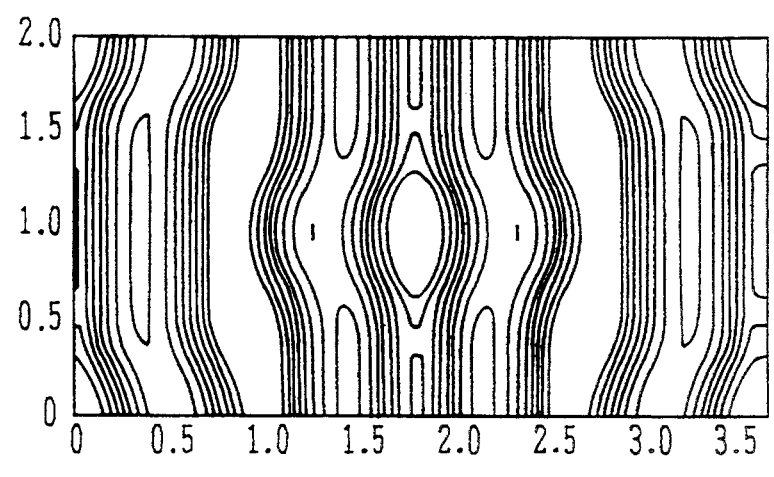
FIGS. 71 to 72 are graphs showing the three-dimensional light intensity distributions of the pattern shown in FIG. 66, obtained by using tile aperture stop with the circular transparent hole used as the comparison example, respectively at the focus plane, defocus plane by 0.5 μm, and defocus plane by 1.0 μm.
Figure 72:
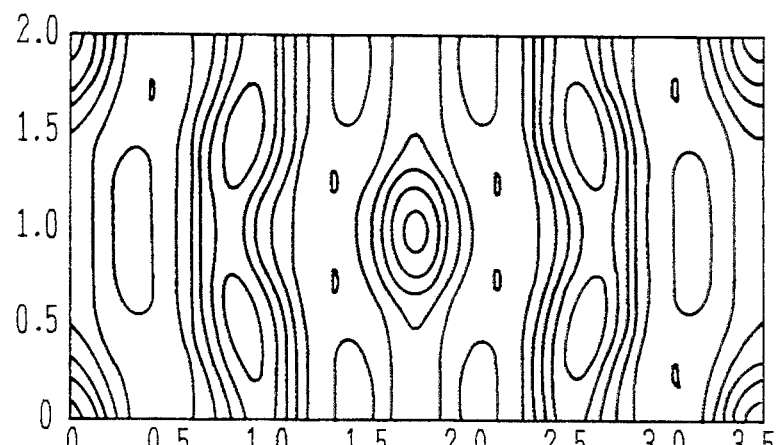

FIG. 70 shows the light intensity distribution on the focus plane (in focus), FIG. 71 shows the light intensity distribution on the defocus plane (out of focus by 0.5 $\mu$m), and FIG. 72 shows the light intensity distribution on the defocus plane (out of focus by 1.0 $\mu$m). As seen from FIGS. 70 to 72, the difference in light intensity becomes smooth as the defocus becomes great. The smoothed area of Comparison Example expands to the unexposed area more than the above-embodiment, and the resolution lowers because of the lowered contrast of light intensities. The embodiment provides both the pattern shape and the depth of focus improved more than Comparison Example.

Figure 73:
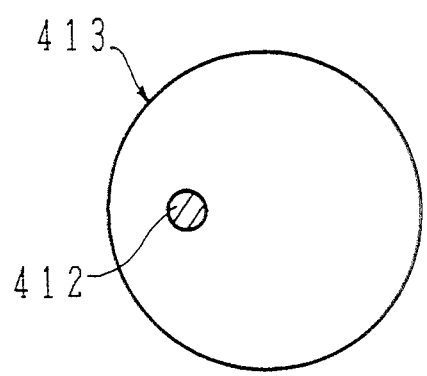
FIG. 73 is a schematic plan view showing an aperture stop with a single circular transparent hole.

Light exposure was simulated by using an aperture stop 413 with a circular transparent hole 412 shown in FIG. 73 and the photomask (line width of 0.2 $\mu$m, space width of 0.8 $\mu$m, at pitch of 1.0 $\mu$m) of the above embodiment. The incident angle of light from the light source was inclined by 16 degrees from the optical axis. From the simulation, an improved depth of focus was observed, relative to the normal light source.

Figure 74:
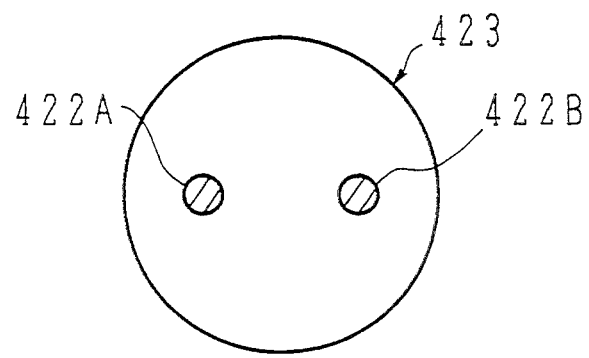
FIG. 74 is a schematic plan view showing an aperture stop with two circular transparent holes.

Light exposure was simulated by using an aperture stop 423 with two circular transparent holes 422A and 422B shown in FIG. 74 and the photomask (line width of 0.2 $\mu$m, space width of 0.8 $\mu$m, at pitch of 1.0 $\mu$m) of the above embodiment. The incident angle of light from the light source to the two transparent holes was inclined by 16 degrees from the optical axis. From the simulation, an improved depth of focus was observed and no displacement of the pattern at the defocus plane was observed, as compared to the normal light source.

Figure 75:
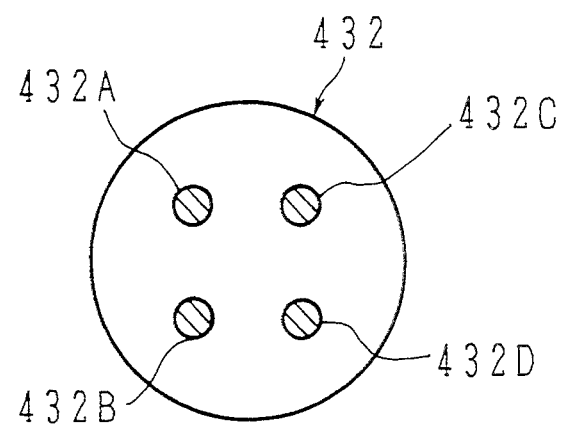
FIG. 75 is a schematic plan view showing an aperture stop with four circular transparent holes.
Figure 76:
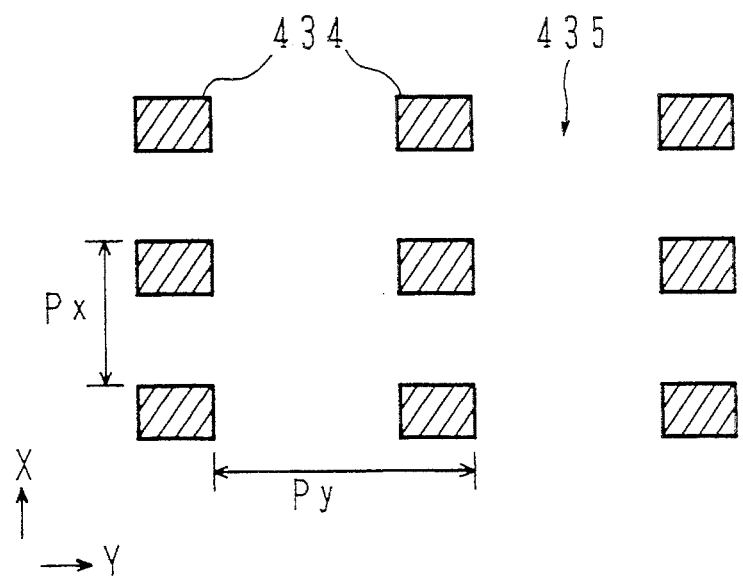
FIG. 76 is a schematic plan view showing a photomask with a repetitive rectangular pattern.

An aperture stop 432 having four circular transparent holes 432A to 432D shown in FIG. 75 was used. A pattern transfer simulation was made by using a photomask 435 having repetitive rectangular transparent patterns 434 shown in FIG. 76. The X direction pitch was set to $p_x$, the Y direction pitch was set to $p_y$, and the incident light angles $\theta_x$ and $\theta_y$ were set within the ranges of:

$$\sin^{-1}NA > /= R\theta_x > /= \sin^{-1}(2\lambda/p_x) - \sin^{-1}NA$$

$$\sin^{-1}NA > /= R\theta_y > /= \sin^{-1}(2\lambda/p_y) - \sin^{-1}NA.$$

Figure 77:
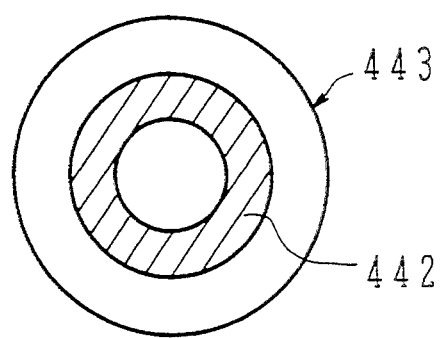
FIG. 77 is a schematic plan view showing an aperture stop with a ring transparent hole.

An aperture stop 443 having a ring transparent hole 442 shown in FIG. 77 was used to simulate the transfer of the pattern of the photomask of the above embodiment. The incident angle of light emanating from the center of the ring width was tilted by 16 degrees from the optical axis. From the simulation, an improved depth of focus was observed.

As described so far, the advantages (improved depth of focus and resolution) of oblique incidence can be effectively attained by using the modified illumination system (with modified aperture stop) which allows to use the 0th, 1st, and 2nd order diffraction light beams, thereby contributing to fine integration of a lithography technique. An optimum hole shape of an aperture stop may be calculated from an inheritance algorithm applied to cell units of the aperture stop.

Although the invention has been described with reference to the preferred embodiments, the invention is not limited only to the embodiments. It is apparent for those skilled in the art that various modifications, substitutions, improvements, combinations and the like may be made without departing from the spirit and scope of the present invention.

We claim:

1. A method of designing an exposure optical system, comprising the steps of:
   preparing a starting pattern for an optical member formed of a multiplicity of cell areas, analogous to a desired design pattern by setting a uniform optical characteristic to each of the cell areas of the optical member;
   generating a plurality of child patterns from said starting pattern by mutating said optical characteristic of at least one cell area, in accordance with a random number;
   generating a plurality of grandchild patterns from said plurality of child patterns through inheritance mating or mutating, and evaluating focussing characteristic of said generated grandchild patterns to select a predetermined number of grandchild patterns, in accordance with an inheritance algorithm;
   repeating said inheritance algorithm process by using said grandchild patterns as said child patterns; and
   selecting an optimum design pattern from finally selected grandchild patterns.

2. A method according to claim 1, wherein said mating or mutating is selected in accordance with a random number, and said mating includes a plurality of processes including at least an AND process and an OR process.

3. A method according to claim 1, wherein said evaluation of focussing characteristic at said inheritance algorithm step includes a step of calculating an energy E from difference between an exposure beam intensity distribution on an image plane and an ideal exposure beam intensity distribution on the image plane, and evaluating said grandchild patterns in accordance with the value of $\exp(-E/T)$ where T represents a temperature as an evaluation threshold value.

4. A method according to claim 3, wherein said temperature is gradually lowered along the progress of said inheritance algorithm process.

5. A method according to claim 3, wherein said optical member is a mask, and said optical characteristic is an exposure beam transmission characteristic.

6. A method according to claim 5, wherein said optical member comprises said cell areas constituting an area where a pattern is formed, the pattern being so arranged that when said pattern is focused by an optical system on an image plane, a pattern different from said pattern of said mask is imaged.

7. A method according to claim 6, wherein each said cell area is a square, the length of each side being 0.001 to 1 $\mu$m.

8. A method according to claim 6, wherein said exposure beam transmission characteristic includes two states of light transmission and light interception.

9. A method according to claim 6, wherein said exposure beam transmission characteristic includes two or more states of different phases in said light transmission state.

10. A method according to claim 1, wherein said optical member is an aperture stop, and said optical characteristic is an exposure beam transmission characteristic.

11. A method according to claim 10, wherein three diffraction light beams of 0th, +1st, and +2nd orders or 0th, −1st, and −2nd orders are selected and focussed in accordance with the pitch of a pattern to be exposed.

12. A method according to claim 1, wherein said optical member is a light source, and said optical characteristic is a brightness.

13. An exposure method, comprising the steps of:
preparing a starting pattern for an aperture stop formed of a multiplicity of cell areas, analogous to a desired design pattern by setting a uniform optical characteristic to each of the cell areas of the optical member;
generating a plurality of child patterns from said starting pattern by mutating said optical characteristic of at least one cell area, in accordance with a random number;
generating a plurality of grandchild patterns from said plurality of child patterns through inheritance mating or mutating, and evaluating focusing characteristic of said generated grandchild patterns to select a predetermined number of grandchild patterns, in accordance with an inheritance algorithm;
repeating said inheritance algorithm process by using said grandchild patterns as said child patterns; and
selecting an optimum design pattern from finally selected grandchild patterns;
wherein said optical characteristic is an exposure beam transmission characteristic, and
wherein three diffraction light beams of 0th, +1st, and +2nd orders or 0th, −1st, and −2nd orders are selected and focused in accordance with the pitch of a picture to be exposed.

* * * * *